United States Patent
Yoshino et al.

(10) Patent No.: US 7,015,538 B2
(45) Date of Patent: Mar. 21, 2006

(54) NON-VOLATILE MEMORY AND METHOD FOR MANUFACTURING NON-VOLATILE MEMORY

(75) Inventors: Akira Yoshino, Kanagawa (JP); Yutaka Akiyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 214 days.

(21) Appl. No.: 10/740,991

(22) Filed: Dec. 19, 2003

(65) Prior Publication Data

US 2004/0132251 A1    Jul. 8, 2004

(30) Foreign Application Priority Data

Dec. 27, 2002    (JP)    ................................ 2002-382322

(51) Int. Cl.
*H01L 29/788*    (2006.01)
*H01L 21/336*    (2006.01)
*G11C 16/04*    (2006.01)

(52) U.S. Cl. .................. 257/317; 438/257; 365/185.01
(58) Field of Classification Search ................ 257/317; 438/257; 365/185.01
See application file for complete search history.

(56) References Cited

U.S. PATENT DOCUMENTS 6,429,075 B1    8/2002    Yeh et al.

OTHER PUBLICATIONS

Rebecca Mih, et al., "0.18um Modular Triple Self-Aligned Embedded Split-Gate Flash Memory", *2000 Symposium on VLSI Technology Digest of Technical Papers*, pp 120-121.

*Primary Examiner*—Evan Pert
(74) *Attorney, Agent, or Firm*—Scully, Scott, Murphy & Presser

(57) ABSTRACT

A coupling oxide film is formed on a silicon substrate, a polysilicon film is further formed thereupon, and a low-temperature oxide film is deposited to a thickness of 10 nm, for example. Next, a silicon nitride film is formed on this low-temperature oxide film, and selectively removed by dry etching. At this time, the low-temperature oxide film serves as an etching stopper film, so the low-temperature oxide film and polysilicon film are not over-etched. Subsequently, the polysilicon film is dry-etched, forming a recess. A floating gate is then formed of the polysilicon film.

49 Claims, 43 Drawing Sheets

NON-VOLATILE MEMORY AND METHOD FOR MANUFACTURING NON-VOLATILE MEMORY

BACKGROUND OF THE INVENTION

1. Field of the Invention

The present invention relates to triple self-aligning non-volatile memory and a method for manufacturing non-volatile memory, and particularly relates to a method for manufacturing non-volatile memory with a stabilized floating gate shape.

2. Description of the Related Art

Flash memory as been developed as a type of non-volatile memory. Flash memory has a configuration wherein a great number of cells are arrayed, with each cell having a standard MOS transistor source drain gate (control gate), and also a floating gate which is embedded in an insulating film and is in an electrically floating state. Upon the source and substrate being grounded and voltage being applied to the control gate and drain, electrons travel from the source toward the drain, and some of these electrodes traverse the insulating film into the floating gate, so the floating gate is negatively charged. Thus, writing is performed. Also, drawing the electrons to the control gate or drain across the insulating film makes the floating gate electrically neutral. Thus, erasing is performed.

With flash memory, the overall degree of integration can be improved, since each cell can be made smaller. Accordingly, methods for manufacturing fine cells with high precision have been proposed (e.g., Document "2000 Symposium on VLSI Technology Digest of Technical Papers" pp 120–121, and U.S. Pat. No. 6,429,075).

FIGS. 1A through 1D, 2A through 2D, 3A through 3D, and FIG. 4 are cross-sectional diagrams illustrating a conventional method for manufacturing flash memory described in the aforementioned Document, in order to steps.

First, as shown in FIG. 1A, a coupling oxide film COX101 is formed to a thickness of 10 nm on a p-type silicon substrate 101 by CVD (Chemical Vapor Deposition). Next, a polysilicon film PS101 around 150 to 200 nm in thickness is formed on the coupling oxide film COX101, followed by a silicon nitride film SN102 around 350 to 400 nm in thickness being formed on the polysilicon film PS101. Next, a resist (not shown) is formed on the silicon nitride film SN102, and patterned in slits. The patterned resist is masked, and the silicon nitride film SN102 is selectively removed by dry etching, so as to form openings 102 from which the polysilicon film PS101 is partially exposed.

At this time, the area around the surface of the polysilicon film PS101 is over-etched due to the dry etching of the silicon nitride film SN102, as shown in FIG. 1B. Consequently, a bowl-shaped recess 103 is formed on the bottom of the opening 102.

Next, as shown in FIG. 1C, a high-temperature oxide film HTO101 is deposited by CVD to a thickness of 150 nm, and then etched back, thereby removing the high-temperature oxide film HTO101 formed on the silicon oxide film SN102 and the bottom of the opening 102, while leaving the high-temperature oxide film HTO101 formed on the side faces of the opening 102, thereby forming side walls of the high-temperature oxide film HTO101 on the side faces of the opening 102. This reduces the inner diameter of the opening 102 to form an opening 104.

Next, as shown in FIG. 1D, the silicon oxide film SN102 and the high-temperature oxide film HTO101 are masked, and the polysilicon film PS101 is selectively removed by dry etching, thereby exposing the coupling oxide film COX101 at the bottom of the opening 104.

Next, as shown in FIG. 2A, arsenic (As) ions are implanted into the bottom of the opening 104, thereby forming an $n^+$ diffusion region 105 on the surface of the silicon substrate 101. This $n^+$ diffusion region 105 becomes the source.

Next, as shown in FIG. 2B, a high-temperature oxide film HTO102 is deposited on the entire face, and etched back so as to form side walls formed of high-temperature oxide film HTO102 along the side face of the opening 104. The etching back at this time removes the coupling oxide film COX101 at the bottom of the opening 104, so that the $n^+$ diffusion region 105 of the silicon substrate 101 is exposed.

Next, as shown in FIG. 2C, a polysilicon film PS102 having a high concentration of As or P is deposited on the entire face, and the etched back, so as to fill in the opening 104 with the polysilicon film PS102. This forms a source plug connected to the $n^+$ diffusion region 105 which is the source.

Next, as shown in FIG. 2D, wet etching is performed to remove the silicon nitride film SN102. This exposes the portions of the polysilicon film PS101 which were directly below the silicon nitride film SN102.

Next, as shown in FIG. 3A, the high-temperature oxide films HTO101 and HTO102 are masked, and the polysilicon film PS101 is dry-etched. Thus, the portions of the polysilicon film PS101 which were directly underneath the silicon nitride film SN102 (see FIG. 2D) are selectively removed. Note that the portions of the polysilicon film PS101 directly below the high-temperature oxide film HTO101 is not removed but remains. This remaining polysilicon film PS101 becomes the floating gate FG101. The form of the floating gate FG101 reflects the shape of the recess 103 (see FIG. 1B), and has a sharp ridge 106 formed at the edge farthest from the $n^+$ diffusion region 105. This dry etching also removes part of the polysilicon film PS102.

Next, as shown in FIG. 3B, wet etching removes part of the exposed coupling oxide film COX101. At this time, the high-temperature oxide film HTO101 is also etched, so the width and height thereof is reduced somewhat. Consequently, the sharp ridge 106 of the floating gate FG101 is exposed.

Next, as shown in FIG. 3C, a high-temperature oxide film HTO103 is formed on the entire face. This covers the sharp ridge 106 of the floating gate FG101 with the high-temperature oxide film HTO103, and the high-temperature oxide film HTO103 serves as a tunneling oxide film.

Next, as shown in FIG. 3D, a polysilicon film PS103 is formed on the entire face and etched back, so as to form side walls of polysilicon film PS103 on the side portions of the side walls formed of the high-temperature oxide film HTO101 with the high-temperature oxide film HTO103 therebetween. The side wall becomes the control gate, serving as the word line.

Next, as shown in FIG. 4, the polysilicon films PS102 and PS103 and the high-temperature oxide film HTO101 are masked, and arsenic (As) ions are implanted, thereby forming an $n^+$ diffusion region 107 at a region which is not directly below the polysilicon films PS102 and PS103 and the high-temperature oxide film HTO101 on the surface of the silicon substrate 101. This $n^+$ diffusion region 107 becomes the drain, serving as the bit line. Subsequently, wiring is formed by normal CMOS processes, thereby fabricating the flash memory.

With the conventional flash memory, the floating gate FG101 has the sharp ridge 106, so the internal electric field intensity within the high-temperature oxide film HTO103 near the sharp ridge 106 rises (electrostatic focusing effect), and electrons are efficiently drawn from the sharp ridge 106 to the control gate formed of the polysilicon film PS103. Accordingly, in the event that the voltage Vw to be applied to the word line is the same (e.g., Vw=10 V), the erasing speed can be improved as compared to cases wherein the sharp ridge 106 has not been formed. Also, the voltage Vw can be reduced.

However, the above-described conventional technique has the following problems. As descried above, the silicon nitride film SN102 is dry-etched in the step shown in FIG. 1A, but a sufficient selection ratio (ratio of etching speeds) cannot be ensured between the silicon nitride film and the polysilicon, as shown in FIG. 1B, so the polysilicon film PS101 is over-etched, and the recess 103 is unavoidably formed. At this time, the degree of over-etching differs from one cell to another, so the shape of the recess 103 also differs from one cell to another.

With the conventional technique described above, the recess 103 is used to form the sharp ridge 106 of the floating gate FG101, so the shape of the sharp ridge 106, particularly the angle of the point, is very irregular. Consequently, there is irregularity in the behavior of the electrons drawn out from the floating gate FG101 due to the irregularity of the field intensity at the portion of the high-temperature oxide film HTO103 covering the sharp ridge 106. This means that the erasing properties such as erasing speed and the like differ from one cell to another in a single flash memory device. As a result, the actions of the flash memory are unstable, and the reliability is poor.

SUMMARY OF THE INVENTION

Accordingly, it is an object of the present invention to provide a method for manufacturing non-volatile memory, and the non-volatile memory, wherein the shape of the floating gate is stabilized, and the erasing properties are made uniform from one cell to another.

According to a first aspect of the present invention, a method for manufacturing non-volatile memory comprises: a step for forming a first insulating layer on a first electroconductive semiconductor substrate; a step for forming a first electroconductive film on the first insulating film; a step for forming an etching stopper film on the first electroconductive film; a step for forming a spacer film on the etching stopper film; a step for selectively removing the spacer film by etching to the etching stopper film, so as to form an opening; a step for removing the etching stopper film in the opening; a step for forming a bowl-shaped recess in the first electroconductive film within the opening; a step for forming a side wall insulating film on the side face of the opening; a step for removing the first electroconductive film and the first insulating film within the opening; a step for implanting impurities of a second electroconductivity type on the surface of the semiconductor substrate within the opening, thereby forming one of a source and drain; a step for forming a second insulating film so as to cover the exposed face of the first electroconductive film within the opening; a step for forming a plug by filling the inside of the opening with an electroconductive film; a step for removing the spacer film; a step for forming a floating gate formed of the first electroconductive film at the region directly below the side wall insulating film, by selectively etching away the first electroconductive film with the side wall insulating film as a mask; a step for forming a third insulating film so as to cover the exposed face of the floating gate; a step for forming a control gate on the side of the plug by forming an electroconductive film on the side wall insulating film; and a step for forming the other of the source and drain by selectively implanting impurities of a second electroconductivity type on the surface of the semiconductor substrate, with the plug, the side wall insulating film, the floating gate, and the control gate, as masks.

With the non-volatile memory according to the present invention, the shape of the floating gate reflects the shape of the recess formed in the first electroconductive film, and accordingly a sharp ridge is formed at the end portion of the floating gate near the control gate. Thus, electrons are discharged from the floating gate more readily at the time of erasing memory, thereby improving the memory erasing speed.

Also, an etching stopper film is formed on the first electroconductive film, so the first electroconductive film is not over-etched at the time of etching the spacer film, and accordingly etching of the spacer film can be stopped at the surface of the first electroconductive film with high precision. Thus, the position for starting formation of the recess in the first electroconductive film can be matched for each of the cells, and accordingly the bowl-shaped recess can be formed in the first electroconductive film with high precision. Consequently, the shape of the floating gate from one cell to another becomes uniform, and erasing properties can be stabilized.

Also, the step for forming the etching stopper film preferably includes a step for forming a film containing silicon oxide. Thus, a sufficient etching selection ratio can be maintained for etching the spacer film.

Further, the step for forming the etching stopper film preferably includes a step for forming a second electroconductive film on the film containing silicon oxide, with the step for removing the etching stopper film from the opening comprising a step for etching and removing the second electroconductive film in the opening, and a step for etching and removing the film containing silicon oxide in the opening. Dividing the step for etching the etching stopper film into the two steps of the step for etching the second electroconductive film and the step for etching a film including a silicon oxide allows the etching of the spacer film to be accurately stopped at the surface of the first electroconductive film more easily.

Further, the step for forming the film containing a silicon oxide preferably is a step for forming a silicon oxide film by chemical vapor deposition, at a temperature of 700° C. or lower. Thus, crystal growth of the first electroconductive film can be suppressed in the step for forming the silicon oxide film, thereby reducing the effects of crystal particles in the formation of the recess in the first electroconductive film.

Further, the step for forming the spacer film may include a step for forming a silicon film, and a step for forming a protective film for covering the exposed face of the silicon film on the inside of the opening following the step for forming the opening. Using $SiO_2$ for the material of the etching stopper and Si for the material of the spacer film, a ($SiO_2$/Si) combination generally yields an etching selection ratio much higher than an ($SiN_x$/Si) combination, so the opening in the spacer film can be precisely formed more easily. Also, forming the spacer film of silicon allows the spacer film to be removed by dry etching. Thus, the manufacturing processing can be reduced as compared with cases of removing the spacer film by wet etching.

At this time, the method for manufacturing non-volatile memory preferably further comprises: a step for making the concentration of impurity in the plug higher than the concentration of impurity in the silicon film; and a step for oxidizing the plug before the step for forming and removing the spacer film. Thus, a thick oxide film can be formed on the top of the plug employing the phenomenon of accelerated oxidization, whereby this oxide film protects the plug in the step for removing the spacer film.

Further, the step for forming the side wall insulating film preferably includes a step for forming a silicon oxide film, a step for forming a silicon nitride film on the silicon oxide film, and a step for etching back to selectively remove the silicon oxide film and the silicon nitride film, with a two-layer film formed of the silicon oxide film and silicon nitride film remaining along the inner face of the opening; with the method further comprising a step for removing a part of the silicon oxide film following the step for forming the floating gate, so as to cause a part of the floating gate to protrude from the side wall insulating film. Thus, the length of the protruding portion of the floating gate can be stipulated by the thickness of the silicon oxide film. Consequently, irregularities in the length of the protruding portion of the floating gates can be suppressed, thereby stabilizing erasing properties.

Or, the step for forming the side wall insulating film may include a step for forming a silicon nitride film, a step for forming a silicon oxide film on the silicon nitride film, and a step for etching back to selectively remove the silicon nitride film and the silicon oxide film, with a two-layer film formed of the silicon oxide film and silicon nitride film remaining along the inner face of the opening; the method further comprising a step for removing a part of the silicon nitride film following the step for forming the floating gate, so as to cause a part of the floating gate to protrude from the side wall insulating film.

According to a second aspect of the present invention, a method for manufacturing non-volatile memory comprises: a step for forming a first insulating layer on a first electroconductive semiconductor substrate; a step for forming a first electroconductive film on the first insulating film; a step for forming a spacer film on the first electroconductive film; a step for selectively removing the spacer film by etching, so as to form an opening; a step for implanting impurities in the first electroconductive film within the opening; a step for partially oxidizing the surface of the first electroconductive film within the opening so as to form an oxide film; a step for removing the oxidized film and forming a bowl-shaped recess in the first electroconductive film; a step for forming a side wall insulating film on the side face of the opening; a step for removing the first electroconductive film and the first insulating film within the opening; a step for implanting impurities of a second electroconductivity type on the surface of the semiconductor substrate within the opening, thereby forming one of a source and drain; a step for forming a second insulating film so as to cover the exposed face of the first electroconductive film within the opening; a step for forming a plug by filling the inside of the opening with an electroconductive film; a step for removing the spacer film; a step for forming a floating gate of the first electroconductive film at the region directly below the side wall insulating film, by selectively etching away the first electroconductive film with the side wall insulating film as a mask; a step for forming a third insulating film so as to cover the exposed face of the floating gate; a step for forming a control gate on the side of the plug by forming an electroconductive film on the side wall insulating film; and a step for forming the other of the source and drain by selectively implanting impurities of a second electroconductivity type on the surface of the semiconductor substrate, with the plug, the side wall insulating film, the floating gate, and the control gate, as masks.

According to the present invention, impurities are injected in the first electroconductive film in the opening. Accordingly, a dispersion region of the impurity is formed in the first electroconductive film, and the shape of this dispersion region can be realized with extremely high-precision reproducibility. The oxidization speed of the surface of the first electroconductive film is dependent on the impurity concentration, so the shape of the formed oxide film reflects the shape of the impurity dispersion region, and according the shape stability improves. Consequently, stability in the formation of the recess also improves, and the stability of the shape of the floating gate also improves. Accordingly, the memory erasing properties can be stabilizes, and made uniform from one cell to another.

According to a third aspect of the present invention, a method for manufacturing non-volatile memory comprises: a step for forming a first insulating film on a first electroconductive semiconductor substrate; a step for forming a first electroconductive film on the first insulating film; a step for forming a spacer film on the first electroconductive film; a step for selectively removing the spacer film by etching, so as to form an opening; a step for forming a side wall insulating film on the side face of the opening; a step for removing the first electroconductive film and the first insulating film within the opening; a step for implanting impurities of a second electroconductivity type on the surface of the semiconductor substrate within the opening, thereby forming one of a source and drain; a step for forming a second insulating film so as to cover the exposed face of the first electroconductive film within the opening; a step for forming a plug by filling the inside of the opening with an electroconductive film; a step for removing the spacer film; a step for forming a floating gate of the first electroconductive film at the region directly below the side wall insulating film, by selectively etching away the first electroconductive film with the side wall insulating film as a mask; a step for partially removing the side wall insulating film, and causing the end portion of the floating gate to protrude from the side wall insulating film by a length of 100 nm or less; a step for forming a third insulating film so as to cover the exposed face of the floating gate; a step for forming a control gate on the side of the plug by forming an electroconductive film on the side wall insulating film; and a step for forming the other of the source and drain by selectively implanting impurities of a second electroconductivity type on the surface of the semiconductor substrate, with the plug, the side wall insulating film, the floating gate, and the control gate, as masks.

Also, the step for forming the third insulating film may include a step for forming a thermally-oxidized film on the exposed surface of the floating gate. Accordingly, optimizing the thermal oxidizing process conditions enables a sharp ridge to be formed on the corner portion of the upper face of the floating gate. Consequently, discharge of electrons from the sharp ridge is promoted even further at the time of erasing the memory. Also, the corner portion on the bottom of the floating gate can be rounded off. Accordingly, leakage of electrons from the corner portion of the base can be suppressed, thereby stabling memory erasing properties.

According to a fourth aspect of the present invention, non-volatile memory comprises: a first electroconductivity type semiconductor substrate with a mutually-distanced source and drain formed on the surface; a plug provided in a region directly above one of the source and drain on the semiconductor substrate; a second insulating film provided to the side face of the plug; a first insulating film provided in a region adjacent to one of the source and drain on the surface of the semiconductor substrate; a floating gate formed of a first electroconductive film provided on the first insulating film; a side wall insulating film provided on the second insulating film so as to cover part of the floating gate and allow the remainder thereof to protrude; a third insulating film for covering the protruding portion from the side wall insulating film of the floating gate; and a control gate formed of an electroconductive film and provided on the side wall insulating film; wherein the plug, the side wall insulating film, and the control gate, are provided in a region other than directly above the other of the source and drain; and wherein the length of protrusion by which protruding portion protrudes from the side wall insulating film of the floating gate is 100 nm or less.

Also, the length of protrusion by which protruding portion protrudes is preferably equal to or more than the thickness of the third insulting film. Accordingly, in the event that the third insulting film is also formed on the side wall insulating film, the floating gate can be made to also protrude form the third insulating film formed on the side wall insulating film.

According to the present invention, forming an etching stopper film on the first electroconductive film enables the shape of the floating gate to be stabilized at the time of etching the spacer film, without over-etching of the first electroconductive film. Accordingly, non-volatile memory having uniform erasing properties from one cell to another can be obtained.

DETAILED DESCRIPTION OF THE PREFERRED EMBODIMENTS

The following is a detailed description of embodiments of the present invention, with reference to the drawings.

First Embodiment

First, the first embodiment of the present invention will be described. FIGS. 5 through 22B are plan views and cross-sectional views illustrating a method of manufacturing flash memory according to the present embodiment, in order of the steps. More specifically, FIGS. 5, 8, 9, 13, 18, and 21 are cross-sectional drawings illustrating each of the steps, FIGS. 6A, 7A, 10A, 11A, 12A, 14A, 15A, 16A, 17A, 19A, and 20A are plan views illustrating each step, while FIGS. 6B, 7B, 10B, 11B, 12B, 14B, 15B, 16B, 17B, 19B, and 20B are cross-sectional views of the respective plan views, and FIGS. 22A and 22B are plan views. Note that while these plan views only illustrate an arrangement of 3 by 3 cells, for a total of 9 cells, in order to facilitate description, the present embodiment is by no means restricted to this arrangement, and encompasses arrangements with greater numbers of cells as well. With the present embodiment, flash memory will be described as an example of non-volatile memory.

Figure 5:
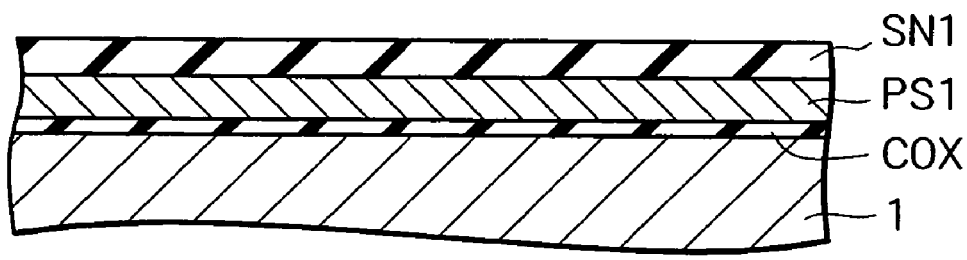
FIG. 5 is a cross-sectional diagram illustrating the method for manufacturing flash memory according to a first embodiment of the present invention.

First, as shown in FIG. 5, a coupling oxide film COX is formed by thermal oxidization on a p-type silicon substrate 1, to a thickness of 10 nm, for example. Next, a polysilicon film PS1 is formed to a thickness of 150 nm, for example, on the coupling oxide film COX. Next, a silicon nitride film SN1 is formed on the polysilicon film PS1 to a thickness of 50 nm, for example.

Figure 6A:
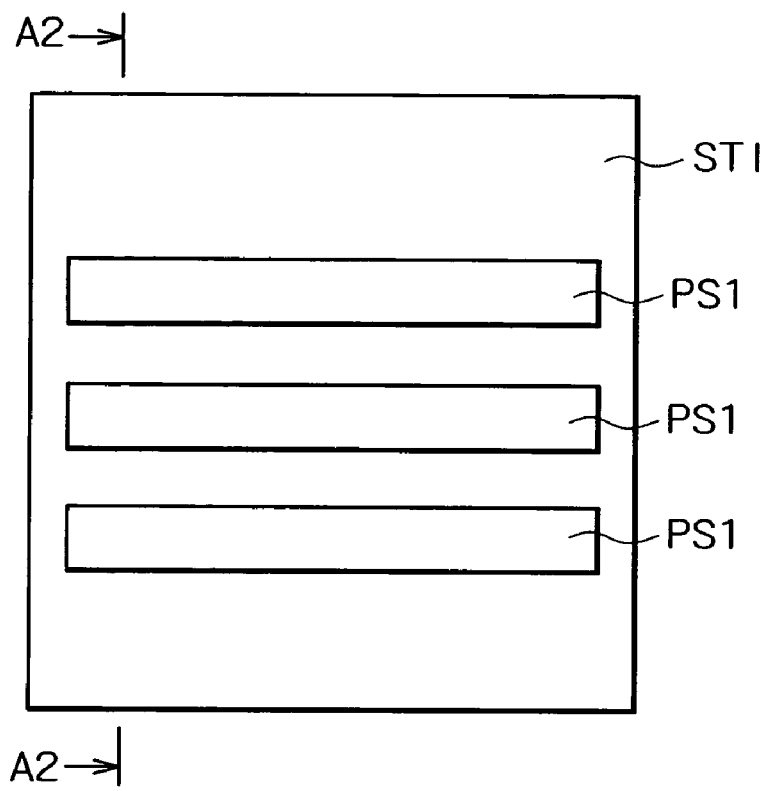
FIG. 6A is a plan view illustrating the step following that in FIG. 5 in the method for manufacturing flash memory according to the first embodiment.
Figure 6B:
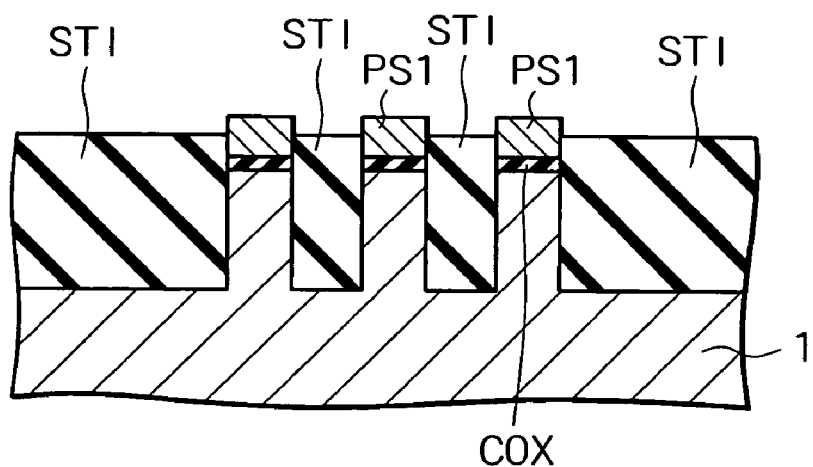
FIG. 6B is a cross-sectional view along line A2-A2 in FIG. 6A.

Next, as shown in FIGS. 6A and 6B, a resist (not shown) is formed on the silicon nitride film SN1, and patterned in slits. The patterned resist is then masked, and the silicon nitride film SN1 (see FIG. 5), polysilicon film PS1, coupling oxide film COX, and surface portion of the silicon substrate 1, are etched and selectively removed, and an oxide film is embedded in the removed portion using a normal STI (Shallow Trench Isolation) process technique, thereby forming element separating regions STI. Subsequently, the silicon nitride film SN1 on the polysilicon film PS1 is removed.

Figure 7A:
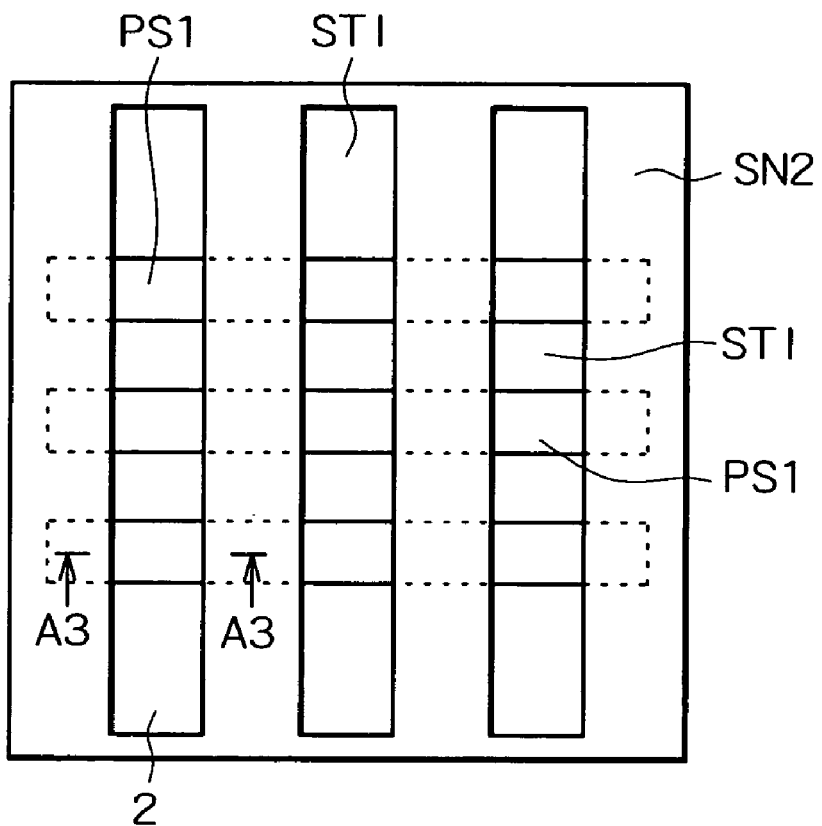
FIG. 7A is a plan view illustrating the step following that in FIG. 6A in the method for manufacturing flash memory according to the first embodiment.
Figure 7B:
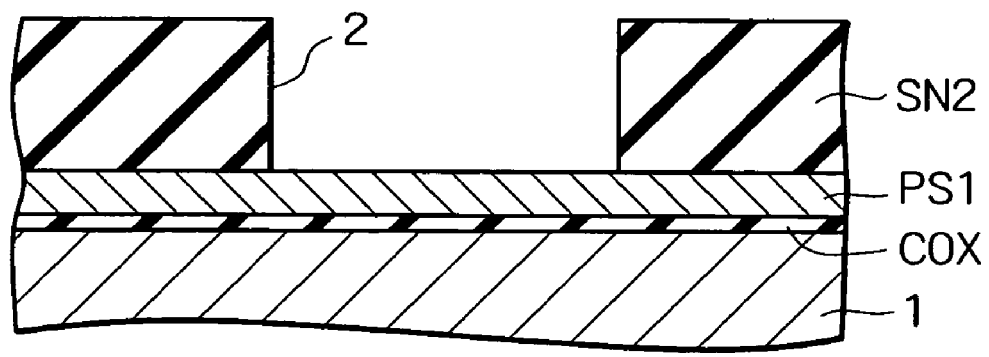
FIG. 7B is a cross-sectional view along line A3-A3 in FIG. 7A.

Next, as shown in FIGS. 7A and 7B, a silicon nitride film SN2 is formed on the polysilicon film PS1 and the element separating regions STI to a thickness of 350 nm, for example. A resist (not shown) is formed on the silicon nitride film SN2, and patterning is performed. The silicon nitride film SN2 is selectively removed by dry etching, using the patterned resist as a mask, thereby forming openings 2 from which a part of the polysilicon film PS1 is exposed.

Figure 8:
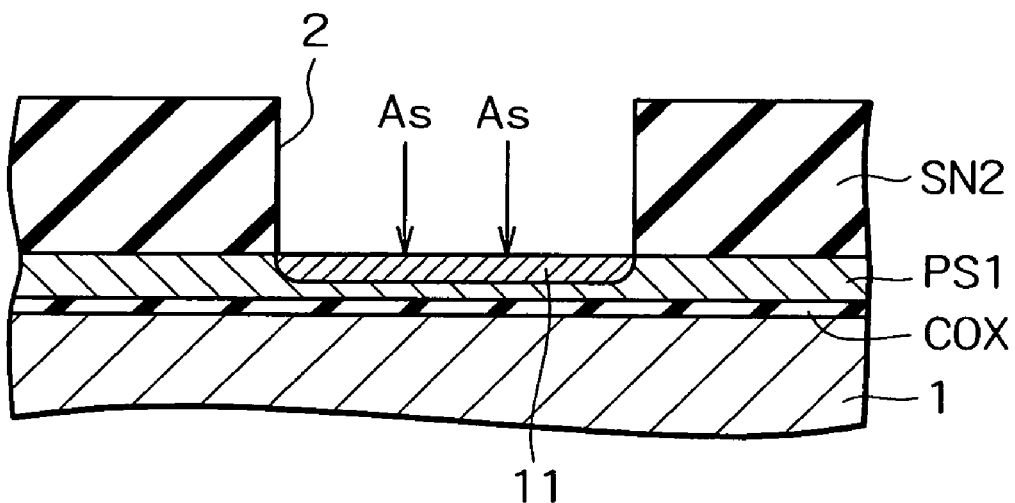
FIG. 8 is a cross-sectional diagram illustrating the step following that in FIG. 7B, in the method for manufacturing flash memory according to the first embodiment.

Next, as shown in FIG. 8, arsenic (As) ions are implanted in the opening 2. This doping is performed with a dose amount of $1\times10^{14}$ to $3\times10^{15}$ cm$^{-2}$, under energy of 20 to 30 kev, for example. This forms an arsenic implanted region 11 at the region forming the bottom of the opening 2 in the polysilicon film PS1 and the surrounding region thereof.

Figure 9:
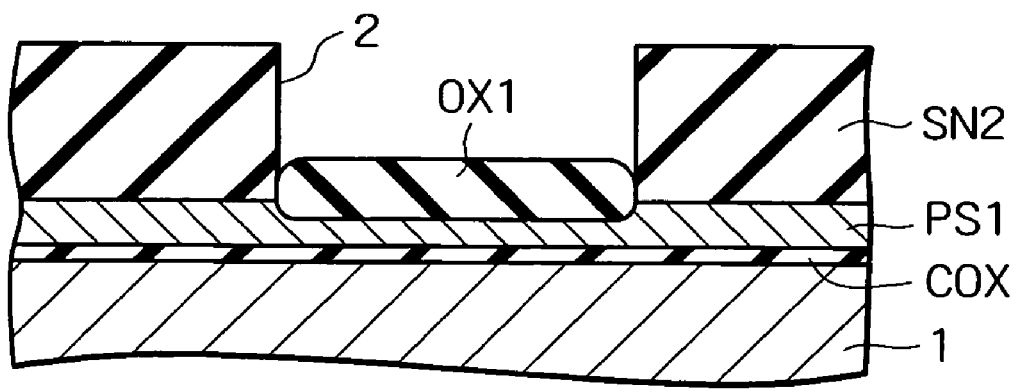
FIG. 9 is a cross-sectional diagram illustrating the step following that in FIG. 8, in the method for manufacturing flash memory according to the first embodiment.

Next, as shown in FIG. 9, the substrate being worked is kept at a temperature of 850° C. for example, for around 30 minutes, so as to oxidize the exposed surface of the silicon. This oxidizes the polysilicon film PS1 at the bottom of the opening 2, forming an oxide film OX1. Now, the rate of oxidization of the silicon is proportionate to the concentration of arsenic, so the shape of the oxide film OX1 reflects the concentration distribution of the implanted arsenic.

Figure 10A:
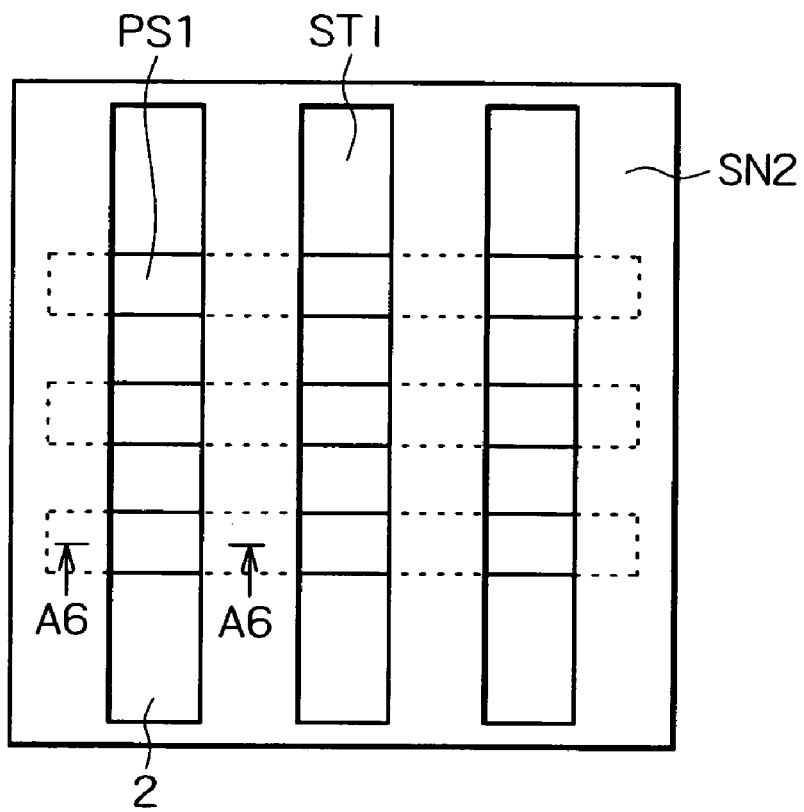
FIG. 10A is a plan view illustrating the step following that in FIG. 9 in the method for manufacturing flash memory according to the first embodiment.
Figure 10B:
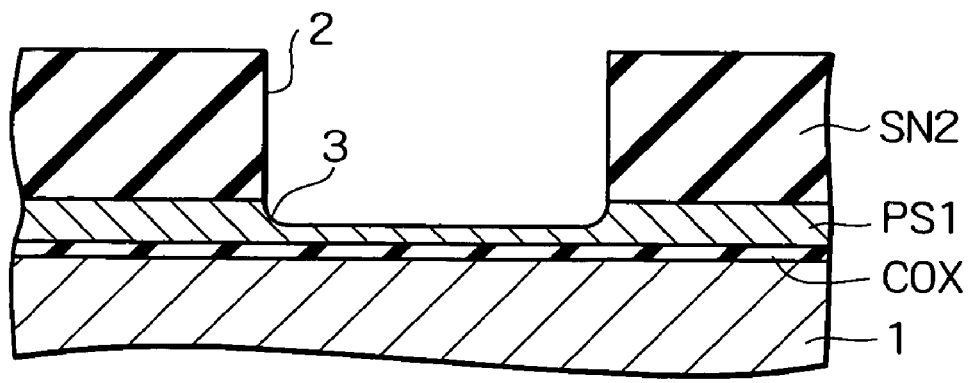
FIG. 10B is a cross-sectional view along line A6—A6 in FIG. 10A.

Next, as shown in FIGS. 10A and 10B, wet etching is performed to remove the oxide film OX1. This forms a bowl-shaped recess 3 at the region corresponding to the bottom of the opening 2 in the polysilicon film PS1.

Figure 11A:
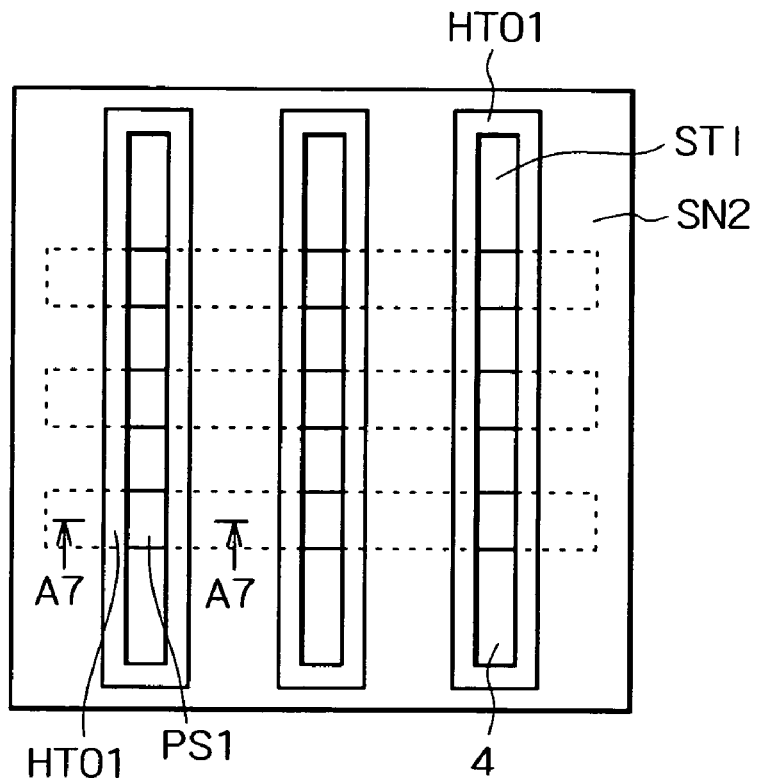
FIG. 11A is a plan view illustrating the step following that in FIG. 10A in the method for manufacturing flash memory according to the first embodiment.
Figure 11B:
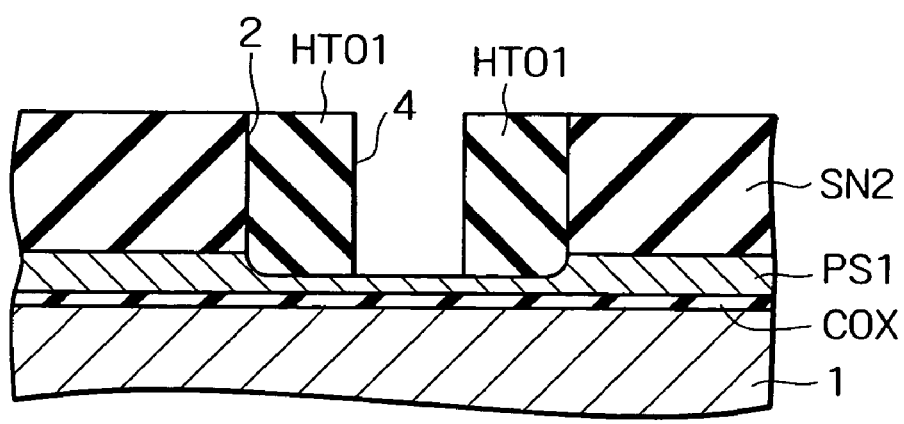
FIG. 11B is a cross-sectional view along line A7—A7 in FIG. 11A.

The following steps are the same as the conventional flash memory manufacturing method illustrated in FIGS. 1A through 4. That is to say, high-temperature oxide film HTO1 is deposited to a thickness of 150 nm for example, as shown in FIGS. 11A and 11B. Deposition of the high-temperature oxide film HTO1 is performed by CVD at a growth temperature of 800° C., for example. Subsequently, the high-temperature oxide film HTO1 is etched back, thereby removing the high-temperature oxide film HTO1 formed on silicon nitride film SN2 and on the bottom face of the opening 2, while leaving the high-temperature oxide film HTO1 on the side faces of the opening 2, thereby forming side walls of the high-temperature oxide film HTO1 on the side faces of the opening 2. Thus, the inner diameter of the opening 2 is reduced, forming an opening 4. Note that an arrangement may be made wherein the side faces of the polysilicon film PS1 in the opening 2 are subjected to thermal oxidization, thereby forming a thermal oxide film of thickness around 5 nm for example, before forming the high-temperature oxide film HTO1. This stabilizes the Si/SiO$_2$ interface.

Figure 12A:
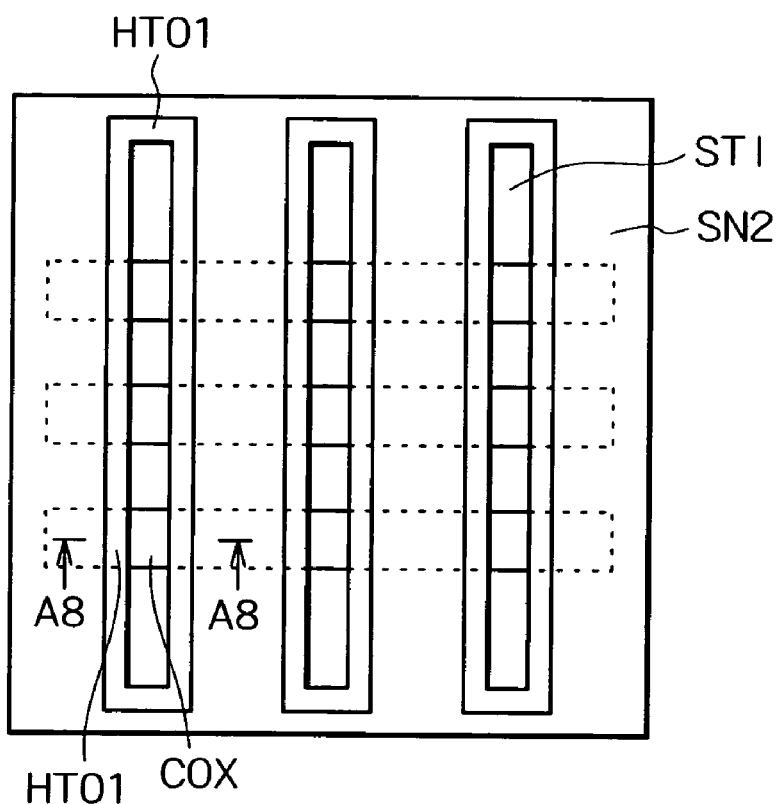
FIG. 12A is a plan view illustrating the step following that in FIG. 11A in the method for manufacturing flash memory according to the first embodiment.
Figure 12B:
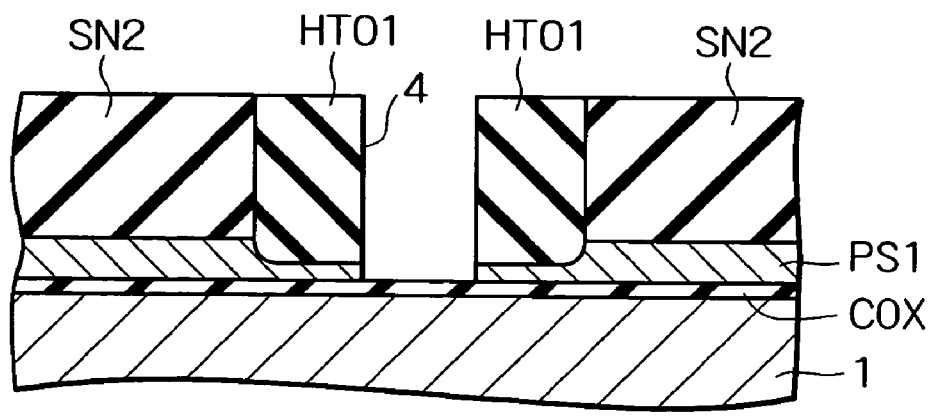
FIG. 12B is a cross-sectional view along line A8—A8 in FIG. 12A.

Next, as shown in FIGS. 12A and 12B, the polysilicon film PS1 is selectively removed by dry etching, with the silicon nitride film SN2 and the high-temperature oxide film HTO1 as a mask, thereby exposing the coupling oxide film COX at the bottom of the opening 4.

Figure 13:
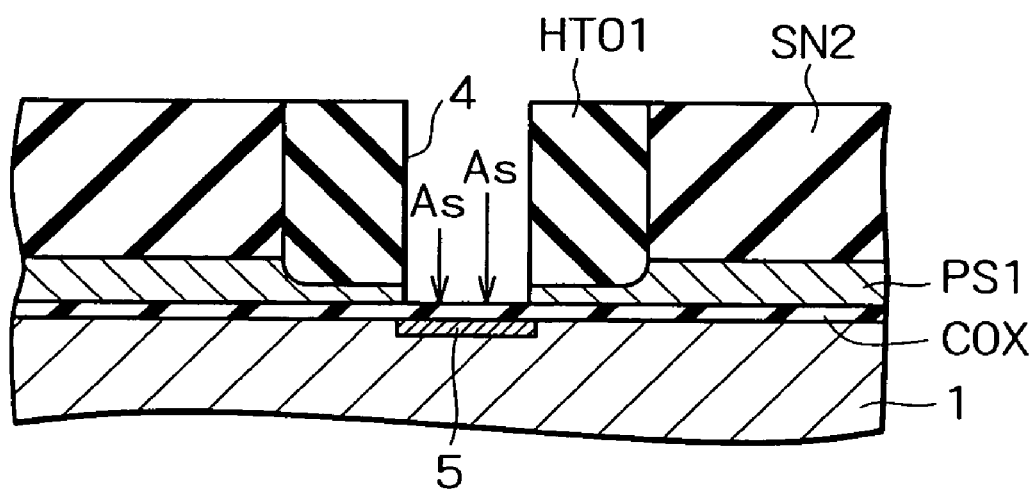
FIG. 13 is a plan view illustrating the step following that in FIG. 12A in the method for manufacturing flash memory according to the first embodiment.

Next, as shown in FIG. 13, arsenic (As) ions are implanted in the bottom of the opening 4, thereby forming a n$^+$ diffusion region 5 on the surface of the silicon substrate 1. This n$^+$ diffusion region 5 serves as the source.

Figure 14A:
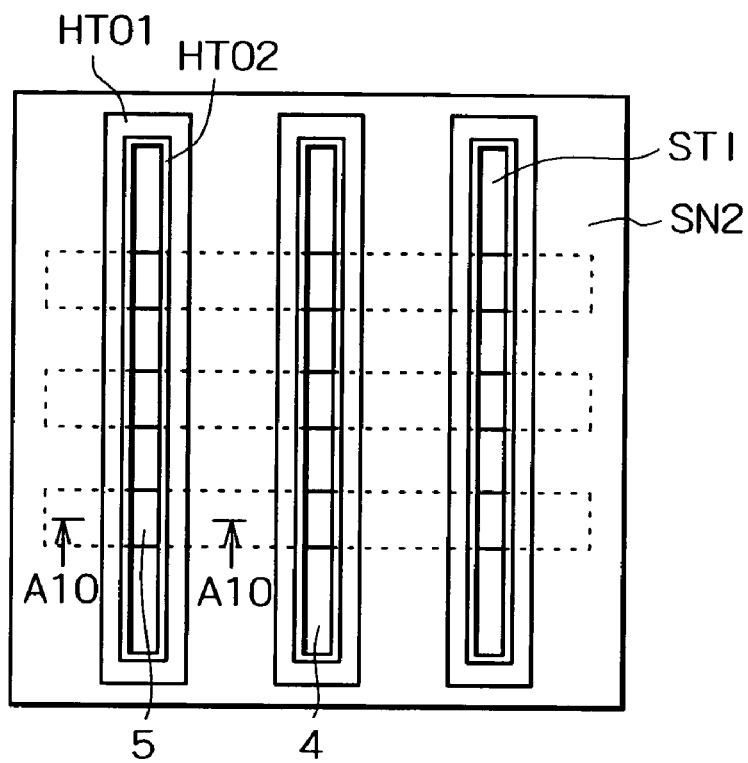
FIG. 14A is a plan view illustrating the step following that in FIG. 13 in the method for manufacturing flash memory according to the first embodiment.
Figure 14B:
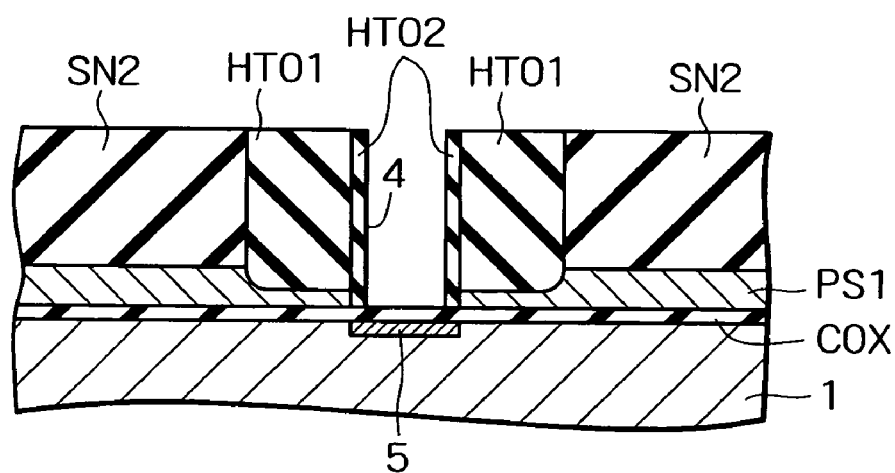
FIG. 14B is a cross-sectional view along line A10—A10 in FIG. 14A.

Next, as shown in FIGS. 14A and 14B, high-temperature oxide film HTO2 is deposited to a thickness of 10 to 20 nm for example, on the entire face, then etched back, thereby forming side walls of the high-temperature oxide film HTO2 on the side faces of the opening 4. The coupling oxide film COX is removed at the bottom of the opening 4, thereby exposing the n$^+$ diffusion region 5 of the silicon substrate 1. Also, an arrangement may be made wherein the side faces of the polysilicon film PS1 in the opening 4 are subjected to thermal oxidization, thereby forming a thermal oxide film of thickness around 5 nm for example, before forming the high-temperature oxide film HTO2. This stabilizes the Si/SiO$_2$ interface. Or, thermal oxidization may be performed in an oxygen atmosphere following formation of the high-temperature oxide film HTO2. Thus, the oxygen in the atmosphere is transmitted through the high-temperature oxide film HTO2 and reaches the high-temperature oxide film HTO2 and polysilicon film PS1 interface, oxidizing the surface of the polysilicon film PS1. This stabilizes the Si/SiO$_2$ interface.

Figure 15A:
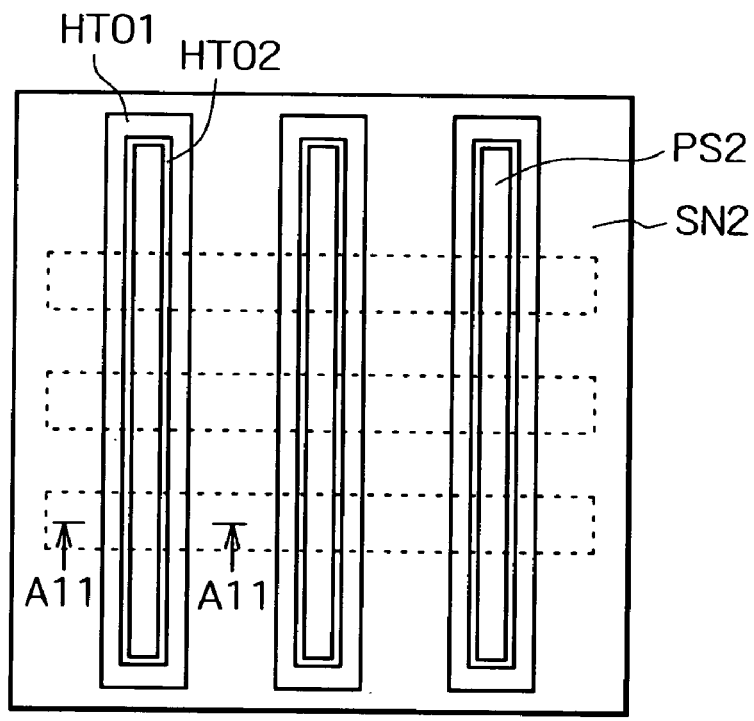
FIG. 15A is a plan view illustrating the step following that in FIG. 14A in the method for manufacturing flash memory according to the first embodiment.
Figure 15B:
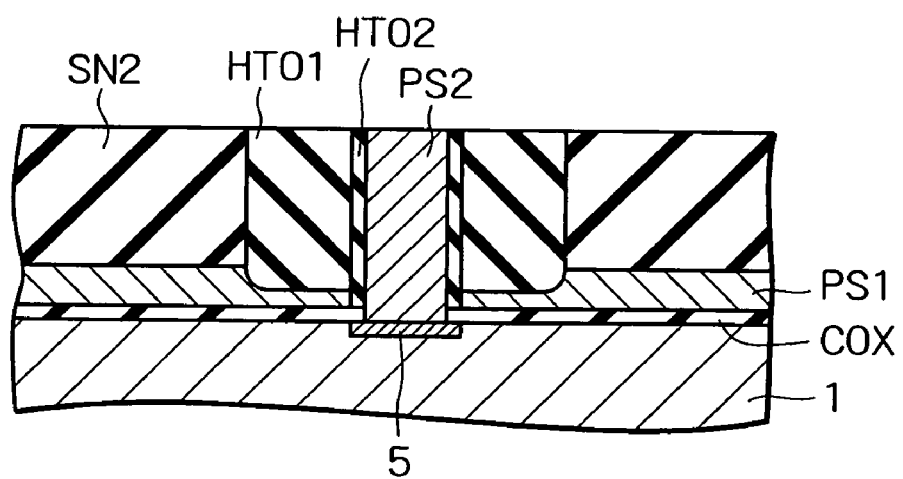
FIG. 15B is a cross-sectional view along line A11–A11 in FIG. 15A.

Next, as shown in FIG. 15A and FIG. 15B, a polysilicon film PS2 containing a high concentration of an n-type impurity is deposited on the entire face, and subsequently etched back, thereby filling in the interior of the opening 4 with the polysilicon film PS2. This forms a source plug connected to the n$^+$ diffusion region 5 which is the source.

Figure 16A:
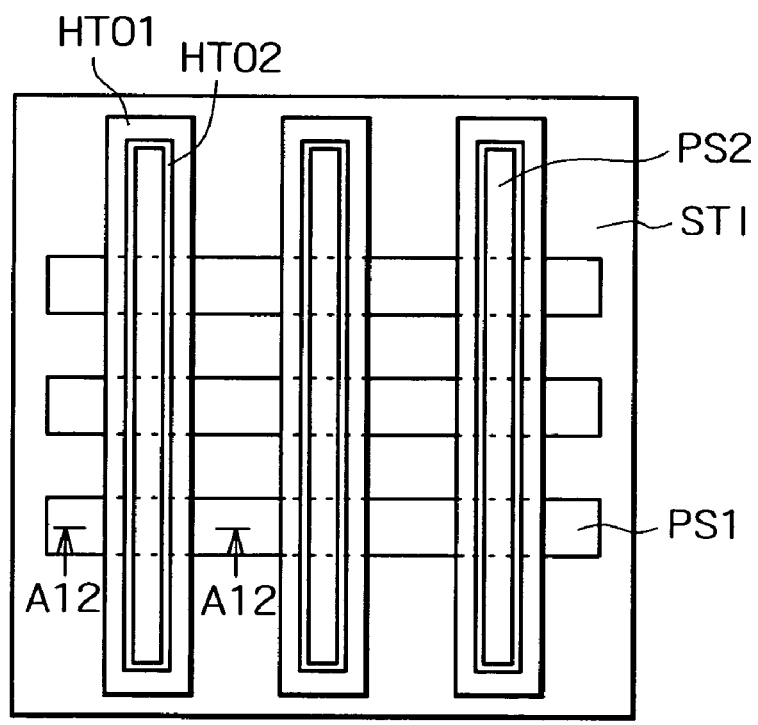
FIG. 16A is a plan view illustrating the step following that in FIG. 15A in the method for manufacturing flash memory according to the first embodiment.
Figure 16B:
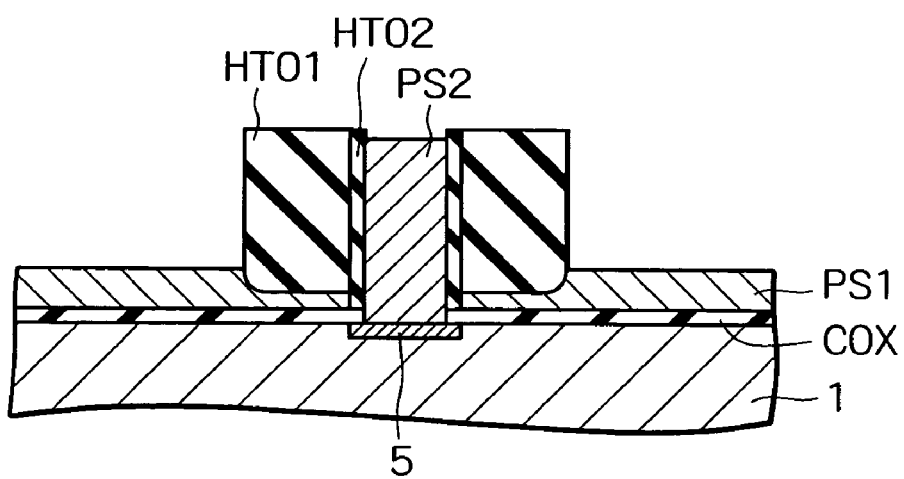
FIG. 16B is a cross-sectional view along line A12—A12 in FIG. 16A.

Next, as shown in FIGS. 16A and 16B, wet etching is performed to remove the silicon nitride film SN2. This exposes the portion of the polysilicon film PS1 directly below the silicon nitride film SN2.

Figure 17A:
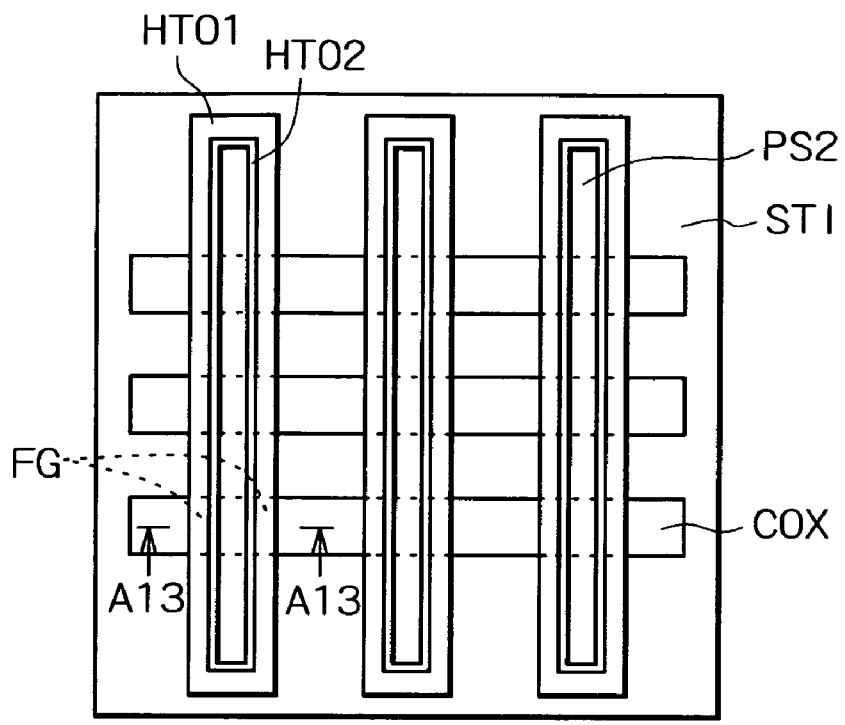
FIG. 17A is a plan view illustrating the step following that in FIG. 16A in the method for manufacturing flash memory according to the first embodiment.
Figure 17B:
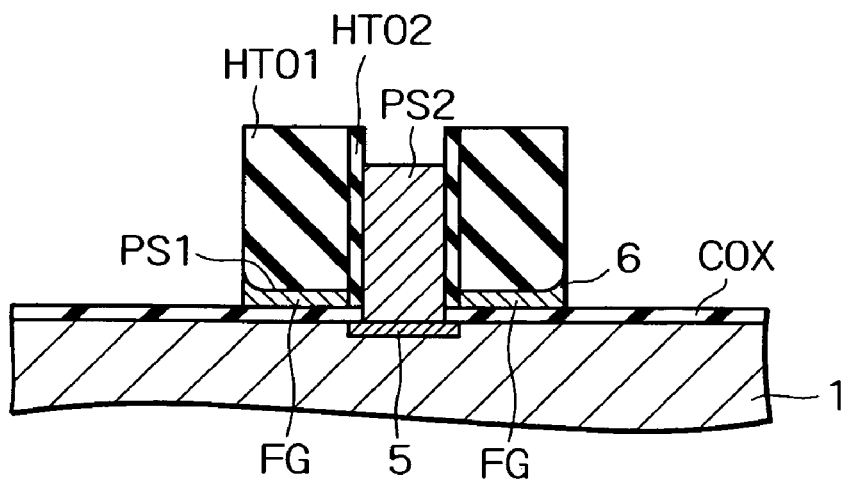
FIG. 17B is a cross-sectional view along line A13—A13 in FIG. 17A.

Next, as shown in FIGS. 17A and 17B, the polysilicon film PS1 is dry-etched. Thus, the portion of the polysilicon film PS1 which had been directly beneath the silicon nitride film SN2 (see FIG. 15B) is selectively removed. Note that the portion of the polysilicon film PS1 directly beneath the high-temperature oxide film HTO1 is not removed, and remains. This remaining polysilicon film PS1 becomes the floating gate FG. The shape of the floating gate G reflects the shape of the recess 3 (see FIG. 10B), with a sharp ridge 6 formed at the edge portion most distant from the n$^+$ diffusion region 5. The polysilicon film PS2 is also partially removed by this dry etching.

Figure 18:
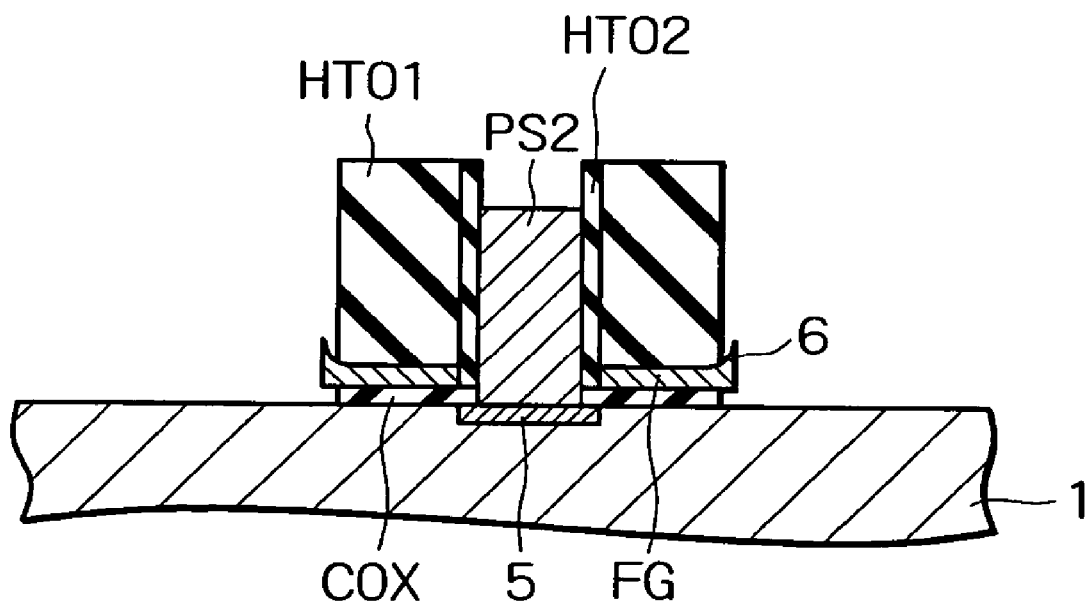
FIG. 18 is a cross-sectional diagram illustrating the step following that in FIG. 17A, in the method for manufacturing flash memory according to the first embodiment.

Next, as shown in FIG. 18, wet etching is performed to remove the exposed portion of the coupling oxide film COX. At this time, the high-temperature oxide film HTO1 is also etched, and the width thereof is reduced. Consequently, the sharp ridge 6 of the floating gate FG is exposed.

Figure 19A:
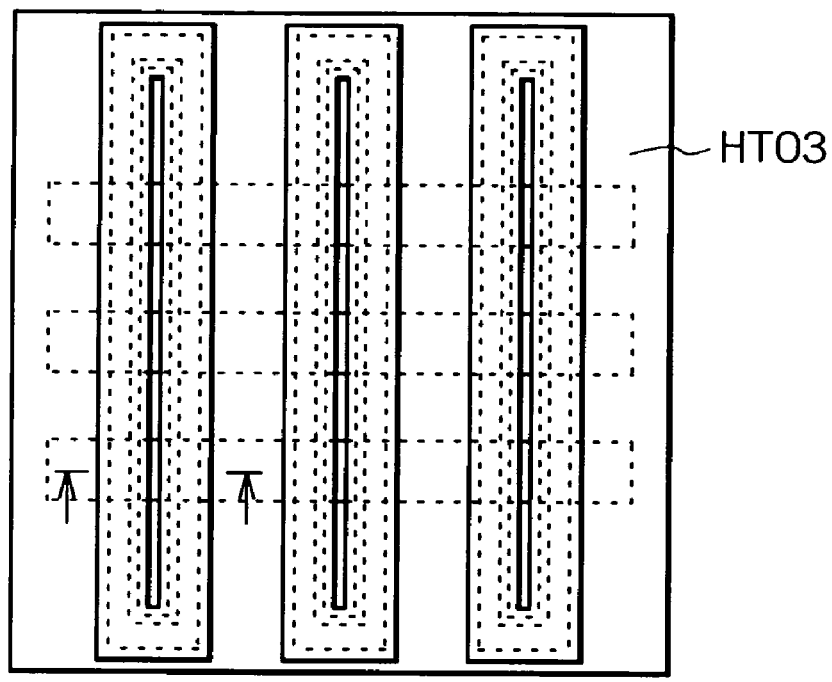
FIG. 19A is a plan view illustrating the step following that in FIG. 18 in the method for manufacturing flash memory according to the first embodiment.
Figure 19B:
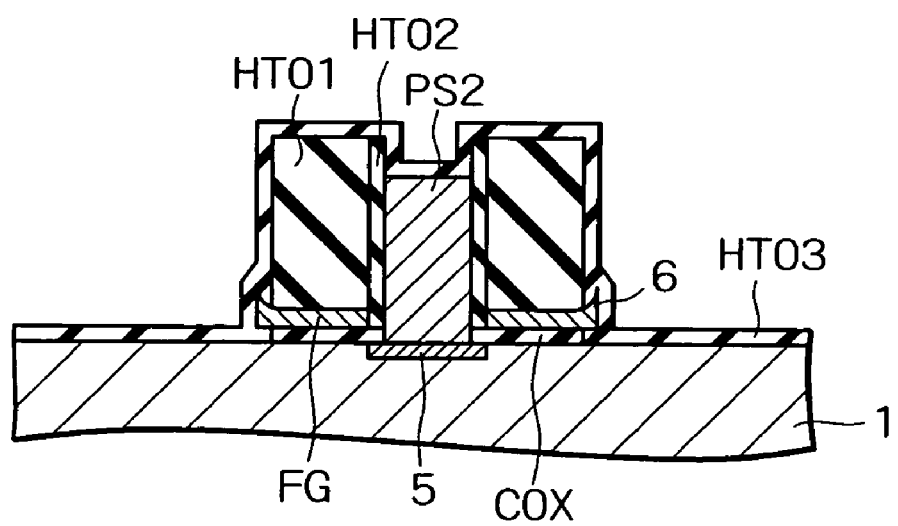
FIG. 19B is a cross-sectional view along line A15—A15 in FIG. 19A.

Next, as shown in FIGS. 19A and 19B, high-temperature oxide film HTO3 is formed on the entire face. As a result, the sharp ridge 6 of the floating gate FG is also covered with the high-temperature oxide film HTO3. This high-temperature oxide film HTO3 forms a tunneling oxide layer. Note that an arrangement may be made wherein, prior to forming the high-temperature oxide film HTO3, the exposed surfaces of the polysilicon film PS2 and the floating gate FG are subjected to thermal oxidization, so as to form a thermal oxidization film of around 5 nm in thickness, for example. This stabilizes the Si/SiO$_2$ interface. Or, thermal oxidization may be performed in an oxygen atmosphere following formation of the high-temperature oxide film HTO3. Thus, the oxygen in the atmosphere is transmitted through the high-temperature oxide film HTO3 and reaches the high-temperature oxide film HTO3 and floating gate FG interface, oxidizing the surface of the floating gate FG. This stabilizes the Si/SiO$_2$ interface.

Figure 20A:
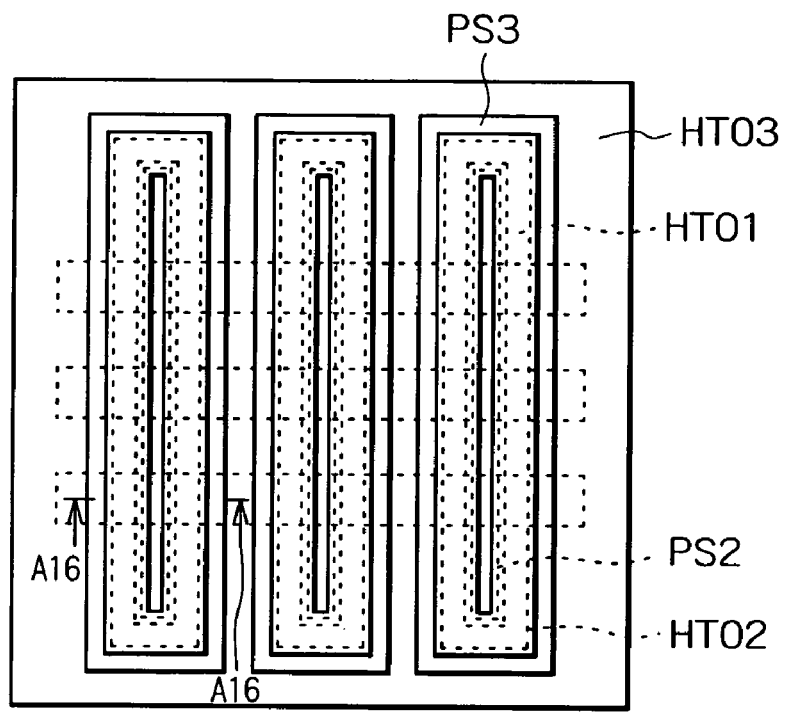
FIG. 20A is a plan view illustrating the step following that in FIG. 19A in the method for manufacturing flash memory according to the first embodiment.
Figure 20B:
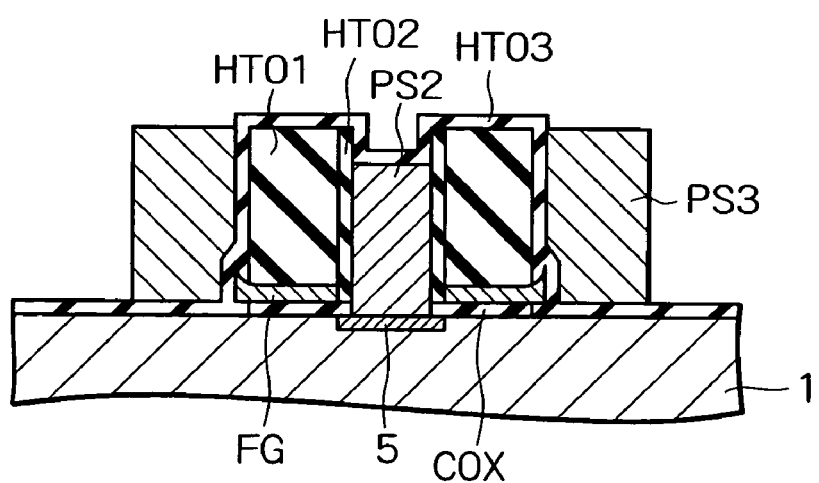
FIG. 20B is a cross-sectional view along line A16—A16 in FIG. 20A.

Next, as shown in FIGS. 20A and 20B, a polysilicon film PS3 is formed on the entire face to a thickness of 150 to 200 nm for example, which is then etched back, thereby forming a side wall formed of the polysilicon film PS3 on the side portion of the side wall of the high-temperature oxide film HTO1, with the high-temperature oxide film HTO3 therebetween. This side wall is the control gate, serving as the word line. The word line formed of the polysilicon film PS3 is formed in a ring so as to surround multiple cells arrayed in a row (in FIG. 20A, six cells arrayed in two rows in the vertical direction in the drawing).

Figure 21:
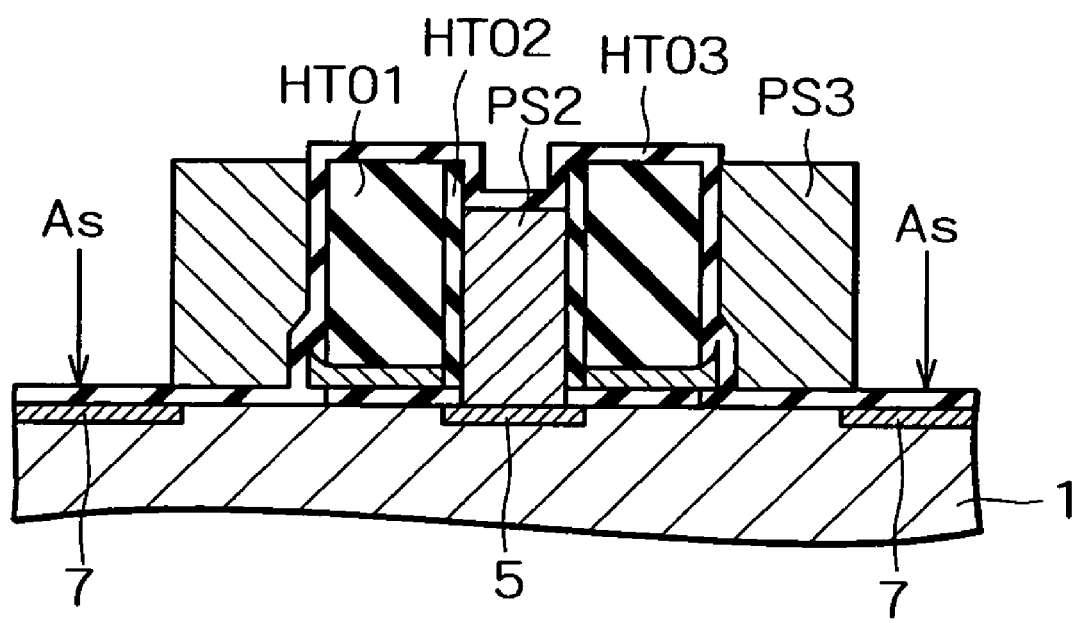
FIG. 21 is a cross-sectional diagram illustrating the step following that in FIG. 20A, in the method for manufacturing flash memory according to the first embodiment.
Figure 22A:
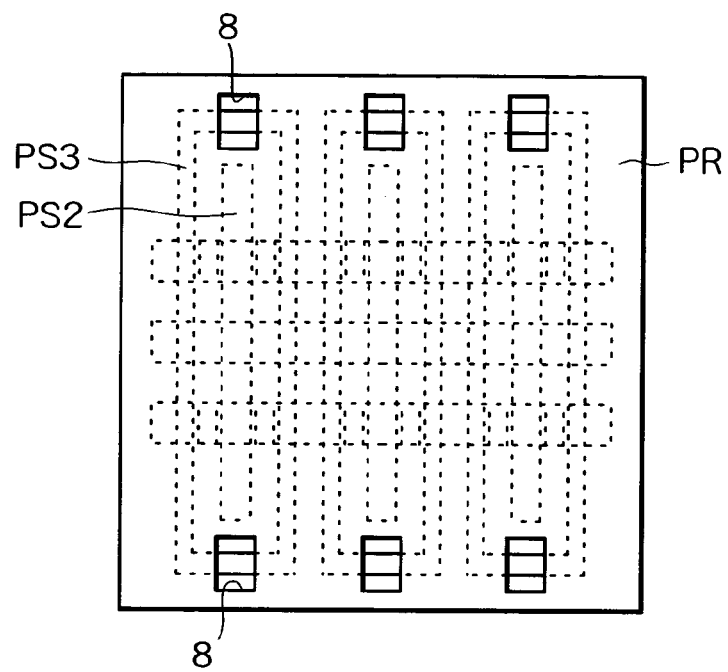
FIGS. 22A and 22B are plan views illustrating the step following that in FIG. 21 in the method for manufacturing flash memory according to the first embodiment, in order of the steps.
Figure 22B:
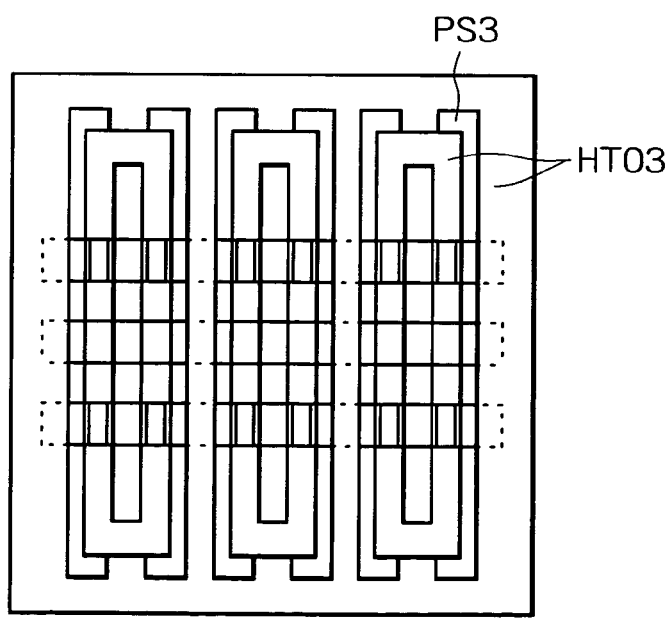

Next, as shown in FIG. 21, arsenic (As) ions are implanted on the surface of the silicon substrate 1 between the polysilicon films PS3, thereby forming a n$^+$ diffusion region 7. This n$^+$ diffusion region 7 becomes the drain, serving as the bit line.

Next, as shown in FIG. 22A, resist PR is formed on the entire face, and openings 8 are formed at the regions where the word lines formed of the polysilicon film PS3 and polysilicon film PS2 lines extending in the longitudinal direction intersect. As shown in FIG. 22B, dry etching is performed with the resist PR as a mask, and the polysilicon film PS3 exposed at the opening 8 is removed. Thus, the ring-shaped word line is cut, forming multiple line-shaped word lines insulated one from another. Subsequently, wiring is provided by a normal CMOS process, thereby fabricating the flash memory.

Figure 23:
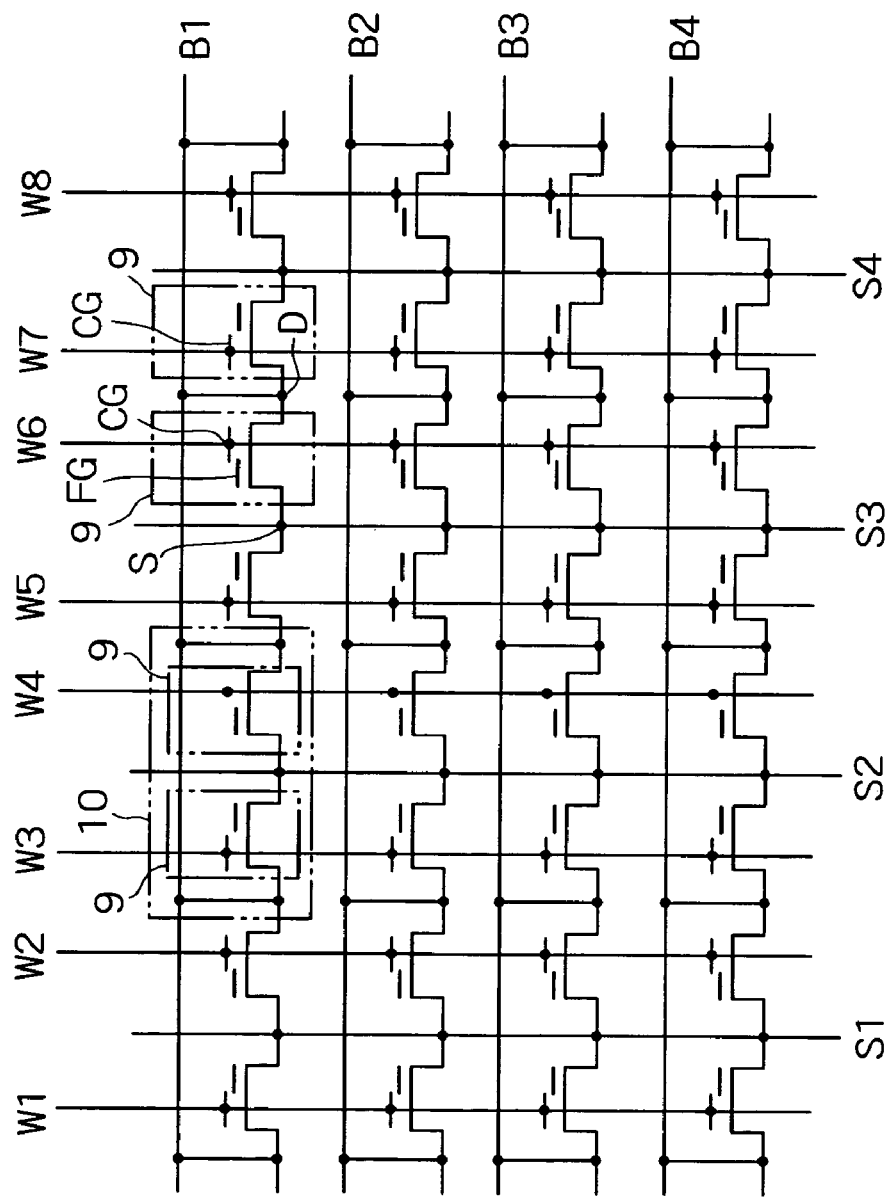
FIG. 23 is a circuit diagram illustrating the flash memory according to the first embodiment.

FIG. 23 is a circuit diagram illustrating the flash memory according to the present embodiment, manufactured as described above. As can be seen in FIG. 23, with this flash memory, multiple cells 9 are arrayed in matrix fashion, with two mutually adjacent cells 9 forming a pair. A region 10 formed of the pair of cells 9 is the region illustrated in FIG. 21. Each cell 9 has one control gate CG and floating gate FG apiece, with the control gate CG connected to one of the word lines W1 through W8, and the floating gate FG in an electrically floating state. Also, a source S is provided between the floating gates FG of the pair of cells 9, with one of source lines S1 through S4 connected thereto. Further, a drain D is provided between the control gates CG of the pair of cells 9, with one of bit lines B1 through B4 connected thereto.

Note that the control gates CG and word lines W1 through W8 shown in FIG. 23 correspond to the polysilicon film PS3 in FIG. 21, the sources S shown in FIG. 23 correspond to the $n^+$ diffusion region 5 in FIG. 21, the source lines S1 through S4 shown in FIG. 23 corresponding to the polysilicon film PS2 shown in FIG. 2, and the drains D shown in FIG. 23 correspond to the $n^+$ diffusion region 7 in FIG. 21.

Next, the operations of the flash memory according to the present embodiment, fabricated in this way, will be described with reference to FIGS. 21 through 23. First, the writing actions will be described. Upon grounding the source S ($n^+$ diffusion region 5), and applying positive potential to the drain D ($n^+$ diffusion region 7) and control gate CG (polysilicon film PS3), electrons travel from the source S ($n^+$ diffusion region 5) toward the drain D ($n^+$ diffusion region 7), accelerated at the drain depletion layer, and a part of the electrons traverse the coupling oxide layer and enter the floating gate FG. Thus, the floating gate FG is charged negatively, and is written to.

Next, the reading actions will be described. The floating gate FG is negatively charged at cells which have been written to, so the threshold voltages as viewed form the control gate is at a higher value than the cells which have not been written to. Accordingly, even in the event of applying a reading voltage lower than this threshold value to the control gate of a cell which has been written to, no current flows to this cell, and accordingly the fact that this cell has been written to can be determined.

Next, the erasing operations will be described. Erasing is performed by applying a positive potential to the control gate CG (polysilicon film PS3), and drawing the electrons which have traveled to the floating gate FG to the control gate CG (polysilicon film PS3) via the tunneling oxide film (high-temperature oxide film HTO3).

With the present embodiment, arsenic (AS) ions are implanted in the opening 2 in the step shown in FIG. 8. Accordingly, an arsenic implanted region 11 is formed in the polysilicon film PS1. Generally, the conditions of ion injection can be controlled to a high degree of precision, so the shape of the arsenic implanted region 11, i.e., the spatial concentration profile of the arsenic in the polysilicon film PS1, has extremely high reproducibility. Oxidizing the silicon in the step shown in FIG. 9 accelerates the oxidization reaction at the regions of the polysilicon film PS1 where the arsenic is present, so the shape of the oxide film OX1 reflects the arsenic concentration distribution, and has high reproducibility. In the step shown in FIG. 10A and FIG. 10B, removing the oxide film OX1 forms a recess 3 in the polysilicon film PS1, so the reproducibility of the shape of the recess 3 is extremely high. Accordingly, the reproducibility of the shape of the floating gate FG formed in the step shown in FIGS. 17A and 17B is also high, so the shape of the floating gate FG is uniform from one cell to another. Consequently, the erasing properties from one cell to another can be made uniform.

Figure 1A:
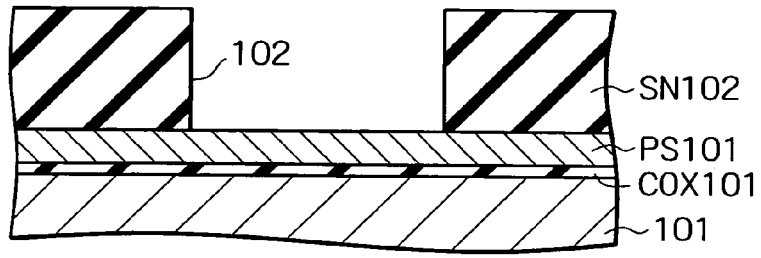
FIGS. 1A through 1D are cross-sectional views illustrating a conventional method for manufacturing flash memory, in order of the steps.
Figure 1B:
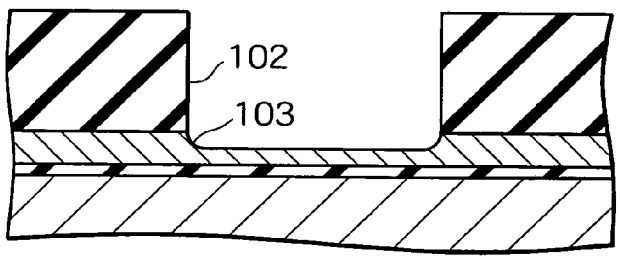
Figure 1C:
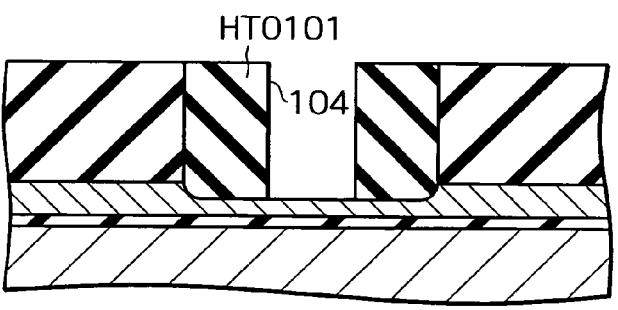
Figure 1D:
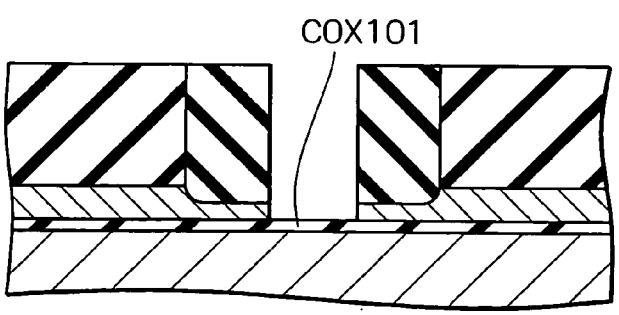
Figure 2A:
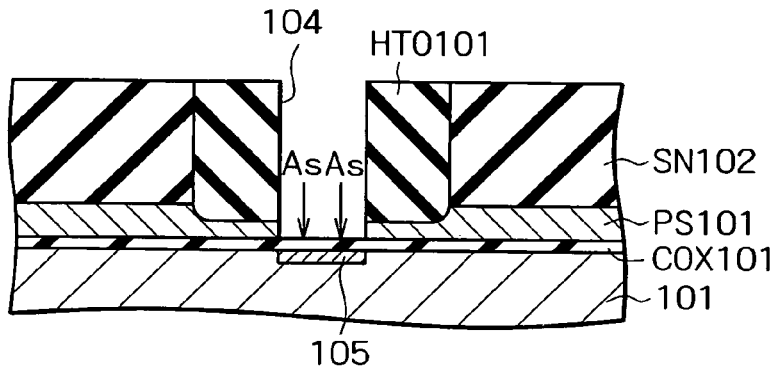
FIGS. 2A through 2D are cross-sectional views illustrating a conventional method for manufacturing flash memory, showing the steps following that in FIG. 1D.
Figure 2B:
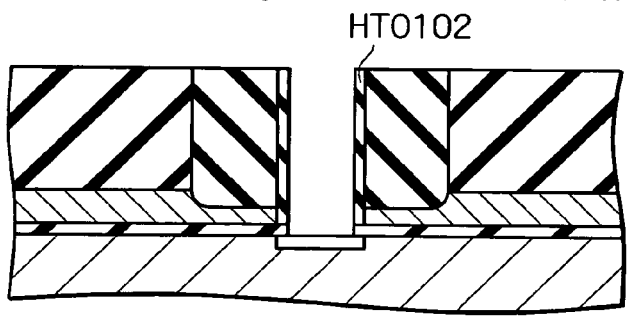
Figure 2C:
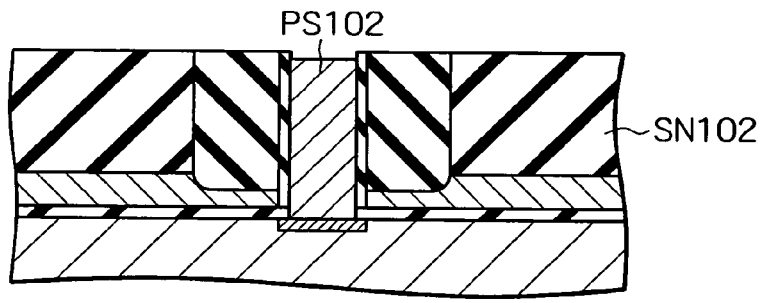
Figure 2D:
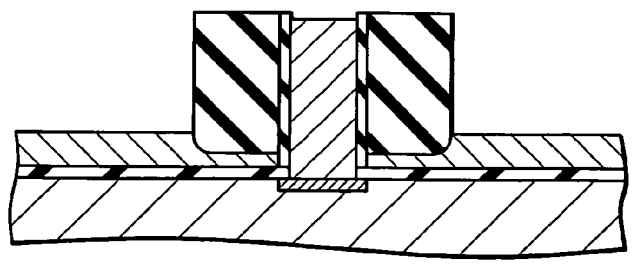
Figure 3A:
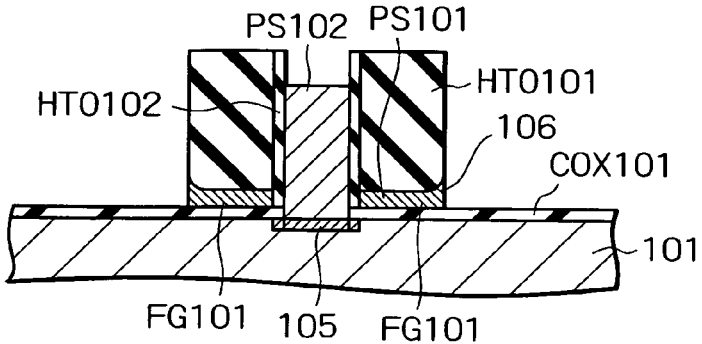
FIGS. 3A through 3D are cross-sectional views illustrating a conventional method for manufacturing flash memory, showing the steps following that in FIG. 2D.
Figure 3B:
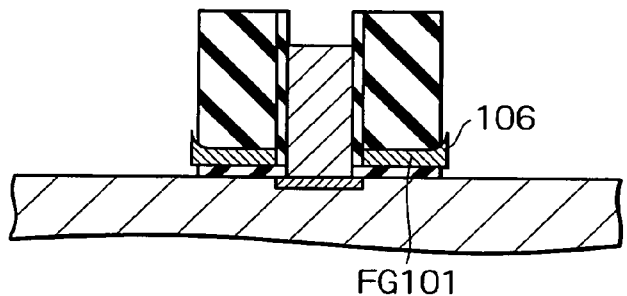
Figure 3C:
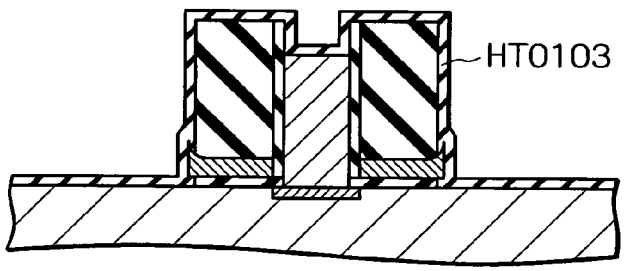
Figure 3D:
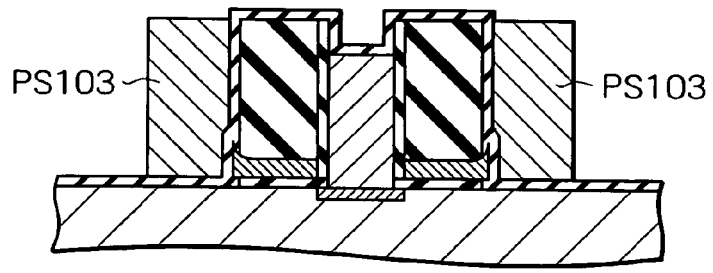
Figure 4:
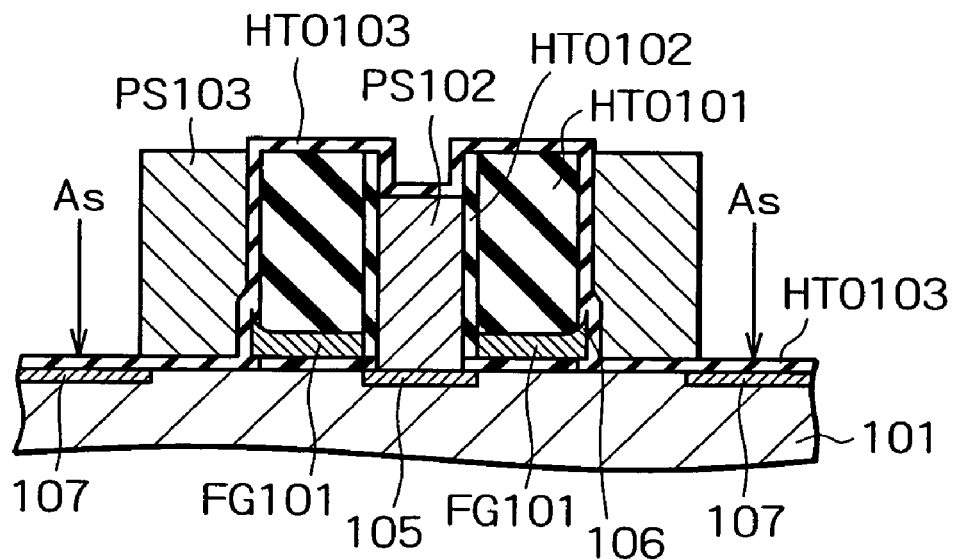
FIG. 4 is a cross-sectional view illustrating a conventional method for manufacturing flash memory, showing the step following that in FIG. 3D.

In comparison, with the conventional art shown in FIGS. 1A through 4, as shown in FIG. 1B, the recess 103 is formed in the polysilicon film PS101 using over-etching at the time of dry etching the silicon nitride film SN102, so the reproducibility of the shape of the recess 103 is low, and accordingly, the reproducibility of the shape of the floating gate FG101 is also low, meaning that the erasing properties are not uniform from one cell to another.

Also, with the present embodiment, arsenic (AS) ions are implanted in the step shown in FIG. 8, so the polysilicon film PS1 can be made to be partially amorphous. Accordingly, in the oxidization step shown in FIG. 9, the oxidizing speed is no longer dependent on the crystalline plane orientation of the polysilicon, and the shape of the oxide film OX1 and the recess 3 are unaffected by crystal grains. Thus, the shape of the recess 3 can be made to be even more uniform.

Further, with the present embodiment, the sharp ridge 6 is formed on the floating gate FG, so the field intensity within the tunneling oxide film (high-temperature oxide film HTO3) is high, and electrons can be efficiently drawn to the control gate CG (polysilicon film PS3) from the sharp ridge 6 at the time of erasing. Thus, the erasing speed can be improved.

Note that a film formed of amorphous silicon may be formed in the step shown in FIG. 5 instead of the polysilicon film PS1. Accordingly, the shape of the exposed face of the amorphous silicon film within the opening 2 is unaffected by the silicon crystals at the time of dry etching the silicon nitride film SN2 in the step shown in FIGS. 7A and 7B, so the exposed face can be made to be smooth. Also, in the oxidization step shown in FIG. 9, the effects of the silicon crystal can be reduced even further. Note that this holds true in the later-described other embodiments as well.

Modification

Figure 24A:
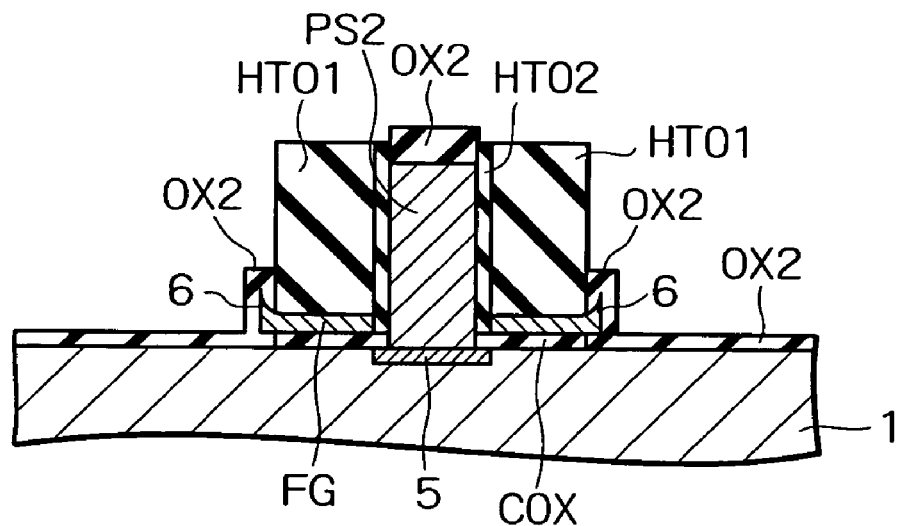
FIG. 24A is a cross-sectional view illustrating a method for manufacturing flash memory according to a modification of the first embodiment.
Figure 24B:
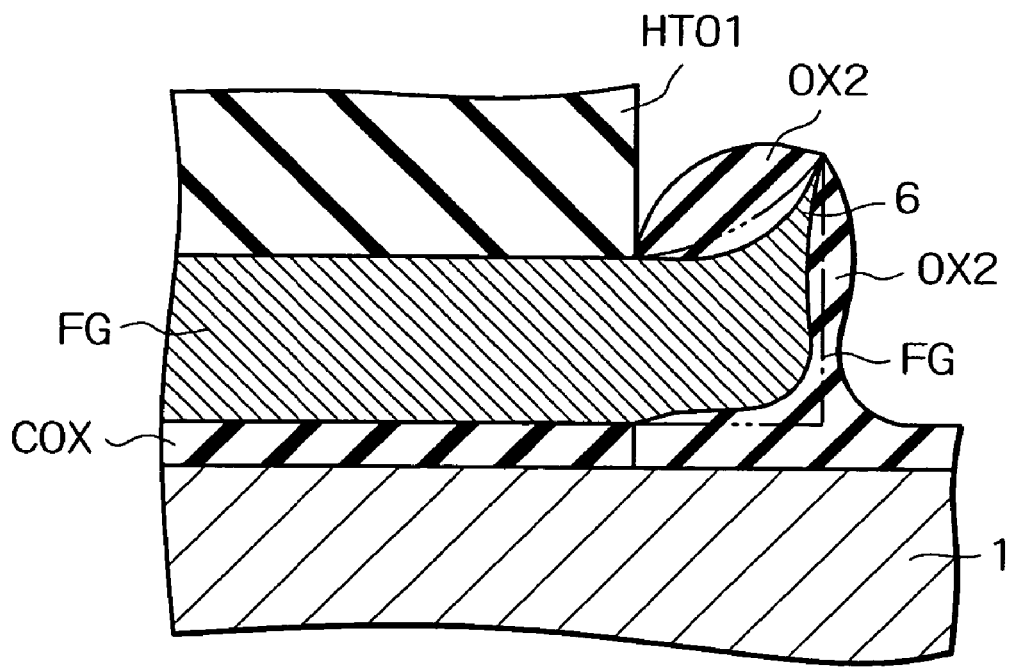
FIG. 24B is a partial enlarged cross-sectional view of that shown in FIG. 24A.

Next, a modification of the present invention will be described. FIG. 24A is a cross-sectional view illustrating a method for manufacturing flash memory according to a modification of the present embodiment, and FIG. 24B is a partial enlarged cross-sectional view thereof. First, the structure shown in FIG. 18 is manufactured by the same method as with the above-described first embodiment, i.e., by the steps illustrated in FIGS. 5 through 17B. In this structure, the end of the floating gate FG is exposed from the high-temperature oxide film HTO1.

Next, as shown in FIG. 24A, this structure is subjected to thermal oxidization processing, thereby forming an thermal oxidization film OX2 on the floating gate FG and the exposed surface of the silicon substrate 1, to an average thickness of, for example, 10 to 15 nm. This thermal oxidization film OX2 becomes the tunneling oxide film. Note that the exposed surface of the polysilicon film PS2 is also partially oxidized at this time.

In this oxidizing process, as shown in FIG. 24B, the thermal oxidization film OX2 can be shaped such that the shape of the sharp ridge 6 of the floating gate FG is formed even sharper, and the bottom rounder, by adjusting the oxidization conditions. In FIG. 24B, the broken line indicates the shape of the floating gate FG prior to this oxidization processing.

Subsequently, the flash memory is manufactured by steps the same as those illustrated in FIGS. 20A through 22B. Manufacturing steps of the modification not mentioned here are the same as those of the first embodiment.

With this modification, the shape of the sharp ridge 6 of the floating gate FG can be formed even sharper in comparison with the above-described first embodiment, thereby further improving the erasing speed of the flash memory. Also, while there are cases in the aforementioned first embodiment wherein electrons leak from the corner portions of the bottom of the floating gate FG to the control gate at the time of erasing memory, causing irregularities in erasing properties, with the present modification, the shape of the bottom of the floating gate FG is rounded, thereby preventing leaking of electrons from the bottom, and making the erasing properties of the flash memory even more uniform. Other advantages of the present modification not mentioned here are the same as those of the first embodiment. Note that the present modification can be applied to the later-described other embodiments, as well.

Second Embodiment

Figure 25A:
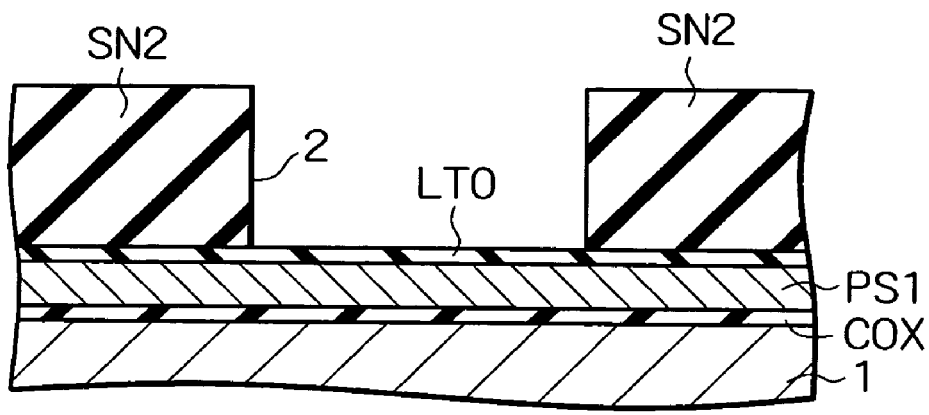
FIGS. 25A through 25C are cross-sectional diagrams illustrating a method for manufacturing flash memory according to a second embodiment of the present invention, in order of the steps.
Figure 25B:
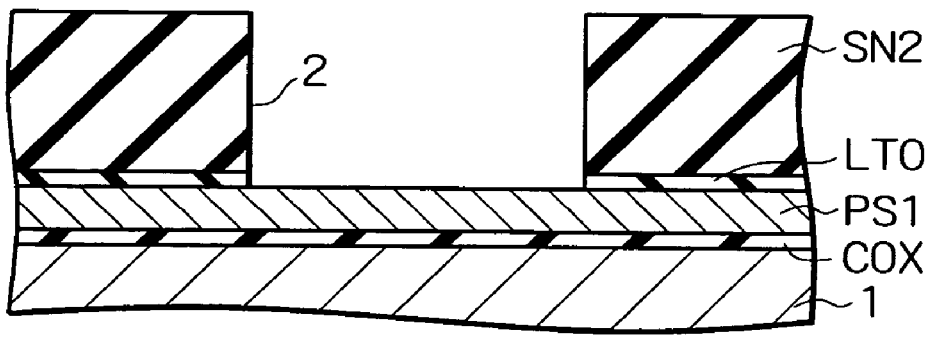
Figure 25C:
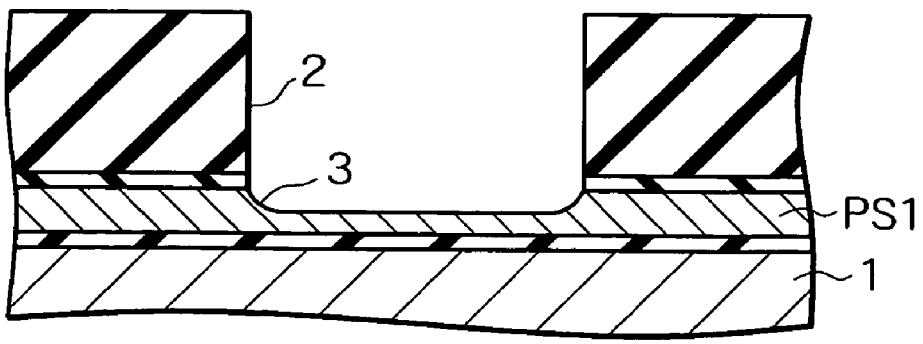

Next, a second embodiment of the present invention will be described. FIGS. 25A through 25C are cross-sectional diagrams illustrating a method for manufacturing flash memory according to the second embodiment of the present invention, in order of the steps. First, as shown in FIG. 25A, a coupling oxide film COX is formed by thermal oxidization on the silicon substrate 1, and a polysilicon film PS1 is formed. Note that an amorphous silicon film may be formed instead of the polysilicon film PS1, as with the first embodiment. Subsequently, a low-temperature oxide film LTO is deposited on the polysilicon film PS1, to a thickness of 10 nm, for example. The low-temperature oxide film LTO is formed by CVD at a growth temperature of 500 to 700° C., for example.

Next, a silicon nitride film SN1 (see FIG. 5) is formed on the low-temperature oxide film LTO to a thickness of 30 to 50 nm, for example. Next, a resist (not shown) is formed on the silicon nitride film SN1 and patterned, and with this resist as a mask, the silicon nitride film SN1, the polysilicon film PS1, coupling oxide film COX, and the surface portion of the silicon substrate 1 are selectively removed by etching, and element separating regions STI (see FIG. 6B) are formed in the removed portion. Subsequently, the silicon nitride film SN1 is removed.

Next, a silicon nitride film SN2 is formed on the low-temperature oxide film LTO and element separating regions STI, to a thickness of 350 nm, for example. A resist (not shown) is formed on the silicon nitride film SN2, and patterning is performed. The silicon nitride film SN2 is selectively removed by dry etching, using the patterned resist as a mask. At the time of dry etching of the silicon nitride film SN2, conditions are selected such that a sufficient selection ratio can be maintained with the low-temperature oxide film LTO. Thus, the low-temperature oxide film LTO can be used as an etching stopper film, so there is no over-etching of the low-temperature oxide film LTO and the polysilicon film PS1.

Next, as shown in FIG. 25B, the low-temperature oxide film LTO is removed by dry etching or wet etching. At the time of dry etching of the low-temperature oxide film LTO, conditions are selected such that a sufficient selection ratio can be maintained with the polysilicon film PS1. Thus, over-etching of the polysilicon film PS1 can be suppressed.

Next, as shown in FIG. 25C, the polysilicon film PS1 is dry-etched to form the recess 3. At this time, the etching conditions are such that the silicon can be etched with high precision.

Next, the flash memory is manufactured by the steps illustrated in FIGS. 7 through 21 according to the first embodiment. Manufacturing steps of the present embodiment not mentioned here are the same as those of the first embodiment.

With the present embodiment, a low-temperature oxide film LTO is provided as an etching stopper film for dry etching the silicon nitride film SN2. Dry etching of the silicon nitride film can be performed with sufficient selection ratio as to the silicon oxide film, so there is no over-etching of the low-temperature oxide film LTO and the polysilicon film PS1 at the time of dry etching of the silicon nitride film SN2, and the dry etching of the silicon nitride film SN2 can be completely stopped at the surface of the low-temperature oxide film LTO. Subsequently, the low-temperature oxide film LTO is removed, and the polysilicon film PS1 is dry-etched under conditions suitable for etching silicon, whereby the starting position of this dry etching can be made more uniform, and accordingly, the shape of the recess 3 can be controlled with higher precision. Thus, the shape of the floating gate FG can be made uniform, and the erasing properties can be made uniform from one cell to another.

Also, with the present embodiment, the low-temperature oxide film LTO is formed in a relatively low atmosphere, 500 to 700° C. for example, so even in the event that an amorphous silicon film is formed instead of the polysilicon film PS1, the amorphous silicon film does not crystallize. Forming an amorphous silicon film instead of the polysilicon film PS1 allows the shape of the recess 3 to be controlled with even higher precision in the dry etching step shown in FIG. 25C, due to the etching speed being unaffected by silicon crystals.

Further, with the present embodiment, the floating gate FG has a sharp ridge 6 formed as with the first embodiment, so the field intensity within the tunneling oxide film (high-temperature oxide film HTO3) is high, and electrons can be efficiently drawn to the control gate CG (polysilicon film PS3) from the sharp ridge 6 at the time of erasing. Thus, the erasing speed can be improved.

Note that in the step shown in FIG. 25C, the polysilicon film PS1 does not need to be etched. In the event that this course is taken, the sharp ridge 6 (see FIG. 21) is not formed on the floating gate FG in the subsequent steps, so the angle at the edge of the floating gate FG is 90°. In the event that the amount of wet etching before formation of the tunneling oxide film (high-temperature oxide film HTO3) is the same, the erasing speed in this case wherein the is sharp ridge 6 is not formed is slower as compared to a case wherein the sharp ridge 6 is formed, but the shape of the floating gate FG is made even more uniform, and irregularities in properties can be markedly reduced. Simulation results have shown that making the amount of wet etching before formation of the tunneling oxide film (high-temperature oxide film HTO3) to be greater than the thickness of the high-temperature oxide film HTO3 enables the field intensity within the high-temperature oxide film HTO3 to be increased.

Third Embodiment

Next, a third embodiment of the present invention will be described. FIGS. 26A through 26D are cross-sectional diagrams illustrating a method for manufacturing flash memory according to the third embodiment of the present invention, in order of the steps. The present embodiment is a combination of the first embodiment and the second embodiment.

Figure 26A:
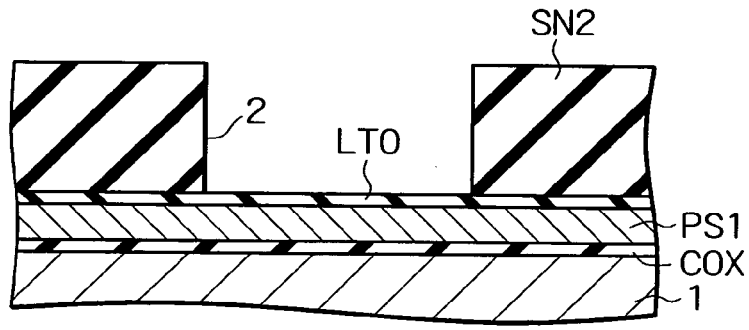
FIGS. 26A through 26D are cross-sectional diagrams illustrating a method for manufacturing flash memory according to a third embodiment of the present invention, in order of the steps.

That is to say, as shown in FIG. 26A, a coupling oxide film COX, a polysilicon film PS1, and a low-temperature oxide film LTO, are formed on the silicon substrate 1, in that order, as with the second embodiment. Next, a silicon nitride film SN1 (see FIG. 5) is formed, and the silicon nitride film SN1, the polysilicon film PS1, the coupling oxide film COX, and the surface portion of the silicon substrate 1 are selectively removed by etching, element separating regions STI (see FIG. 6B) are formed, following which the silicon nitride film SN1 is removed. Next, a silicon nitride film SN2 is formed on the low-temperature oxide film LTO and element separating regions STI, and then selectively removed by dry etching, to form the opening 2. Here, the low-temperature oxide film LTO is used as an etching stopper film, so the dry etching of the silicon nitride film SN2 stops at the point that the surface of the low-temperature oxide film LTO is exposed.

Figure 26B:
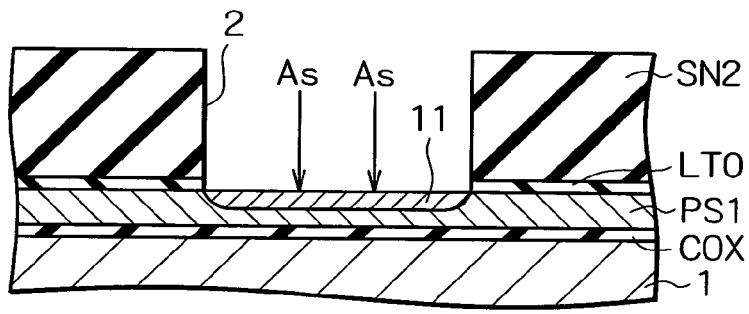

Next, as shown in FIG. 26B, the low-temperature oxide film LTO is removed by dry etching or wet etching. Next, arsenic (As) ions are implanted in the opening 2. Accordingly, an arsenic implanted region 11 is formed in the region making up the bottom of the opening 2 and the adjacent region, in the polysilicon film PS1.

Figure 26C:
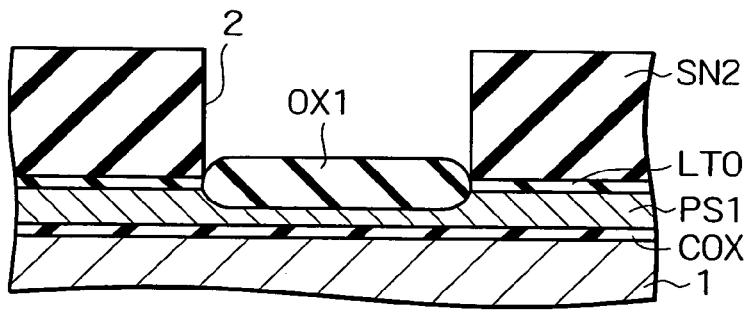

Next, as shown in FIG. 26C, the substrate being worked is kept at a temperature of 850° C. for example, for around 30 minutes, so as to oxidize the exposed surface of the silicon. This oxidizes the polysilicon film PS1 at the bottom of the opening 2, forming an oxide film OX1. Now, the rate of oxidization is proportionate to the concentration of arsenic, so the oxidization reaction is accelerated at the arsenic implanted region 11 as compared to the other regions of the polysilicon film PS1, and the shape of the oxide film OX1 reflects the concentration distribution of the implanted arsenic.

Figure 26D:
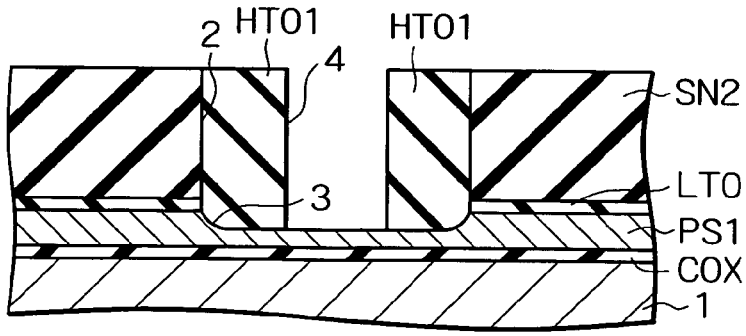

Next, as shown in FIG. 26D, wet etching is performed to remove the oxide film OX1. This forms a bowl-shaped recess 3 at the region corresponding to the bottom of the opening 2 in the polysilicon film PS1. Then, high-temperature oxide film HTO1 is deposited and etched back, so as to form side walls of high-temperature oxide film HTO1 on the inner face of the opening 2. This reduces the inner diameter of the opening 2, forming the opening 4. Subsequently, the flash memory is manufactured by the steps illustrated in FIGS. 12A through 22B. Manufacturing steps of the present embodiment not mentioned here are the same as those of the first embodiment.

With the present embodiment, arsenic (As) ions are implanted in the opening 2 in the step shown in FIG. 26B. Accordingly, an arsenic implanted region 11 is formed in the polysilicon film PS1. As described with the first embodiment, the shape of the arsenic implanted region 11 has extremely high reproducibility, so the reproducibility of the recess 3 is also high, as well as the shape of the floating gate FG (see FIG. 21) having high reproducibility, so the shape of the floating gate FG is uniform from one cell to another. Also, the arsenic injection enables partial amorphousizing of the polysilicon film PS1. Thus, in the oxidization step shown in FIG. 26C, the oxidizing speed is no longer dependent on the crystalline plane orientation, and the shape of the oxide film OX1 and the recess 3 are unaffected by crystal grains. Thus, the shape of the recess 3 can be made to be even more uniform. Other advantages of the present embodiment not mentioned here are the same as those of the second embodiment.

Fourth Embodiment

Figure 27A:
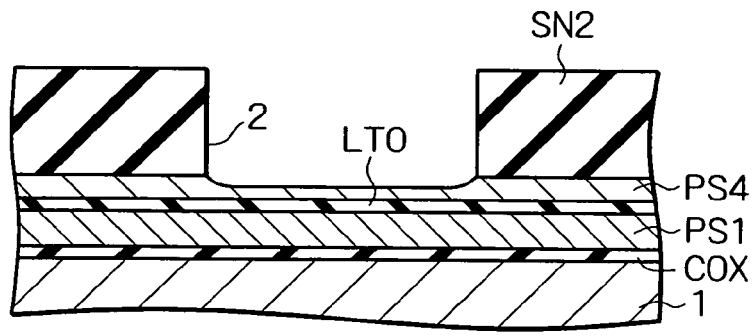
FIGS. 27A through 27D are cross-sectional diagrams illustrating a method for manufacturing flash memory according to a fourth embodiment of the present invention, in order of the steps.

Next, a fourth embodiment of the present invention will be described. FIGS. 27A through 27D are cross-sectional diagrams illustrating a method for manufacturing flash memory according to the fourth embodiment of the present invention, in order of the steps. As shown in FIG. 27A, a coupling oxide film COX, a polysilicon film PS1, and a low-temperature oxide film LTO, are formed on the silicon substrate 1, in that order. Next, a polysilicon film PS4 is formed on the entire face of the low-temperature oxide film LTO, to a thickness of 30 to 50 nm, for example.

Subsequently, element separating regions STI (see FIG. 6B) are formed in the same way as with the above-described first embodiment. Next, a silicon nitride film SN2 is formed on the polysilicon film PS4 and element separating regions STI, and then selectively removed by dry etching, to form the opening 2. Now, the dry etching of the silicon nitride film SN2 is unavoidably over-etched, and stops partway through the polysilicon film PS4.

Figure 27B:
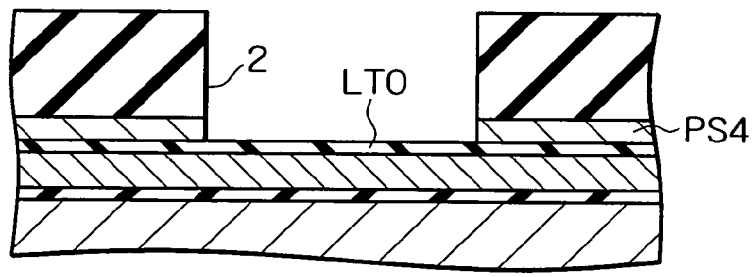

Next, as shown in FIG. 27B, the polysilicon film PS4 is subjected to dry etching, and the portion of the polysilicon film PS4 exposed at the opening 2 is selectively removed. At this time, a high selection ratio can be obtained between the polysilicon film PS4 and the low-temperature oxide film LTO, so the etching of the polysilicon film PS4 can be stopped at high precision at the point that the low-temperature oxide film LTO is exposed, with the low-temperature oxide film LTO serving as an etching stopper film.

Figure 27C:
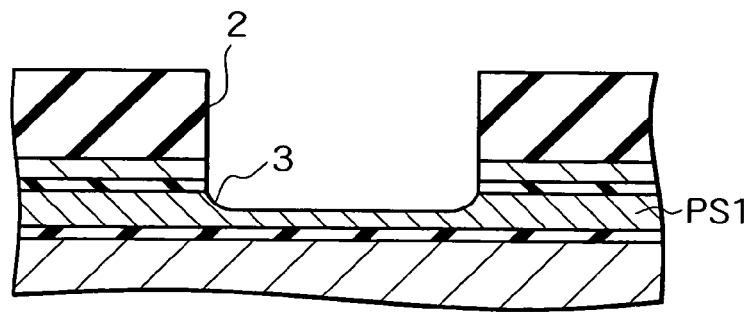

Next, as shown in FIG. 27C, the low-temperature oxide film LTO is removed by dry etching or wet etching. Next, the polysilicon film PS1 is dry-etched to form the recess 3 at the bottom of the opening 2. At this time, the etching conditions are such that the silicon can be etched with high precision.

Figure 27D:
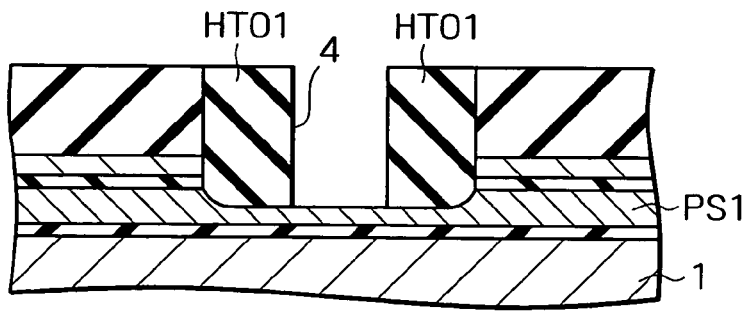

Next, as shown in FIG. 27D, side walls formed of high-temperature oxide film HTO1 are formed on the inner face of the opening 2. Subsequently, the flash memory is manufactured by the steps illustrated in FIGS. 12A through 22B. Manufacturing steps of the present embodiment not mentioned here are the same as those of the second embodiment.

With the present embodiment, at the time of dry etching the silicon nitride film SN2 shown in FIG. 27A, the polysilicon film PS4 is unavoidably over-etched, and the degree of over-etching differs from one cell to another. However, generally, in the event of dry etching-silicon, a sufficient selection ratio can be realized between silicon oxides. Accordingly, in the step shown in FIG. 27B, the low-temperature oxide film LTO can be made to function as an etching stopper film at the time of dry etching the polysilicon film PS4, thereby stopping the dry etching of the polysilicon film PS4 at high precision at the surface of the low-temperature oxide film LTO. Accordingly, the irregularities in over-etching of the polysilicon film PS4 can be negated. Consequently, at the time of dry etching the polysilicon film PS1 to form the recess 3, the starting position of the dry etching can be made more uniform than that with a case wherein the polysilicon film PS4 is not provided, and accordingly, the shape of the recess 3 can be readily made uniform with higher precision. Manufacturing steps of the present embodiment not mentioned here are the same as those of the second embodiment.

Fifth Embodiment

Next, a fifth embodiment of the present invention will be described. FIGS. 28A through 28D, 29A through 29D, 30A through 30D, 31A through 31D, and 32A through 32C, are cross-sectional diagrams illustrating the method of manufacturing the flash memory according to the present embodiment, in order of the steps.

Figure 28A:
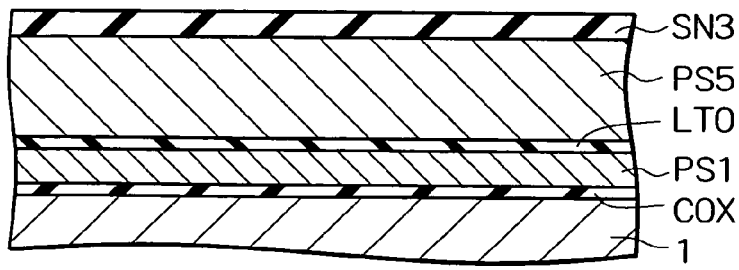
FIGS. 28A through 28D are cross-sectional diagrams illustrating a method for manufacturing flash memory according to a fifth embodiment of the present invention, in order of the steps.

First, as shown in FIG. 28A, a coupling oxide film COX is formed by thermal oxidization on a silicon substrate 1 to a thickness of 10 nm, for example, and a polysilicon film PS1 is formed to a thickness of 80 to 100 nm, for example. An amorphous silicon film may be formed instead of the polysilicon film PS1, as with the above-described first embodiment. Subsequently, a low-temperature oxide film LTO is formed to a thickness of 10 nm, for example.

Next, a silicon nitride film SN1 (see FIG. 5) is formed on the low-temperature oxide film LTO to a thickness of 30 to 50 nm, for example. A resist (not shown) is formed on the silicon nitride film SN1 and patterned, and with this resist as a mask, the silicon nitride film SN1 (see FIG. 5), polysilicon film PS1, coupling oxide film COX, and surface portion of the silicon substrate 1, are etched and selectively removed, and element separating regions STI (see FIG. 6B) are formed in the removed portion. Subsequently, the silicon nitride film SN1 is removed.

Next, a polysilicon film PS5 is formed on the entire face of the low-temperature oxide film LTO to a thickness of 300 nm for example, and a silicon nitride film SN3 is formed to a thickness of 30 to 50 nm, for example.

Figure 28B:
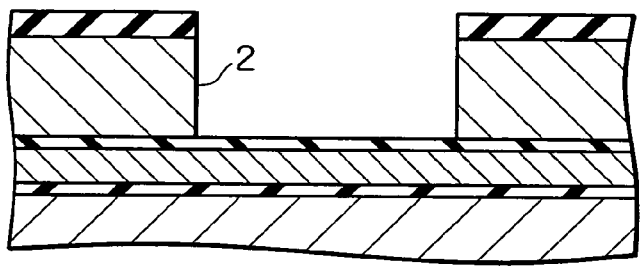

Next, as shown in FIG. 28B, a resist (not shown) is formed on the silicon nitride film SN3 and patterned, and with this resist as a mask, the silicon nitride film SN3 is selectively removed by dry etching. Next, with this resist as a mask, the polysilicon film PS5 is selective removed by dry etching, thereby forming an opening 2. At this time, a sufficient selection ratio can be maintained with the low-temperature oxide film LTO in the dry etching of the polysilicon film PS5, so the low-temperature oxide film LTO can be used as a stopper film, thereby stopping the dry etching with high precision at the surface of the low-temperature oxide film LTO.

Figure 28C:
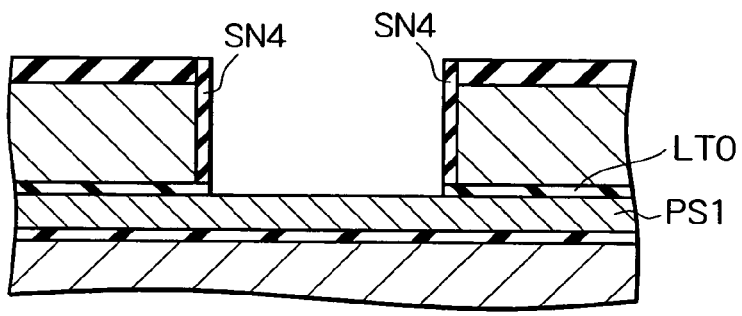

Next, as shown in FIG. 28C, a silicon nitride film SN4 is deposited on the entire face to a thickness of 10 to 20 nm for example, etched back, and a side wall of the silicon nitride film SN4 is formed on the inner side of the opening 2 so as to cover the exposed portion of the polysilicon film PS5. Here, etching back the silicon nitride film SN4 also removes the low-temperature oxide film LTO at the opening 2.

Figure 28D:
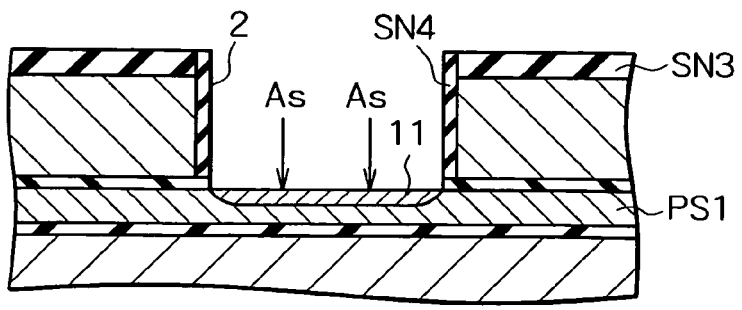

Next, as shown in FIG. 28D, arsenic (As) ions are implanted to the bottom of the opening 2. This doping is performed with a dose amount of $1 \times 10^{14}$ to $3 \times 10^{15}$ cm$^{-2}$, under energy of 20 to 30 keV. This forms an arsenic implanted region 11 at the region corresponding to the bottom of the opening 2 in the polysilicon film PS1. At this arsenic implanted region 11, the polysilicon film PS1 is amorphousized.

Figure 29A:
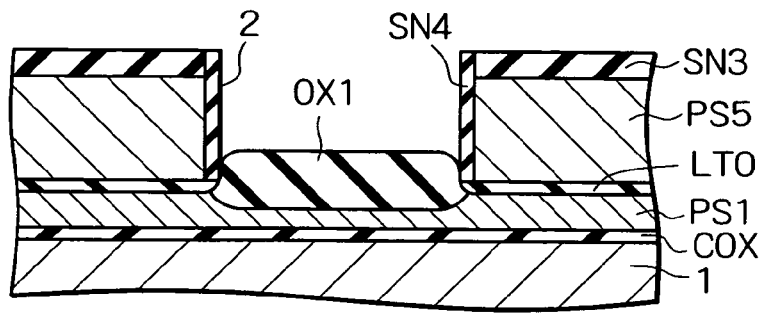
FIGS. 29A through 29D are cross-sectional diagrams illustrating a method for manufacturing flash memory according to the fifth embodiment, in order of the steps, and show the steps following FIG. 28D.

Next, as shown in FIG. 29A, the substrate is kept at a temperature of 850° C. for example, for around 30 minutes, so as to oxidize the exposed surface of the polysilicon film PS1. This oxidizes the polysilicon film PS1 at the bottom of the opening 2, forming an oxide film OX1. Now, the rate of silicon oxidization is proportionate to the concentration of arsenic, so the oxidization reaction is accelerated at the arsenic implanted region 11 as compared to the other regions of the polysilicon film PS1, and consequently the shape of the oxide film OX1 reflects the concentration distribution of the implanted arsenic.

Figure 29B:
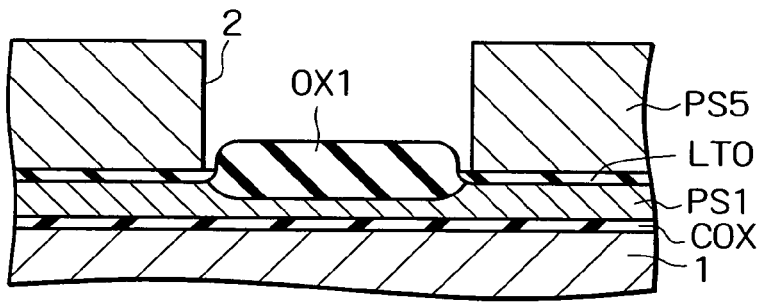

Next, as shown in FIG. 29B, wet etching is performed to remove the silicon nitride films SN3 and SN4.

Figure 29C:
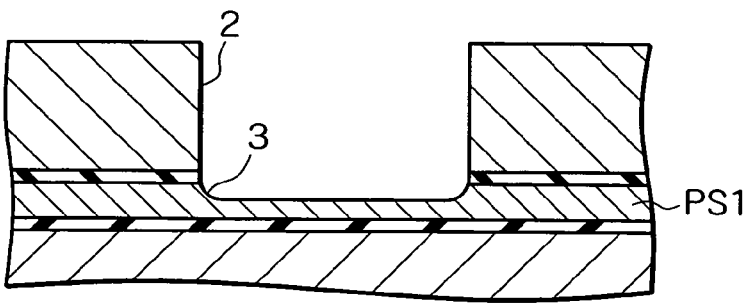

Next, as shown in FIG. 29C, wet etching is performed to remove the oxide film OX1. This forms a bowl-shaped recess 3 at the region corresponding to the bottom of the opening 2 in the polysilicon film PS1.

Figure 29D:
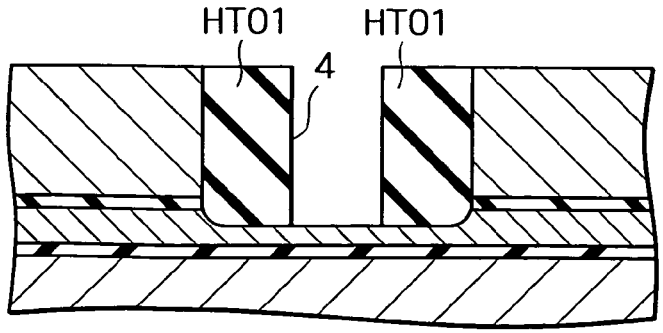

Next, high-temperature oxide film HTO1 is deposited to a thickness of 150 nm for example, as shown in FIG. 29D, and etched back, thereby forming side walls of the high-temperature oxide film HTO1 on the side faces of the opening 2. Thus, the inner diameter of the opening 2 is reduced, forming an opening 4. Note that an arrangement may be made wherein the side faces of the polysilicon film PS1 in the opening 2 are subjected to thermal oxidization, thereby forming a thermal oxide film of thickness around 5 nm for example, before forming the high-temperature oxide film HTO1. This stabilizes the Si/SiO$_2$ interface.

Figure 30A:
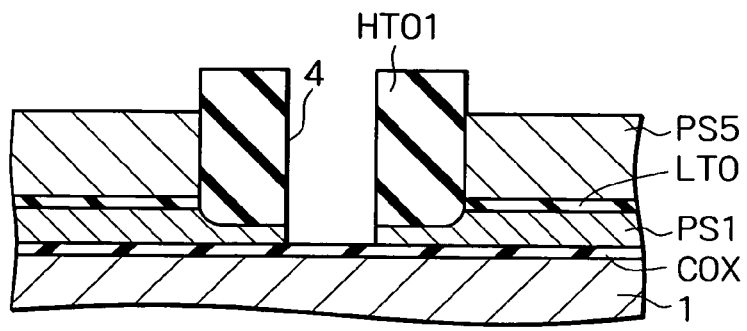
FIGS. 30A through 30D are cross-sectional diagrams illustrating a method for manufacturing flash memory according to the fifth embodiment, in order of the steps, and show the steps following FIG. 29D.

Next, as shown in FIG. 30A, the portion of the polysilicon film PS1 corresponding to the bottom of the opening 2, and the upper portion of the polysilicon film PS5 are removed by dry etching. This exposes the coupling oxide film COX at the bottom of the opening 4. At this time, the surface of the polysilicon film PS5 is also etched, so the upper portion of the side wall formed of the high-temperature oxide film HTO1 protrudes from the surface of the polysilicon film PS5 by an amount around the thickness of the polysilicon film PS1.

Figure 30B:
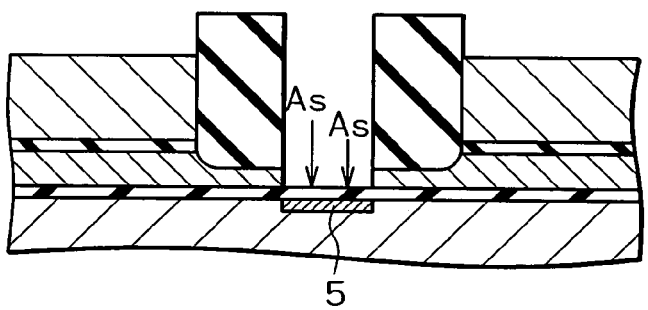

Next, as shown in FIG. 30B, arsenic (As) ions are implanted in the bottom of the opening 4, thereby forming a n$^+$ diffusion region 5 on the silicon substrate 1 which serves as the source.

Figure 30C:
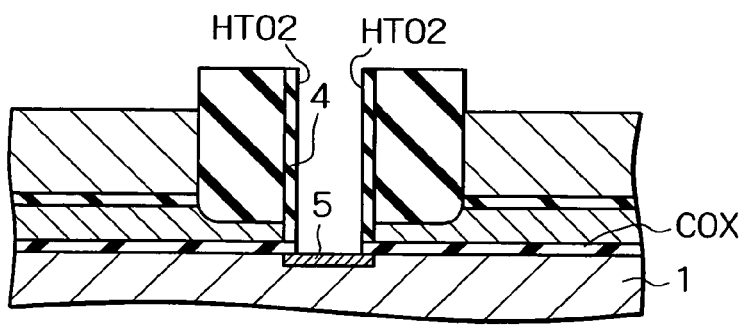

Next, as shown in FIG. 30C, high-temperature oxide film HTO2 is deposited to a thickness of around 20 nm for example, on the entire face, then etched back, thereby forming side walls of the high-temperature oxide film HTO2 on the side faces of the opening 4. The coupling oxide film COX is removed at the bottom of the opening 4 at this time by this etching back, thereby exposing the n$^+$ diffusion region 5 of the silicon substrate 1. Also, an arrangement may be made wherein the side faces of the polysilicon film PS1 in the opening 4 are subjected to thermal oxidization, thereby forming a thermal oxide film of thickness around 5 nm for example, before forming the high-temperature oxide film HTO2. This stabilizes the Si/SiO$_2$ interface. Or, thermal oxidization may be performed in an oxygen atmosphere following formation of the high-temperature oxide film HTO2. Thus, the oxygen in the atmosphere is transmitted through the high-temperature oxide film HTO2 and reaches the high-temperature oxide film HTO2 and polysilicon film PS1 interface, forming an oxide layer on the surface of the polysilicon film PS1. This stabilizes the Si/SiO$_2$ interface.

Figure 30D:
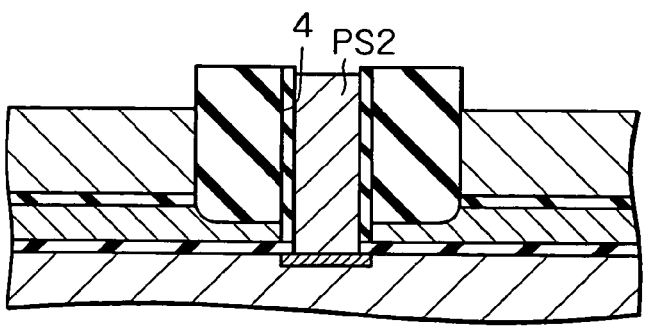

Next, as shown in FIG. 30D, a polysilicon film PS2 is deposited on the entire face, and subsequently etched back, thereby filling in the interior of the opening 4 with the polysilicon film PS2. This forms a source plug connected to the n$^+$ diffusion region 5 which is the source. Note that at this time, the impurity concentration of the polysilicon film PS2 is made to be higher than the impurity concentration of the polysilicon film PS5.

Figure 31A:
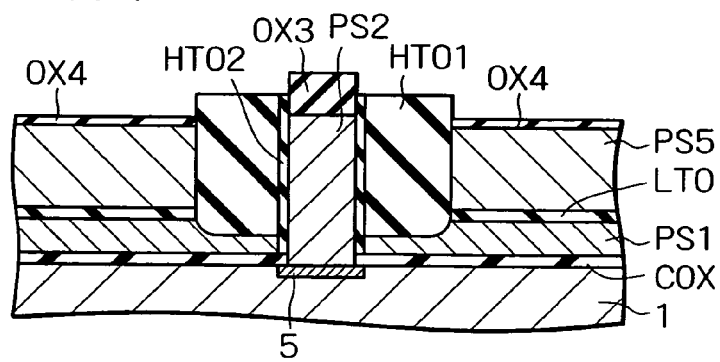
FIGS. 31A through 31D are cross-sectional diagrams illustrating a method for manufacturing flash memory according to the fifth embodiment, in order of the steps, and show the steps following FIG. 30D.

Next, as shown in FIG. 31A, the polysilicon films PS2 and PS5 are oxidized. At this time, the impurity concentration of the polysilicon film PS2 is higher than the impurity concentration of the polysilicon film PS5, so the polysilicon film PS2 oxidizes faster than the polysilicon film PS5. Accordingly, an oxide film OX3 of 40 to 50 nm in thickness for example, is formed on top of the polysilicon film PS2, and an oxide film OX4 of 10 nm in thickness for example, is formed on top of the polysilicon film PS5.

Figure 31B:
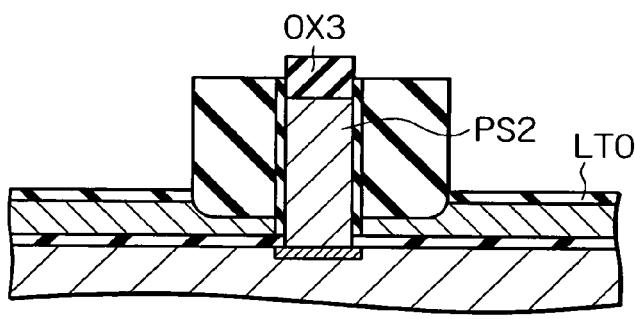

Next, as shown in FIG. 31B, the oxide film OX4 is removed by dry etching, and the polysilicon film PS5 is removed by dry etching. At this time, the oxide film OX3 is thicker than the oxide film OX4, and accordingly is not completely removed by the dry etching but remains, thereby protecting the source plug formed of the polysilicon PS2.

Figure 31C:
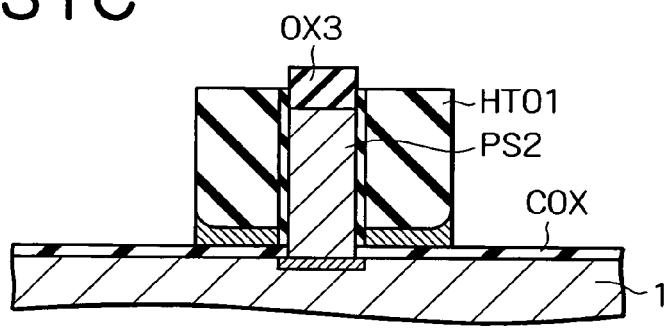

Next, as shown in FIG. 31C, the low-temperature oxide film LTO is removed by dry etching, and the exposed portion of the polysilicon film PS1 is selectively removed by dry etching. The portion of the polysilicon film PS1 directly below the high-temperature oxide film HTO1 is not removed, and remains. This remaining polysilicon film PS1 becomes the floating gate FG.

Figure 31D:
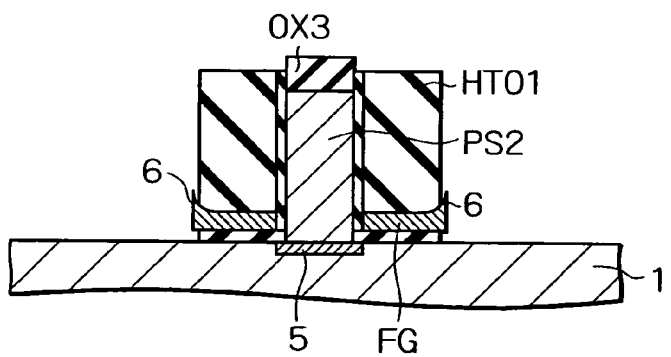

Next, as shown in FIG. 31D, wet etching is performed to remove the exposed portion of the coupling oxide film COX. At this time, the high-temperature oxide film HTO1 is also etched, and the width thereof is reduced. Consequently, the sharp ridge 6 of the floating gate FG is exposed. Note that at this time, as illustrated in the modification of the first embodiment, the exposed portion of the floating gate FG may be subjected to thermal oxidization, so as to make the shape of the sharp ridge 6 even sharper, and to also make the shape of the bottom of the floating gate FG rounder.

Figure 32A:
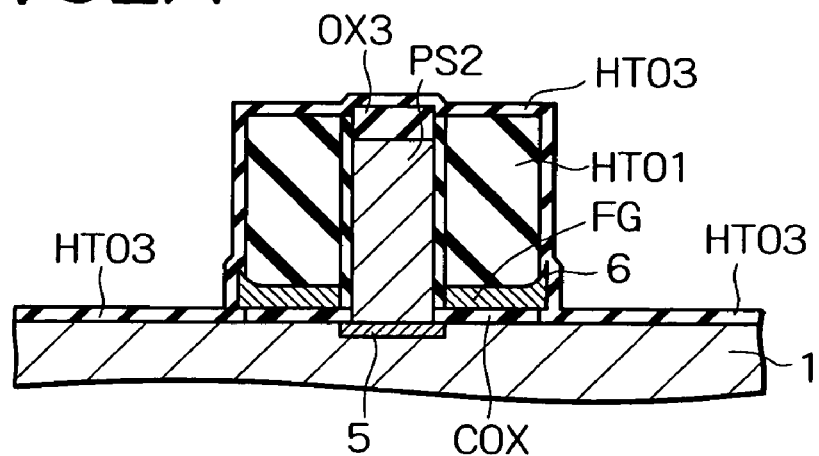
FIGS. 32A through 32C are cross-sectional diagrams illustrating a method for manufacturing flash memory according to the fifth embodiment, in order of the steps, and show the steps following FIG. 31D.

Next, as shown in FIG. 32A, a high-temperature oxide film HTO3 is formed on the entire face to a thickness of 10 to 15 nm, for example. Next, annealing is performed in an $O_2$ atmosphere. As a result, the sharp ridge 6 of the floating gate FG is also covered with the high-temperature oxide film HTO3. This high-temperature oxide film HTO3 forms a tunneling oxide layer. Note that an arrangement may be made wherein, prior to forming the high-temperature oxide film HTO3, the exposed surfaces of the floating gate FG are subjected to thermal oxidization, so as to form a thermal oxidization film of around 5 nm in thickness, for example. This stabilizes the $Si/SiO_2$ interface. Or, thermal oxidization may be performed in an oxygen atmosphere following formation of the high-temperature oxide film HTO3. Thus, the oxygen in the atmosphere is transmitted through the high-temperature oxide film HTO3 and reaches the high-temperature oxide film HTO3 and floating gate FG interface, forming an oxide layer on the surface of the floating gate FG. This stabilizes the $Si/SiO_2$ interface.

Figure 32B:
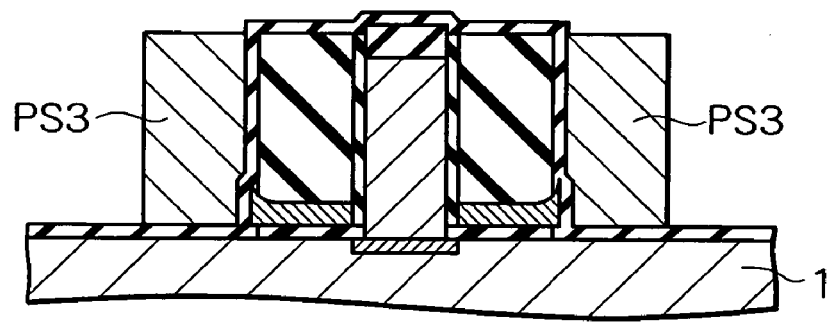

Next, as shown in FIG. 32B, a polysilicon film PS3 is formed on the entire face to a thickness of 150 nm for example, which is then etched back, thereby forming a side wall formed of the polysilicon film PS3 on the side portion of the side wall of the high-temperature oxide film HTO1, with the high-temperature oxide film HTO3 therebetween. This side wall is the control gate, serving as the word line.

Figure 32C:
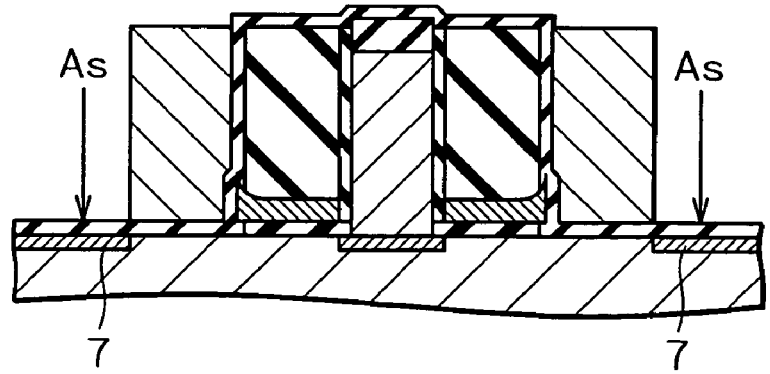

Next, as shown in FIG. 32C, arsenic (As) ions are implanted on the surface of the silicon substrate 1 between the polysilicon films PS3, thereby forming a n$^+$ diffusion region 7. This n$^+$ diffusion region 7 becomes the drain, serving as the bit line.

Subsequently, the flash memory is manufactured by the steps illustrated in FIGS. 22A and 22B. Thus, the flash memory according to the present embodiment is completed. Manufacturing steps of the present embodiment not mentioned here are the same as those of the third embodiment.

With the present embodiment, in the step illustrated in FIG. 28A, a two-layered film of a polysilicon film PS5 300 nm in thickness for example, and a silicon nitride film SN3 30 to 50 nm in thickness for example, is provided instead of the silicon nitride film SN2 which is 350 nm in thickness for example, in the above-described first embodiment.

With the above-described first embodiment, in the step illustrated in FIGS. 16A and 16B, the silicon nitride film SN2 is removed by wet etching. The reason is that sufficient selection ratio with the high-temperature oxide film HTO1 cannot be obtained in the event of attempting to remove the silicon nitride film SN2 by dry etching. However, wet etching is slow, generally around 50 nm/hour. Accordingly, removing the silicon nitride film SN2 which has a thickness of 350 nm for example thereby requires several hours for the processing time leading to the problem of long hours required for the process.

Conversely, with the present embodiment, the two-layered film of the polysilicon film PS5 and the silicon nitride film SN3 is provided instead of the silicon nitride film SN2, so the polysilicon film PS4 can be removed by dry etching, thereby speeding up the process time.

Also, the dry etching of the polysilicon film PS5 can be stopped with high precision at the surface of the low-temperature oxide film LTO, so the polysilicon film PS1 is never over-etched. Accordingly, the shape of the oxide film X1 formed in the step illustrated in FIG. 29A can be stabilized. Thus, in the step illustrated in FIG. 29C, the shape of the recess 3 can be stabilized, and in the step illustrated in FIG. 31C, the shape of the floating gate FG can be stabilized.

Further, with the present embodiment, in the step illustrated in FIG. 28C, a side wall formed of a silicon nitride film SN4 is formed so as to cover the exposed portions of the polysilicon film PS5. Accordingly, in the step shown in FIG. 29A, the polysilicon PS5 can be protected so as to not be oxidized at the time of oxidizing the silicon.

Also, in the step Shown in FIG. 30D, the impurity concentration of the polysilicon film PS2 is higher than the impurity concentration of the polysilicon film PS5, so the oxide film OX3 formed on the polysilicon film PS2 is thicker than the oxide film OX4 formed on the polysilicon film PS5 in the step shown in FIG. 31A. Consequently, at the time of removing the oxide film OX4 and the polysilicon film PS5 by dry etching in the step shown in FIG. 31B, the oxide film OX3 is not completely removed but remains, thereby protecting the source plug formed of the polysilicon film PS2. Other advantages of the present embodiment are the same as those of the third embodiment.

Note that with the present embodiment, while arsenic ions are implanted in the step illustrated in FIG. 28D to form an arsenic implanted region 11, the ion injection may be omitted.

Sixth Embodiment

Next, a sixth embodiment of the present invention will be described. FIGS. 33A through 33D, 34A through 34D, and 35A through 35D, are cross-sectional diagrams illustrating the method of manufacturing the flash memory according to the present embodiment, in order of the steps.

First, the steps illustrated in FIGS. 28A through 29C according to the fifth embodiment are carried out, so as to manufacture a structure such as shown in FIG. 29, i.e., a structure wherein the coupling oxide film COX, the polysilicon film PS1, the low-temperature oxide film LTO, and the polysilicon film PS5, are layered on the silicon substrate 1, with the opening 2 formed in the polysilicon film PS5 and the low-temperature oxide film LTO, and the recess 3 formed at the bottom of the opening 2 in the polysilicon film PS1.

Figure 33A:
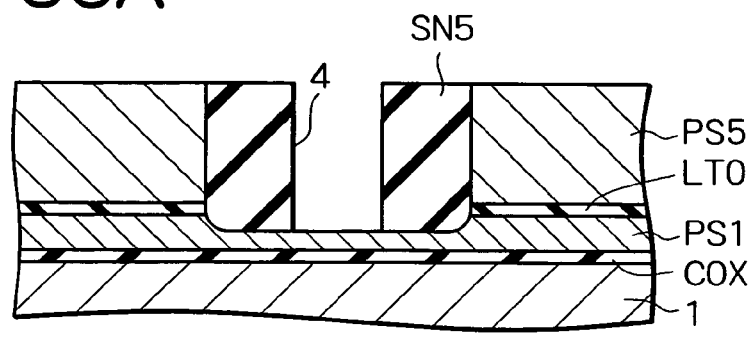
FIGS. 33A through 33D are cross-sectional diagrams illustrating a method for manufacturing flash memory according to a sixth embodiment of the present invention, in order of the steps.

Next, as shown in FIG. 33A, a silicon nitride film SN5 is deposited to a thickness of 150 nm for example, and etched back, thereby forming side walls of the silicon nitride film SN5 on the side faces of the opening 2. Thus, the inner diameter of the opening 2 is reduced, forming an opening 4. Note that an arrangement may be made wherein the side faces of the polysilicon film PS1 in the opening 2 are subjected to thermal oxidization, thereby forming a thermal oxide film of thickness around 5 nm for example, before forming the silicon nitride film SN5. This stabilizes the Si/SiO$_2$ interface.

Figure 33B:
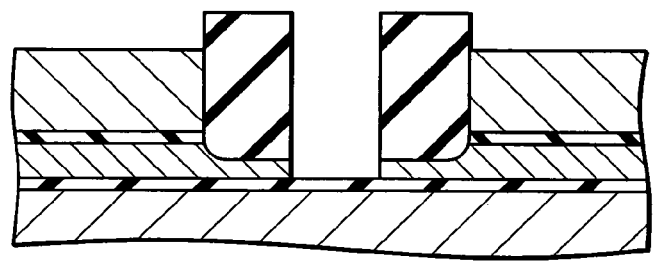

The steps illustrated in FIGS. 33B through 34C are the same as the steps in FIGS. 30A through 31B in the above-described fifth embodiment. That is, as shown in FIG. 33B, the portion of the polysilicon film PS1 corresponding to the bottom of the opening 2, and the upper portion of the polysilicon film PS5, are removed by dry etching.

Figure 33C:
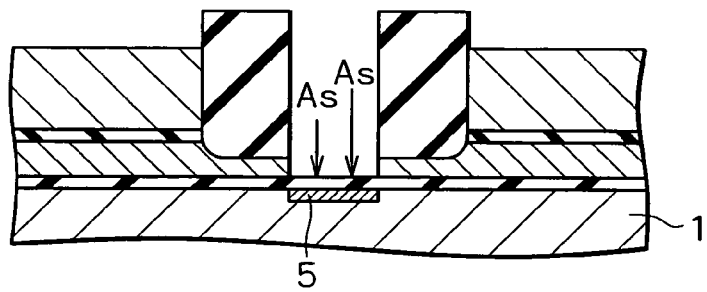

Next, as shown in FIG. 33C, arsenic (As) ions are implanted in the bottom of the opening 4, thereby forming a n$^+$ diffusion region 5 on the silicon substrate 1 which serves as the source.

Figure 33D:
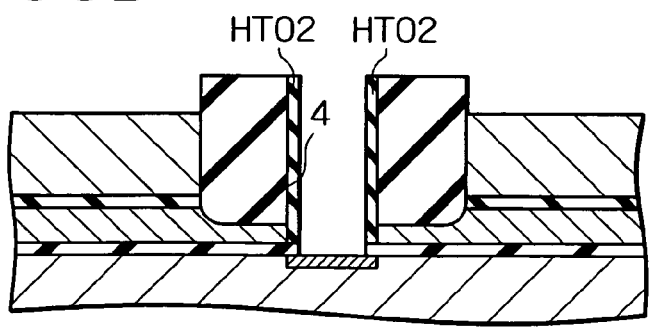

Next, as shown in FIG. 33D, side walls are formed of high-temperature oxide film HTO2 on the side faces of the opening 4. Also, an arrangement may be made wherein the side faces of the polysilicon film PS1 in the opening 4 are subjected to thermal oxidation, thereby forming a thermal oxide film of thickness around 5 nm for example, before forming the high-temperature oxide film HTO2. This stabilizes the Si/SiO$_2$ interface. Or, thermal oxidation may be performed in an oxygen atmosphere following formation of the high-temperature oxide film HTO2. Thus, the oxygen in the atmosphere is transmitted through the high-temperature oxide film HTO2 and reaches the high-temperature oxide film HTO2 and polysilicon film PS1 interface, oxidizing the surface of the polysilicon film PS1. This stabilizes the Si/SiO$_2$ interface.

Figure 34A:
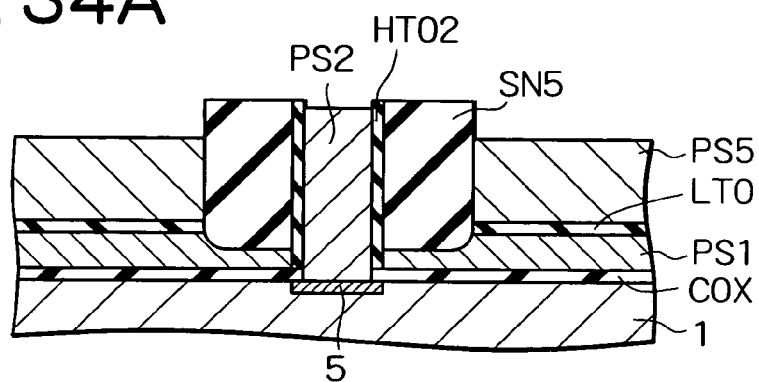
FIGS. 34A through 34D are cross-sectional diagrams illustrating a method for manufacturing flash memory according to the sixth embodiment, in order of the steps, and show the steps following FIG. 33D.

Next, as shown in FIG. 34A, a polysilicon film PS2 is filled in the interior of the opening 4. At this time, the impurity concentration of the polysilicon film PS2 is made to be higher than the impurity concentration of the polysilicon film PS5.

Figure 34B:
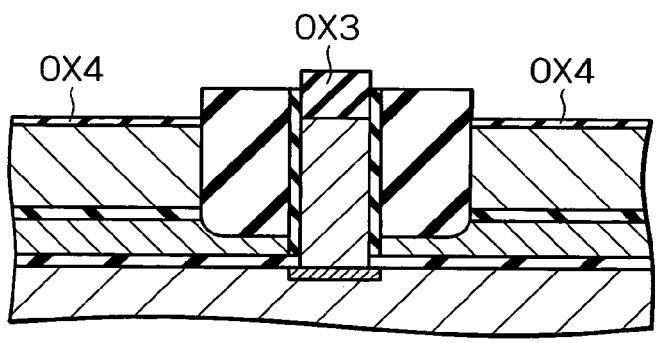

Next, as shown in FIG. 34B, the polysilicon films PS2 and PS5 are oxidized. At this time, the impurity concentration of the polysilicon film PS2 is higher than the impurity concentration of the polysilicon film PS5, so the polysilicon film PS2 oxidizes faster than the polysilicon film PS5. Accordingly, an oxide film OX3 of 40 to 50 nm in thickness for example, is formed on top of the polysilicon film PS2, and an oxide film OX4 of 10 nm in thickness for example, is formed on top of the polysilicon film PS5.

Figure 34C:
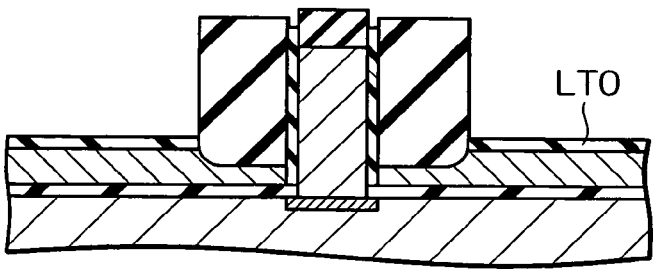

Next, as shown in FIG. 34C, the oxide film OX4 is removed by dry etching, and the polysilicon film PS5 is removed by dry etching. At this time, the oxide film OX3 is thicker than the oxide film OX4, and accordingly is not completely removed by the dry etching, thereby protecting the source plug formed of the polysilicon PS2.

Figure 34D:
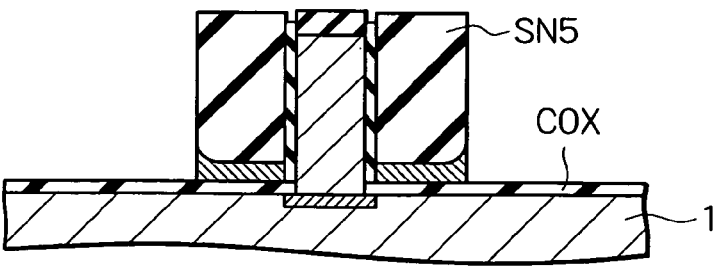

Next, as shown in FIG. 34D, the low-temperature oxide film LTO is removed by dry etching, and the exposed portion of the polysilicon film PS1 is selectively removed by dry etching. The portion of the polysilicon film PS1 directly below the silicon nitride film SN5 is not removed, and remains. This remaining polysilicon film PS1 becomes the floating gate FG.

Figure 35A:
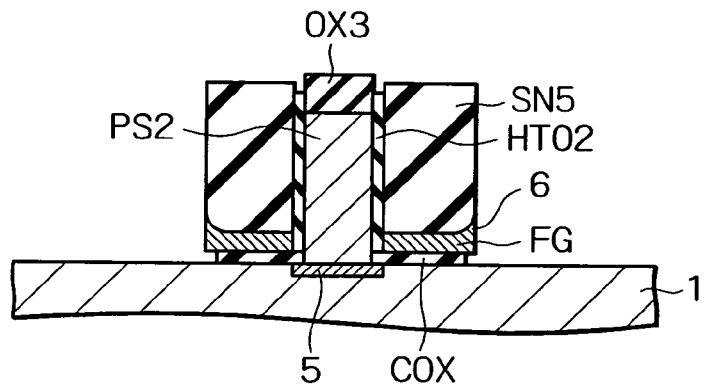
FIGS. 35A through 35D are cross-sectional diagrams illustrating a method for manufacturing flash memory according to the sixth embodiment, in order of the steps, and show the steps following FIG. 34D.

Next, as shown in FIG. 35A, wet etching is performed to remove the exposed portion of the coupling oxide film COX. At this time, in the above fifth embodiment, the thickness of the side wall formed of high-temperature oxide film HTO1 is reduced by this wet etching as shown in FIG. 31D, so that the sharp ridge 6 of the floating gate FG protrudes from the side wall. Conversely, with the present embodiment, the side wall is formed of the silicon nitride film SN5 rather than the high-temperature oxide film HTO1, so etching the coupling oxide COX does not reduce the side wall thickness. Accordingly, the sharp ridge 6 of the floating gate FG does not protrude from the side wall formed of the silicon nitride film SN5.

Figure 35B:
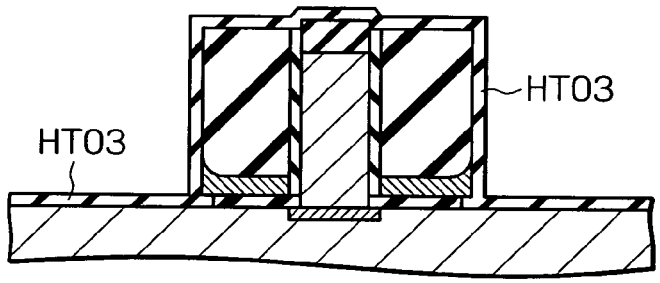
Figure 35C:
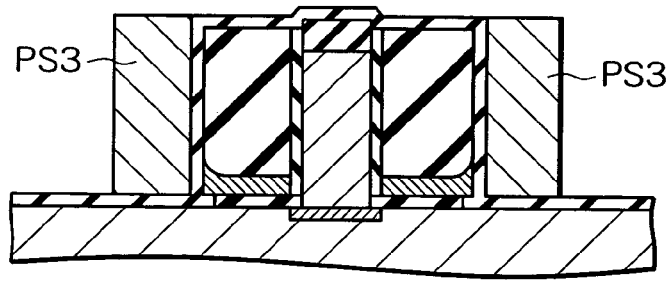
Figure 35D:
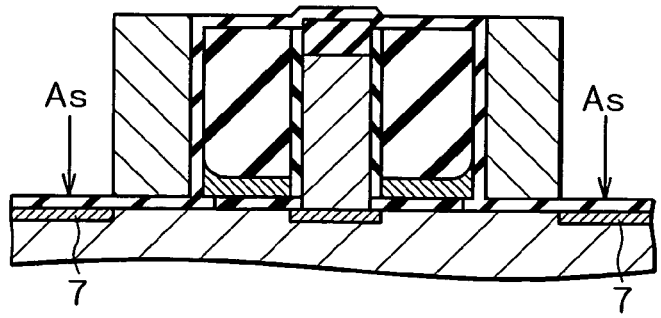

The steps illustrated in FIG. 35B through 35D are the same as the steps 32A through 32C in the above-described fifth embodiment. That is, as shown in FIG. 35B, a high-temperature oxide film HTO3 is formed on the entire face to a thickness of 10 to 15 nm, for example. Next, annealing is performed in an O$_2$ atmosphere. Note that an arrangement may be made wherein, prior to forming the high-temperature oxide film HTO3, the exposed surfaces of the floating gate FG are subjected to thermal oxidation, so as to form a thermal oxidation film of around 5 nm in thickness, for example. This stabilizes the Si/SiO$_2$ interface. Or, thermal oxidation may be performed in an oxygen atmosphere following formation of the high-temperature oxide film HTO3. Thus, the oxygen in the atmosphere is transmitted through the high-temperature oxide film HTO3 and reaches the high-temperature oxide film HTO3 and floating gate FG interface, oxidizing the surface of the floating gate FG. This stabilizes the Si/SiO$_2$ interface.

Next, as shown in FIG. 35C, a side wall is formed of polysilicon film PS3 on the side portion of the side wall of the silicon nitride film SN5, with the high-temperature oxide film HTO3 therebetween. This side wall (polysilicon film PS3) is the control gate, serving as the word line.

Next, as shown in FIG. 35D, arsenic (As) ions are implanted on the surface of the silicon substrate 1 between the polysilicon films PS3, thereby forming a n$^+$ diffusion region 7 serving as the drain/bit line.

Subsequently, the flash memory is manufactured by the same method as the above-described embodiments. Manufacturing steps of the present embodiment not mentioned here are the same as those of the above fifth embodiment.

With the first through fourth embodiments, the edge of the floating gate FG protrude from the side wall. Accordingly, the erasing speed of the memory improves, but in the event that there are irregularities in the length of protrusion of the protruding portion, the effective facing area of the control gate (word line) and the floating gate FG vary, leading to irregularities in the fiend intensity in the high-temperature oxide film HTO3, and consequently to irregularities in erasing properties.

Conversely, with the present embodiment, a side wall is formed of the silicon nitride film SN5 at the side face of the opening 2 in the step illustrated in FIG. 33A. Accordingly, etching the coupling oxide film COX in the step illustrated in FIG. 35A does not reduce the side wall thickness, and the sharp ridge 6 of the floating gate FG does not protrude from the side wall formed of the silicon nitride film SN5. Consequently, the flash memory according to the present embodiment has an erasing speed somewhat slower than the flash memory according to the above-described fifth embodiment, but no irregularities in the directions of the portion protruding from the side wall of the floating gate FG, so irregularities in erasing speed can be markedly reduced. Other advantages of the present embodiment not mentioned above are the same as those of the fifth embodiment.

Also, while the present embodiment involves fabricating a structure such as shown in FIG. 29C by the steps illustrated in FIGS. 28A through 29C according to the fifth embodiment, the present invention is not restricted to this, and a structure like that shown in FIG. 29C may be fabricated by any of the methods described in the above first through fourth embodiments.

Also, in the step shown in FIG. 35A, the silicon nitride film SN5 can be selectively removed by wet etching following removal of the coupling oxide film COX. Accordingly, the sharp ridge 6 of the floating gate FG can be made to protrude from the side wall formed of the silicon nitride film SN5, thereby improving erasing speed.

Seventh Embodiment

Next, a seventh embodiment of the present invention will be described. FIGS. 36A through 36D, 37A through 37D, and 38A through 38D, are cross-sectional diagrams illustrating the method of manufacturing the flash memory according to the present embodiment, in order of the steps.

First, the steps illustrated in FIGS. 28A through 29C according to the above-described fifth embodiment are carried out, so as to manufacture a structure such as shown in FIG. 29C, i.e., a structure wherein the coupling oxide film COX, the polysilicon film PS1, the low-temperature oxide film LTO, and the polysilicon film PS5, are layered on the silicon substrate 1, with the opening 2 formed in the polysilicon film PS5 and the low-temperature oxide film LTO, and the recess 3 formed at the bottom of the opening 2 in the polysilicon film PS1.

Figure 36A:
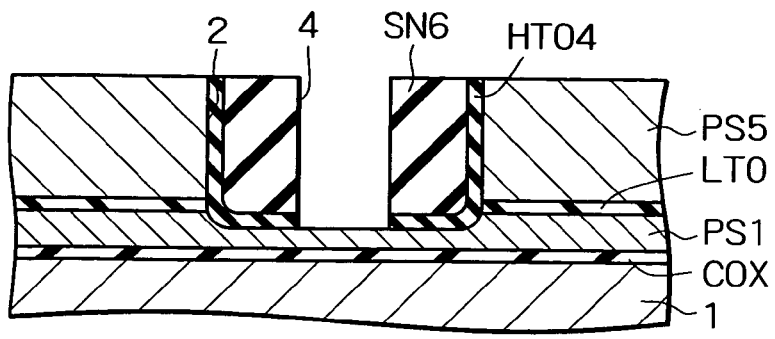
FIGS. 36A through 36D are cross-sectional diagrams illustrating a method for manufacturing flash memory according to a seventh embodiment of the present invention, in order of the steps.
Figure 36B:
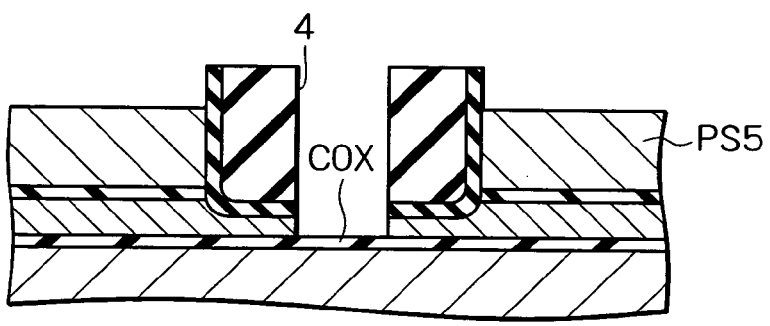
Figure 36C:
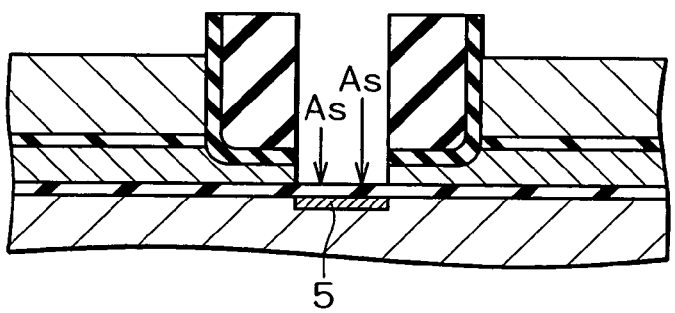
Figure 36D:
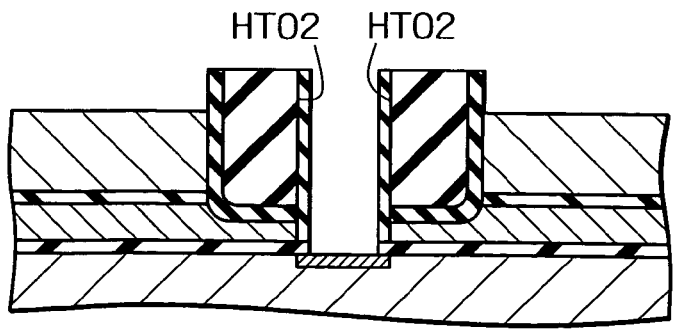

Next, as shown in FIG. 36A, a high-temperature oxide film HTO4 is deposited on the entire face to a thickens of 10 to 50 nm for example, following which a silicon nitride film SN6 is deposited to a thickness of 140 to 100 nm for example. That is to say, the total thickens of the high-temperature oxide film HTO4 and the silicon nitride film SN6 is made to be 150 nm, for example. Subsequently, the high-temperature oxide film HTO4 and the silicon nitride film SN6 are etched back, thereby forming side walls of the high-temperature oxide film HTO4 and the silicon nitride film SN6 on the side faces of the opening 2. Thus, the inner diameter of the opening 2 is reduced, forming an opening 4.

The steps illustrated in FIGS. 36B through 37C are the same as the steps in FIGS. 30A through 31B in the above-described fifth embodiment.

Figure 37A:
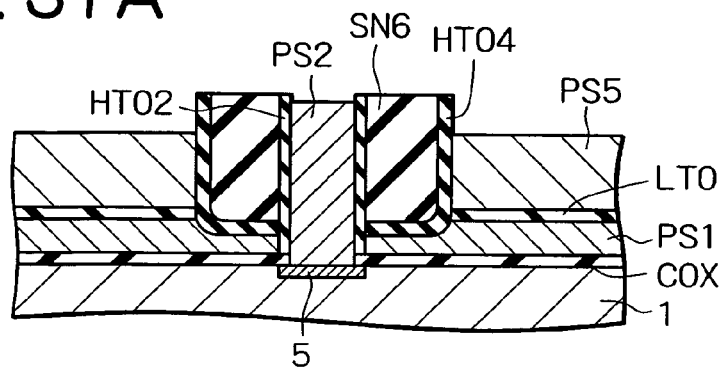
FIGS. 37A through 37D are cross-sectional diagrams illustrating a method for manufacturing flash memory according to the seventh embodiment, in order of the steps, and show the steps following FIG. 36D.
Figure 37B:
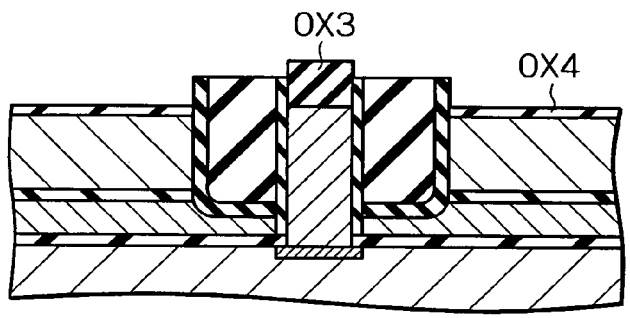
Figure 37C:
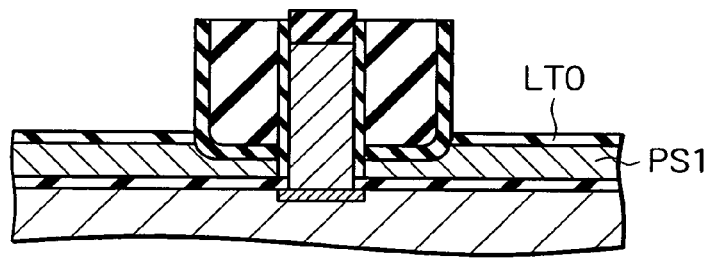
Figure 37D:
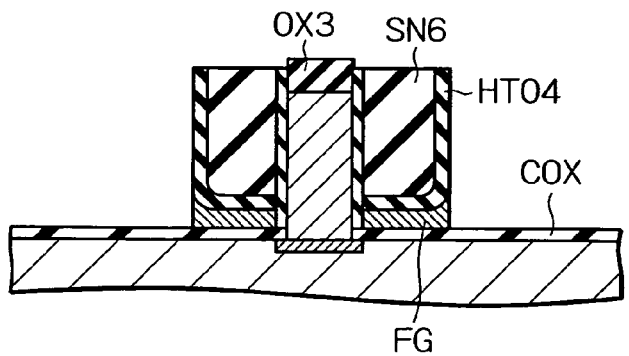

Next, as shown in FIG. 37D, the low-temperature oxide film LTO is removed by dry etching, and the exposed portion of the polysilicon film PS1 is selectively removed by dry etching. The portion of the polysilicon film PS1 directly below the high-temperature oxide film HTO4 and the silicon nitride film SN6 is not removed, and remains. This remaining polysilicon film PS1 becomes the floating gate FG.

Figure 38A:
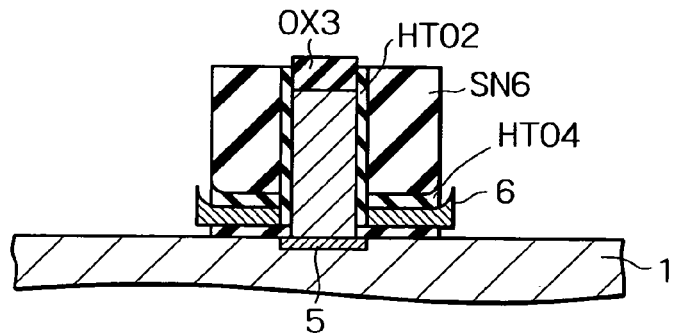
FIGS. 38A through 38D are cross-sectional diagrams illustrating a method for manufacturing flash memory according to the seventh embodiment, in order of the steps, and show the steps following FIG. 37D.

Next, as shown in FIG. 38A, wet etching is performed to remove the exposed portions of the coupling oxide film COX and the high-temperature oxide film HTO4. At this time, of the high-temperature oxide film HTO4 and the silicon nitride film SN6 forming the side wall, the high-temperature oxide film HTO4 portion is removed, so that the sharp ridge 6 of the floating gate FG protrudes from the side wall formed of the silicon nitride film SN6.

Figure 38B:
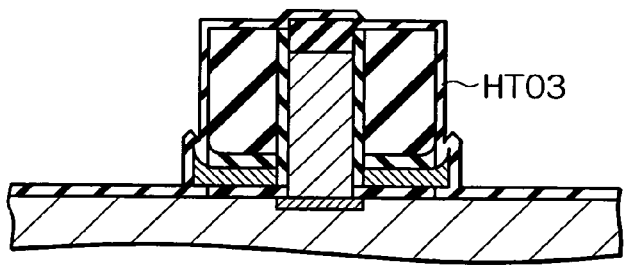
Figure 38C:
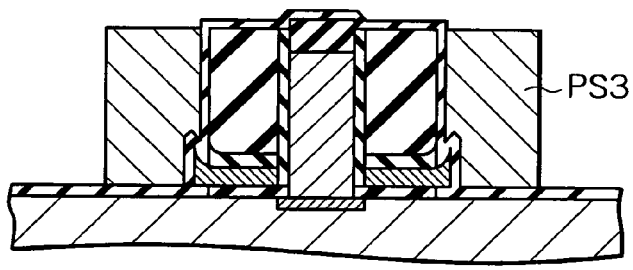
Figure 38D:
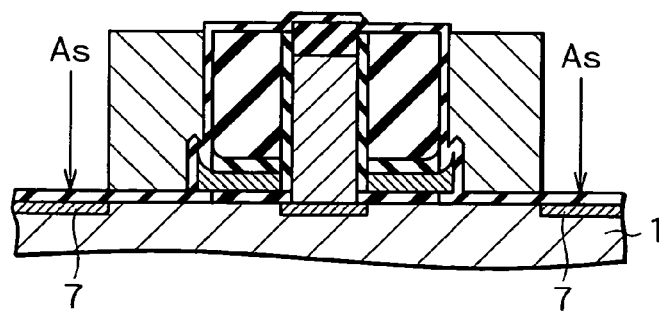

The steps illustrated in FIG. 38B through 38D are the same as the steps 32A through 32C in the above-described fifth embodiment. That is, as shown in FIG. 38B, a high-temperature oxide film HTO3 is formed on the entire face to a thickness of 10 to 15 nm, for example. Next, annealing is performed in an $O_2$ atmosphere. Or, the high-temperature oxide film HTO3 may be formed following thermal oxidization. Or, thermal oxidization alone may be performed so as to form the high-temperature oxide film HTO3.

Next, as shown in FIG. 38C, a side wall is formed of polysilicon film PS3 on the side portion of the side wall of the silicon nitride film SN6, with the high-temperature oxide film HTO3 therebetween. This side wall (polysilicon film PS3) is the control gate, serving as the word line.

Next, as shown in FIG. 38D, arsenic (As) ions are implanted on the surface of the silicon substrate 1 between the polysilicon films PS3, thereby forming a $n^+$ diffusion region 7 serving as the drain/bit line.

Subsequently, the flash memory is manufactured by the same method as the above-described embodiments. Manufacturing steps of the present embodiment not mentioned here are the same as those of the above fifth embodiment.

With the present embodiment, in the step shown in FIG. 36A, a side wall formed of high-temperature oxide film HTO4 and the silicon nitride film SN6 is formed on the side face of the opening 2. Thus, removing only the high-temperature oxide film HTO4 and leaving the silicon nitride film SN6 in the step shown in FIG. 38A allows the sharp ridge 6 of the floating gate FG to protrude from the side wall of silicon nitride film SN6 by an amount equal to the thickness of the silicon nitride film SN6 by only the thickness of the high-temperature oxide film HTO4. Accordingly, the length of protrusion of the floating gate FG can be controlled by the thickness of the high-temperature oxide film HTO4, thereby reducing irregularities in the length of the protrusions. Consequently, the erasing properties of the flash memory can be made uniform. Other advantages of the present embodiment not mentioned here are the same as those of the above fifth embodiment.

Also, while the present embodiment involves fabricating a structure such as shown in FIG. 29C by the steps illustrated in FIGS. 28A through 29C according to the above fifth embodiment, the present invention is not restricted to this, and a structure like that shown in FIG. 29C may be fabricated by any of the methods described in the above first through fourth embodiments.

Eighth Embodiment

Next, an eighth embodiment of the present invention will be described. FIGS. 39A through 39D, 40A through 40D, and 41A through 41D, are cross-sectional diagrams illustrating the method of manufacturing the flash memory according to the present embodiment, in order of the steps.

First, the steps illustrated in FIGS. 28A through 29C according to the above fifth embodiment are carried out, so as to manufacture a structure such as shown in FIG. 29C, i.e., a structure wherein the coupling oxide film COX, the polysilicon film PS1, the low-temperature oxide film LTO, and the polysilicon film PS5, are layered on the silicon substrate 1, with the opening 2 formed in the polysilicon film PS5 and the low-temperature oxide film LTO, and the recess 3 formed at the bottom of the opening 2 in the polysilicon film PS1.

Figure 39A:
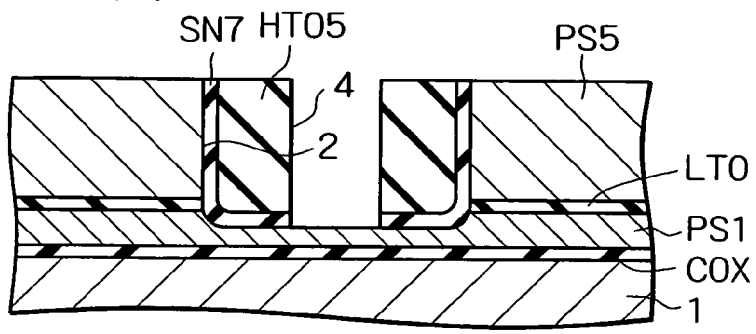
FIGS. 39A through 39D are cross-sectional diagrams illustrating a method for manufacturing flash memory according to an eighth embodiment of the present invention, in order of the steps.
Figure 39B:
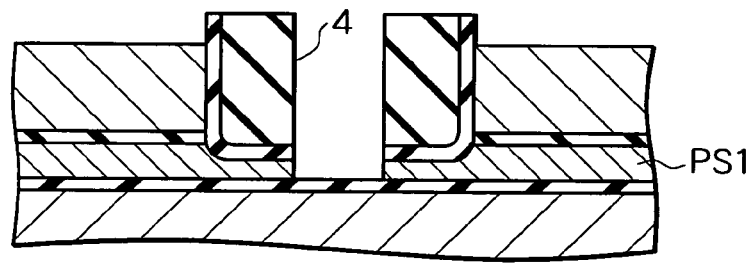
Figure 39C:
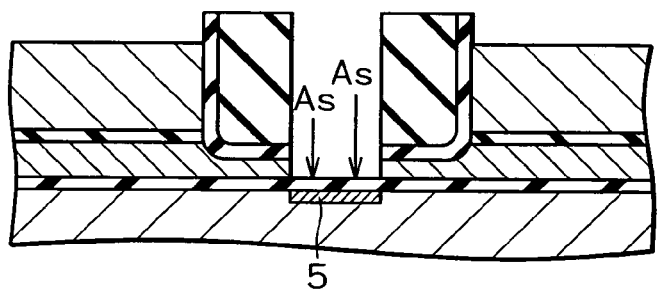
Figure 39D:
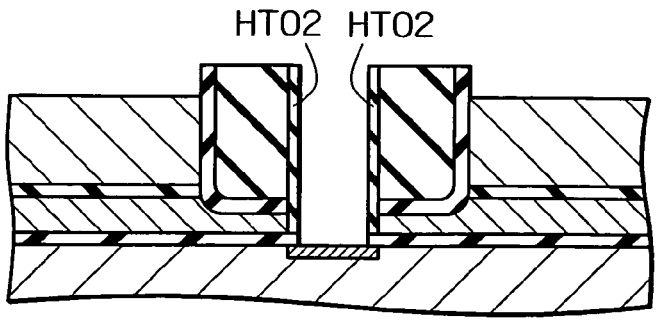

Next, as shown in FIG. 39A, a silicon nitride film SN7 is deposited on the entire face to a thickens of 10 to 50 nm for example, following which a high-temperature oxide film HTO5 is deposited to a thickness of 140 to 100 nm for example. That is to say, the total thickens of the silicon nitride film SN7 and the high-temperature oxide film HTO5 is made to be 150 nm, for example. Subsequently, the silicon nitride film SN7 and the high-temperature oxide film HTO5 are etched back, thereby forming side walls of the silicon nitride film SN7 and the high-temperature oxide film HTO5 on the side faces of the opening 2. Thus, the inner diameter of the opening 2 is reduced, forming an opening 4.

Next, the steps illustrated in FIGS. 39B through 40C are executed in order. The steps illustrated in FIGS. 39B through 40C are the same as the steps in FIGS. 30A through 31B in the above fifth embodiment, and accordingly description will be omitted.

Figure 40A:
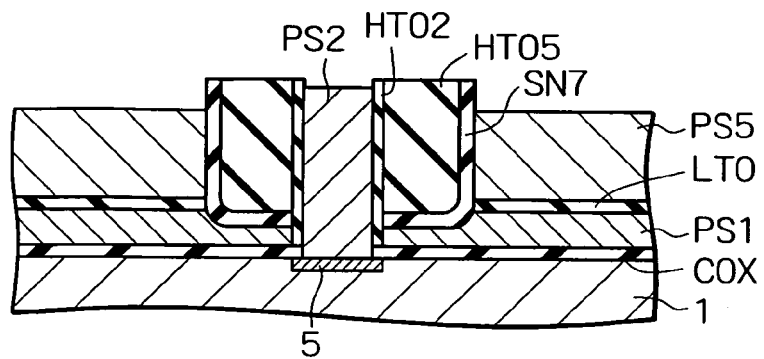
FIGS. 40A through 40D are cross-sectional diagrams illustrating a method for manufacturing flash memory according to the eighth embodiment, in order of the steps, and show the steps following FIG. 39D.
Figure 40B:
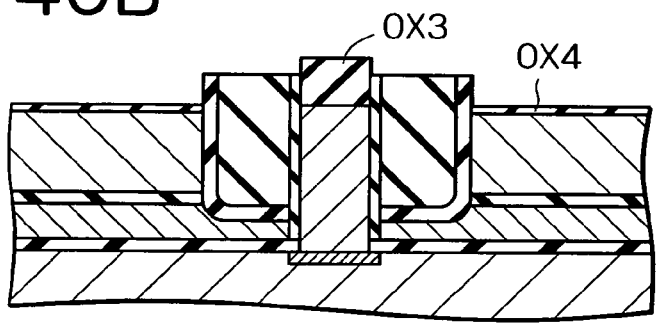
Figure 40C:
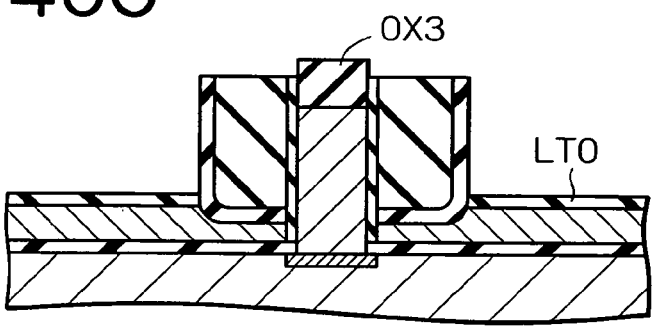
Figure 40D:
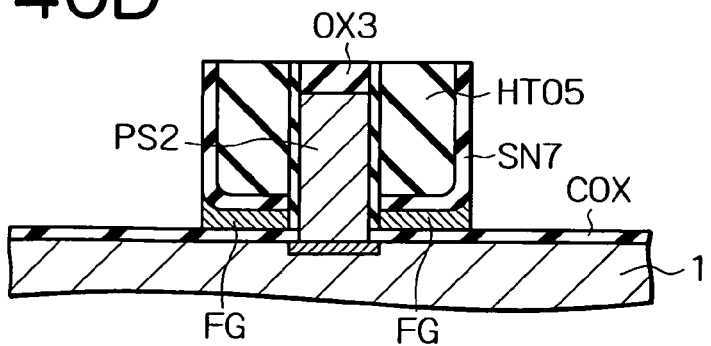

Next, as shown in FIG. 40D, the low-temperature oxide film LTO is removed by dry etching, and the exposed portion of the polysilicon film PS1 is selectively removed by dry etching. The portion of the polysilicon film PS1 directly below the silicon nitride film SN7 and the high-temperature oxide film HTO1 is not removed, and remains. This remaining polysilicon film PS1 becomes the floating gate FG.

Figure 41A:
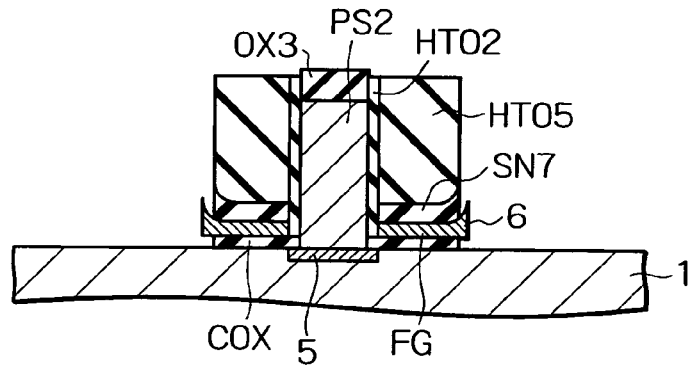
FIGS. 41A through 41D are cross-sectional diagrams illustrating a method for manufacturing flash memory according to the eighth embodiment, in order of the steps, and show the steps following FIG. 40D.

Next, as shown in FIG. 41A, wet etching is performed to remove the exposed portion of the silicon nitride film SN7. Next, wet etching is performed to remove the exposed portion of the coupling oxide film COX. At this time, of the silicon nitride film SN7 and the high-temperature oxide film HTO5 forming the side wall, the exposed portion of the silicon nitride film SN7 is removed, so that the sharp ridge 6 of the floating gate FG protrudes from the side wall.

Figure 41B:
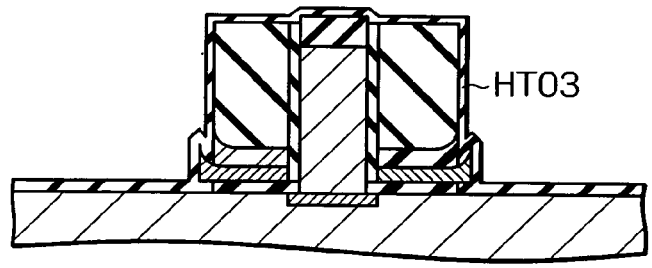
Figure 41C:
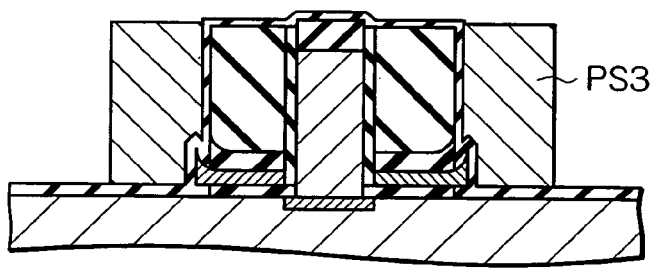
Figure 41D:
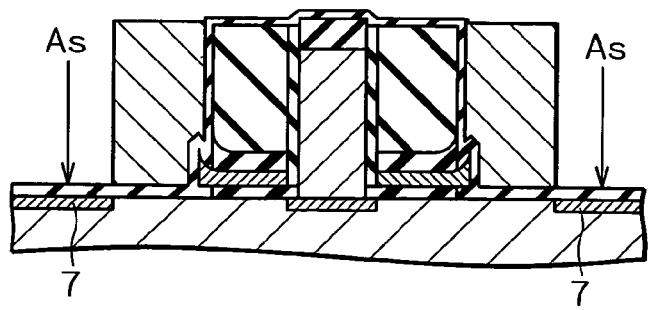

The steps illustrated in FIGS. 41B through 41D are the same as the steps 38B through 38D in the above-described sixth embodiment.

Subsequently, the flash memory is manufactured by the same method as the above-described embodiments. Manufacturing steps of the present embodiment not mentioned here are the same as those of the above fifth embodiment.

With the present embodiment, in the step shown in FIG. 39A, a side wall of a silicon nitride film SN7 and high-temperature oxide film HTO5 is formed on the side face of the opening 2. Thus, removing only the exposed portion of the silicon nitride film SN7 by wet etching and leaving the high-temperature oxide film HTO5 in the step shown in FIG. 41A allows the sharp ridge 6 of the floating gate FG to protrude from the side wall by an amount equal to the thickness of the silicon nitride film SN7. Accordingly, the length of protrusion of the floating gate FG can be controlled by the thickness of the silicon nitride film SN7, thereby reducing irregularities in the length of the protrusions. Consequently, the erasing properties of the flash memory can be made uniform. Other advantages of the present embodiment not mentioned here are the same as those of the above fifth embodiment.

Also, while the present embodiment involves fabricating a structure such as shown in FIG. 29C by the steps illustrated in FIGS. 28A through 29C according to the above fifth embodiment, the present invention is not restricted to this, and a structure like that shown in FIG. 29C may be fabricated by any of the methods described in the above first through fourth embodiments.

Also, in the above-described seventh and eighth embodiments, the side wall formed on the inner face of the opening 2 is a two-layered film formed of a high-temperature oxide film and silicon nitride film, but the present invention is not restricted to this, and the side wall may be a many-layered film of three-layered film or more. For example, a four-layered film layered in the order of high-temperature oxide film, silicon nitride film, high-temperature oxide film, silicon nitride film, from the silicon substrate 1 side, may be used, or a four-layered film layered in the order of silicon nitride film, high-temperature oxide film, silicon nitride film, high-temperature oxide film, from the silicon substrate 1 side, may be used.

Further, in the above-described second through eighth embodiments, an example of using low-temperature oxide film LTO which is formed at a temperature of 500 to 700° C. as an etching stopper film has been described, but the etching stopper film according to the present invention is not restricted to the low-temperature oxide film, and may be a high-temperature oxide film formed at a temperature of around 800° C. for example, instead. However, in the event of forming an amorphous silicon film instead of the polysilicon film PS1, the amorphous silicon film may crystallize due to formation of the high-temperature oxide film. Also, a silicon oxide film containing an additive may be used as the etching stopper film, or an inorganic material film of $Al_2O_3$ or the like may be used.

Ninth Embodiment

Figure 42:
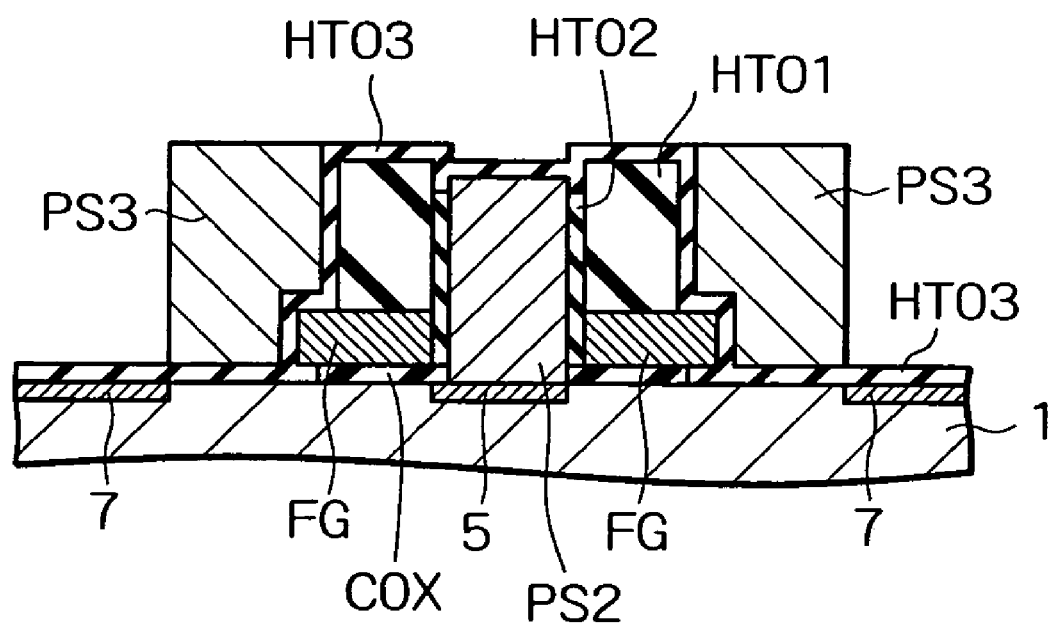
FIG. 42 is a cross-sectional diagram illustrating the cell structure of the flash memory according to a ninth embodiment of the present invention.

Next, a ninth embodiment of the present invention will be described. FIG. 42 is a cross-sectional diagram illustrating the cell structure of the flash memory according to the present embodiment, and FIGS. 43A through 43D and 44A through 44D are cross-sectional diagram illustrating the method of manufacturing the flash memory according to the present embodiment, in order of the steps. Also, FIG. 45 is a cross-sectional diagram illustrating another method for manufacturing flash memory according to the present embodiment.

As shown in FIG. 42, with the flash memory according to the present embodiment, a p-type silicon substrate 1 is provided, a $n^+$ diffusion region 5 wherein arsenic (As) ions have been implanted is formed on a portion of the surface of the silicon substrate 1, and $n^+$ diffusion regions 7 are formed at two positions on either side of the $n^+$ diffusion region 5 but not in contact with the $n^+$ diffusion region 5, with spacing therebetween. The $n^+$ diffusion region 5 becomes the source, and the $n^+$ diffusion regions 7 become the drain. A coupling oxide film COX, 10 nm in thickness for example, is formed on a region including the region immediately above the $n^+$ diffusion region 5 on the silicon substrate 1, and a thermal oxide film OX5 of a thickness of 5 to 10 nm for example, is provided at a region where the coupling oxide film COX is not formed on the silicon substrate 1, i.e., a region including directly above the $n^+$ diffusion regions 7.

Also, a source plug formed of a polysilicon film PS2 is provided in the region directly above the $n^+$ diffusion region 5, and a thermal oxide film OX5 is formed at the top of the polysilicon film PS2. A high-temperature oxide film HTO2 is provided at the side face of the source plug, and two floating gates FG are provided at positions on either side of the source plug on the coupling oxide film COX, so as to come into contact with the high-temperature oxide film HTO2.

Further, a side wall formed of high-temperature oxide film HTO1 is provided so as to cover the portion of the floating gate FG closer to the polysilicon film PS2, and the portion of the floating gate FG farther from the polysilicon film PS2 protrudes from the side wall formed of the high-temperature oxide film HTO1. The protruding portion is covered by a thermal oxide film OX5.

Also, a high-temperature oxide film HTO3 is provided to a thickness of 10 to 15 nm for example, so as to cover the thermal oxide film OX5 and the high-temperature oxide film HTO1. Also, a control gate (word line) formed of polysilicon film PS3 is provided to the opposite side of the polysilicon film PS2 as viewed from the side wall of high-temperature oxide film HTO1 on the high-temperature oxide film HTO3. The protruding length of the protruding portion of the floating gate FG is equal to or greater than the thickness of the high-temperature oxide film HTO3, but 100 nm or less. Preferably, the length of the protruding portion is 20 to 50 nm.

Accordingly, the floating gate FG and the control gate (polysilicon film PS3) are mutually insulated by the thermal oxide film OX5 and the high-temperature oxide film HTO3. The thermal oxide film OX5 and the high-temperature oxide film HTO3 serve as the tunneling oxide film. Also, the floating gate FG is insulated form the surroundings by the coupling oxide film COX, thermal oxide film OX5, and high-temperature oxide films HTO1 and HTO2, and is in an electrically floating state.

Note that the plan view illustrating the flash memory according to the present embodiment is the same as that in FIG. 22B, and the circuit diagram is the same as that in FIG. 23. The operations of the flash memory according to the present embodiment is the same as that in the above first embodiment. Next, the grounds for numerical restriction in the component requirements according to the present invention will be described.

The length of the protruding portion from the side wall of the floating gate FG is preferably equal to or greater than the thickness of the high-temperature oxide film HTO3, but 100 nm or less.

In order for the length of the protruding portion to exceed 100 nm, the width of the side wall formed of the high-temperature oxide film HTO1 must be reduced by 100 nm or more by etching. In this case, in the event that the thickness of the high-temperature oxide film HTO1 prior to etching is 150 nm for example in the direction parallel to the surface of the substrate, the thickness of the high-temperature oxide film HTO1 following etching in the direction parallel to the surface of the substrate is 50 nm or less, so the strength of the side wall cannot be ensured. Also, the coupling oxide film COX below the high-temperature oxide film HTO1 is deeply etched, and there is the possibility of short-circuiting between the silicon substrate 1 and the floating gate FG. Further, the top of the high-temperature oxide film HTO1 is also removed by the etching, so the height of the side wall formed of the high-temperature oxide film HTO1 and the height of the high-temperature oxide film HTO2 become low, so there is the possibility that at the time of forming the control gate (polysilicon film PS3) on the side of the side wall, insulation between the control gate and source plug (polysilicon film PS2) cannot be ensured. Accordingly, the length of the protruding portion is to be 100 nm or less. On the other hand, in the event that the length of the protruding portion is equal to or greater than the thickness of the high-temperature oxide film HTO3, the floating gate FG protrudes from the high-temperature oxide film HTO3 in the event that the high-temperature oxide film HTO3 is formed so as to cover the floating gate FG and the side wall formed of the high-temperature oxide film HTO1. Thus, the electric lines of force passing around from the control gate (polysilicon film PS3) to the floating gate FG increase, whereby the field intensity in the high-temperature oxide film HTO3 can be increased. Consequently, the erasing speed of the memory can be improved. Accordingly, the length of the protruding portion is preferably equal to or greater than the high-temperature oxide film HTO3.

Figure 43A:
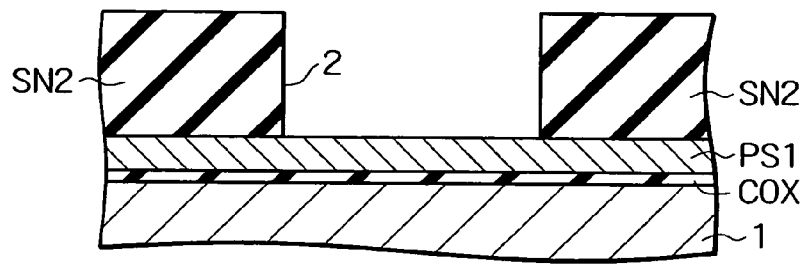
FIGS. 43A through 43D are cross-sectional diagrams illustrating a method for manufacturing flash memory according to the ninth embodiment of the present invention, in order of the steps.

Next, the method for manufacturing the flash memory according to the present embodiment will be described. First, as shown in FIG. 43A, a coupling oxide film COX 10 nm in thickness for example, is formed on the silicon substrate 1. Next, a polysilicon film PS1 is formed to a thickness of 100 nm for example, on the coupling oxide film COX. Next, element separating regions STI (see FIG. 6A) are formed with the same method as the above-described first embodiment.

Next, a silicon nitride film SN2 is formed on the polysilicon film PS1 and the element separating regions STI to a thickness of 350 nm, for example. A resist (not shown) is formed on the silicon nitride film SN2, and patterning is performed. The silicon nitride film SN2 is selectively removed by dry etching, using the patterned resist as a mask, thereby forming openings 2 from which a part of the polysilicon film PS1 is exposed. At this time, over-etching to the polysilicon film PS1 is made as small possible, so that the surface of the polysilicon film PS1 at the bottom of the opening 2 is as close as possible to the height of the interface of the silicon nitride film SN2 and polysilicon film PS1 outside of the opening 2. In other words, the recess 3 (see FIG. 25C) formed in the above-described second embodiment, is not to be formed.

Figure 43B:
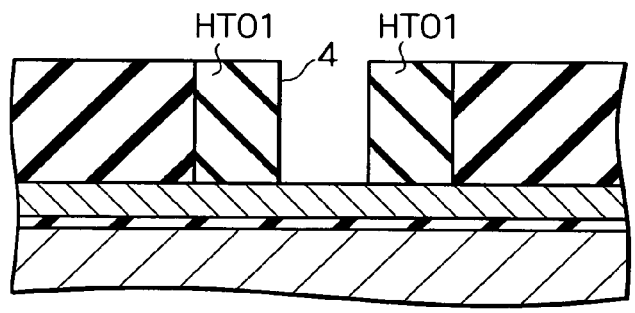

Next, as shown in FIG. 43B, a high-temperature oxide film HTO1 is deposited to a thickness of 150 nm for example, and then etched back, thereby forming a side wall formed of the high-temperature oxide film HTO1 on the side face of the opening 2. This reduces the inner diameter of the opening 2, forming an opening 4.

Figure 43C:
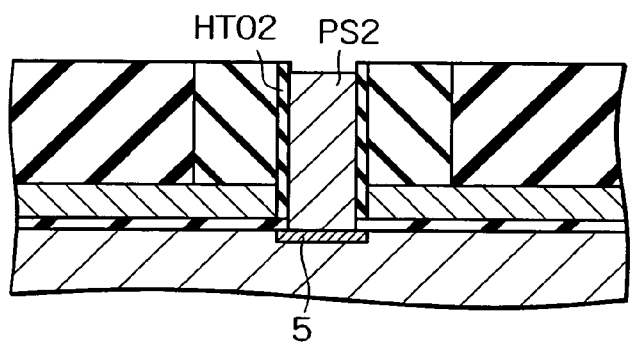

Next, as shown in FIG. 43C, the polysilicon film PS1 is subjected to dry etching with the silicon nitride film SN2 and high-temperature oxide film HTO1 as a mask, and is selectively removed, so as to expose the coupling oxide film COX at the bottom of the opening 4. Next, arsenic (As) ions are implanted into the bottom of the opening 4, thereby forming a $n^+$ diffusion region 5 to serve as the source, on the surface of the silicon substrate 1. Next, high-temperature oxide film HTO2 is deposited on the entire face to a thickness of 10 to 20 nm for example, and etched back, thereby forming a side wall of a high-temperature oxide film HTO2 on the side face of the opening 4. At this time, the coupling oxide film COX at the bottom of the opening 4 is removed by this etching back, thereby exposing the $n^+$ diffusion region 5 on the surface of the silicon substrate 1. Next, a polysilicon film PS2 is deposited on the entire face and subsequently etched back, thereby embedding the polysilicon film PS2 in the opening 4.

Figure 43D:
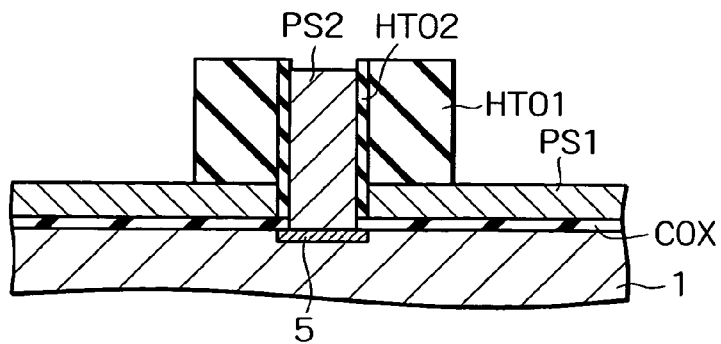

Next, as shown in FIG. 43D, wet etching is performed to remove the silicon nitride film SN2. Thus, the portion of the polysilicon film PS1 directly beneath the silicon nitride film SN2 is exposed.

Figure 44A:
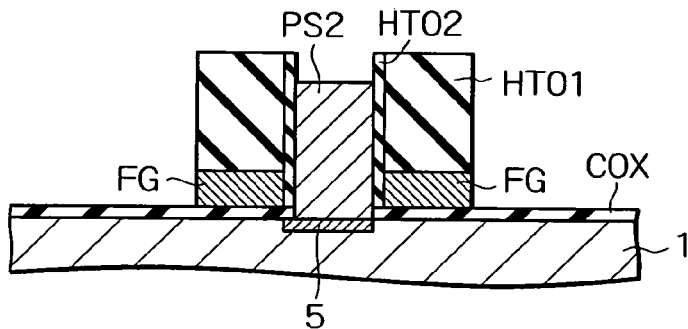
FIGS. 44A through 44C are cross-sectional diagrams illustrating a method for manufacturing flash memory according to the ninth embodiment, and show the steps following FIG. 43D.
Figure 45:
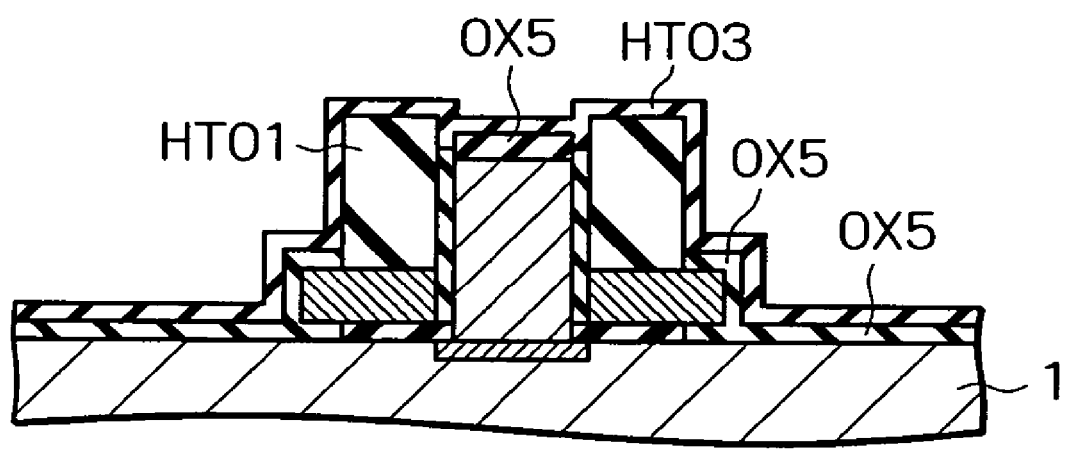
FIG. 45 is a cross-sectional diagram illustrating another method for manufacturing flash memory according to the ninth embodiment.

Next, as shown in FIG. 44A, the polysilicon film PS1 is dry-etched. Accordingly, the portions of the polysilicon film PS1 directly beneath the silicon nitride film SN2 (see FIG. 43C) are selectively removed. On the other hand, the portions of the polysilicon film PS1 directly beneath the high-temperature oxide film HTO1 are not removed but remain, and become the floating gate FG. At this time, there is no recess formed at the bottom of the opening 2 in the step shown in FIG. 43A, unlike the above-described embodiments, so no sharp ridge is formed on the floating gate FG in the step shown in FIG. 44A, and accordingly, the cross-sectional shape of each floating gate FG is approximately rectangular. Note that the polysilicon film PS2 is also partially removed by this dry etching.

Figure 44B:
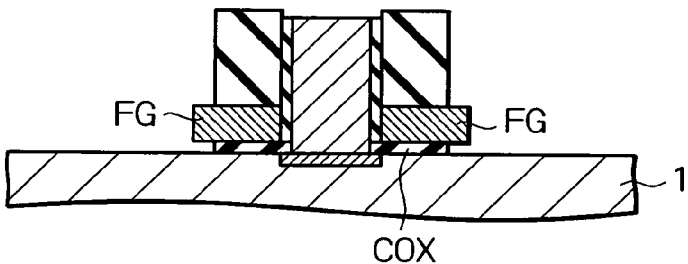

Next, as shown in FIG. 44B, wet etching is performed to remove the exposed portions of the coupling oxide film COX. At this time, the high-temperature oxide films HTO1 and HTO2 are also etched at the same time, so the width of the side wall formed of the high-temperature oxide film HTO1 is reduced. Consequently, the edge of the floating gate FG protrudes from the side wall. Note that the length of the side wall formed of the high-temperature oxide film HTO1, i.e., the length of the protruding portion of the floating gate FG is to be greater than the thickness of the high-temperature oxide film HTO3, but 100 nm or less. In the event that the thickness of the high-temperature oxide film HTO1 is 150 nm, the length of the protruding portion is preferably around 1/3 of the thickness of the high-temperature oxide film HTO1 or less, i.e., 50 nm or less.

Figure 44C:
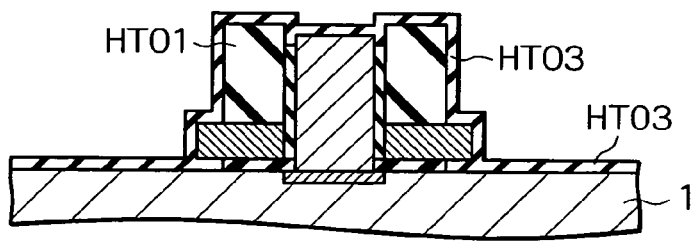

Next, as shown in FIG. 44C, a high-temperature oxide film HTO3 is formed on the entire face. Note that in the step shown in FIG. 44C, an arrangement may be made such as shown in FIG. 45 wherein thermal oxidization processing is performed prior to forming the high-temperature oxide film HTO3, thereby forming a thermal oxide film OX5 of 5 to 10 nm in average thickness, on the exposed portions of the silicon substrate 1, polysilicon film PS2, and floating gate FG. At this time, optimizing the thermal oxidization conditions allows sharp ridges to be formed on the corners of the upper face of the floating gate FG, as with the above modification of the first embodiment (see FIG. 24B). However, there is the need to adjust the thermal oxidization conditions in this case such that irregularities in the shape of the sharp ridges can be reduced. Subsequently, the high-temperature oxide film HTO3 is formed on the entire face.

Or, an arrangement may be made wherein formation of the high-temperature oxide film HTO3 is omitted, and only a thermal oxide film OX5 is formed. In this case, the average thickness of the thermal oxide film OX5 is 10 to 20 nm.

Figure 44D:
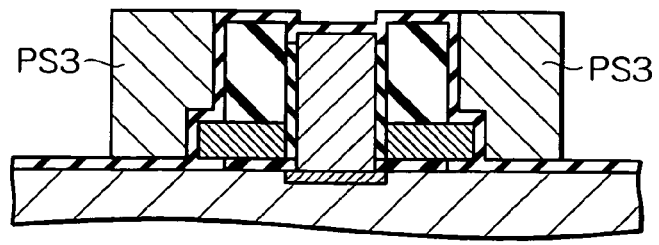

Next, as shown in FIG. 44D, a polysilicon film PS3 is formed on the entire face to a thickness of 150 to 200 nm for example, and then etched back, so that a side wall is formed of the polysilicon film PS3 on the side portion of the side wall of the high-temperature oxide film HTO1, with the high-temperature oxide film HTO3 therebetween. This side wall is the control gate, serving as the word line.

Next, as shown in FIG. 42D, arsenic (As) ions are implanted on the surface of the silicon substrate 1 between the polysilicon films PS3, thereby forming a n$^+$ diffusion region 7. This n$^+$ diffusion region 7 becomes the drain, serving as the bit line. Subsequently, the flash memory is manufactured by the same method as the above-described first embodiment.

With the present embodiment, in the step illustrated in FIG. 43A, no etching stopper film such as a low-temperature oxide film is provided on the polysilicon film PS1, and the etching conditions are adjusted at the time of performing dry etching of the silicon nitride film SN2, thereby suppressing over-etching of the polysilicon film PS1 as much as possible, so that the recess is not formed on the bottom of the opening 2. Accordingly, the step for providing the etching stopper film is unnecessary, and the number of steps can be reduced. Also, in the step illustrated in FIG. 44A for forming the floating gates FG, there are no irregularities in the shape of the floating gates FG due to irregularities in the shape of the recesses, and the shape of the floating gates FG can be made uniform from one cell to another. Note that with the present embodiment, the sharp ridges are not formed on the floating gates FG, so the erasing speed of the memory is somewhat slower in comparison with cases wherein the sharp ridges are formed. However, the shape of the floating gates FG can be made somewhat sharp by forming the thermal oxide film OX5 on the protruding portions of the floating gates FG in the step shown in FIG. 44C, thereby improving the memory erasing speed to a certain degree. Further, suitably controlling the etching amount of the high-temperature oxide film HTO1 increases the field intensity, so the erasing speed also improves. Other advantages of the present embodiment not mentioned here are the same as those of the first embodiment.

What is claimed is:

1. A method for manufacturing non-volatile memory, comprising the steps of:
    forming a first insulating layer on a first electroconductive semiconductor substrate;
    forming a first electroconductive film on said first insulating film;
    forming an etching stopper film on said first electroconductive film;
    forming a spacer film on said etching stopper film;
    selectively removing said spacer film by etching to said etching stopper film, so as to form an opening;
    removing said etching stopper film in said opening;
    forming a bowl-shaped recess in said first electroconductive film within said opening;
    forming a side wall insulating film on the side face of said opening;
    removing said first electroconductive film and said first insulating film within said opening;
    implanting impurities of a second electroconductivity type on the surface of said semiconductor substrate within said opening, thereby forming one of a source and drain;
    forming a second insulating film so as to cover the exposed face of said first electroconductive film within said opening;
    forming a plug by filling the inside of said opening with an electroconductive film;
    removing said spacer film;
    forming a floating gate of said first electroconductive film at the region directly below said side wall insulating film, by selectively etching away said first electroconductive film with said side wall insulating film as a mask;
    forming a third insulating film so as to cover the exposed face of said floating gate;
    forming a control gate on the side of said plug by forming an electroconductive film on said side wall insulating film; and
    forming the other of the source and drain by selectively implanting impurities of a second electroconductivity type on the surface of said semiconductor substrate, with said plug, said side wall insulating film, said floating gate, and said control gate, as masks.

2. A method for manufacturing non-volatile memory according to claim 1, wherein said forming of said etching stopper film includes a step for forming a film containing silicon oxide.

3. A method for manufacturing non-volatile memory according to claim 2, wherein said forming of said etching stopper film includes a step of forming a second electroconductive film on said film containing silicon oxide;
    and wherein said removing of said etching stopper film from said opening comprises the steps of:
        etching and removing said second electroconductive film in said opening, and
        etching and removing said film containing silicon oxide in said opening.

4. A method for manufacturing non-volatile memory according to claim 2, wherein said forming of said film containing a silicon oxide is a step for forming a silicon oxide film by chemical vapor deposition, at a temperature of 800° C. or lower.

5. A method for manufacturing non-volatile memory according to claim 3, wherein said forming of said film containing a silicon oxide is a step for forming a silicon oxide film by chemical vapor deposition, at a temperature of 800° C. or lower.

6. A method for manufacturing non-volatile memory according to claim 1, wherein said forming of said bowl-shaped recess in said first semiconductor film is a step of partially removing said first semiconductor layer by dry etching.

7. A method for manufacturing non-volatile memory according to claim 2, wherein said forming of said bowl-shaped recess in said first semiconductor film is a step of partially removing said first semiconductor layer by dry etching.

8. A method for manufacturing non-volatile memory according to claim 3, wherein said forming of said bowl-shaped recess in said first semiconductor film is a step of partially removing said first semiconductor layer by dry etching.

9. A method for manufacturing non-volatile memory according to claim 1, wherein said forming of said bowl-shaped recess in said first semiconductor film comprises the steps of:
partially oxidizing the surface of said first semiconductor film in said opening, so as to form an oxide film, and
removing the oxide film so as to form a bowl-shaped recess in said first semiconductor film.

10. A method for manufacturing non-volatile memory according to claim 2, wherein said forming of said bowl-shaped recess in said first semiconductor film comprises the steps of:
partially oxidizing the surface of said first semiconductor film in said opening, so as to form an oxide film, and
removing the oxide film so as to form a bowl-shaped recess in said first semiconductor film.

11. A method for manufacturing non-volatile memory according to claim 3, wherein said forming of said bowl-shaped recess in said first semiconductor film comprises the steps of:
partially oxidizing the surface of said first semiconductor film in said opening, so as to form an oxide film, and
removing the oxide film so as to form a bowl-shaped recess in said first semiconductor film.

12. A method for manufacturing non-volatile memory according to claim 9, wherein said forming of said bowl-shaped recess in said first semiconductor film further comprises a step for implanting impurities in said first electro-conductive film within said opening before said step for forming an oxide film.

13. A method for manufacturing non-volatile memory according to claim 10, wherein said forming of said bowl-shaped recess in said first semiconductor film further comprises a step for implanting impurities in said first electro-conductive film within said opening before said step for forming an oxide film.

14. A method for manufacturing non-volatile memory according to claim 11, wherein said forming of said bowl-shaped recess in said first semiconductor film further comprises a step for implanting impurities in said first electro-conductive film within said opening before said step for forming an oxide film.

15. A method for manufacturing non-volatile memory according to claim 1, wherein said forming of said spacer film includes a step for forming a silicon nitride film.

16. A method for manufacturing non-volatile memory according to claim 2, wherein said forming of said spacer film includes a step for forming a silicon nitride film.

17. A method for manufacturing non-volatile memory according to claim 3, wherein said forming of said spacer film includes a step for forming a silicon nitride film.

18. A method for manufacturing non-volatile memory according to claim 1, wherein said forming of said spacer film includes the steps of:
forming a silicon film, and
forming a protective film for covering the exposed face of said silicon film on the inside of said opening following said step for forming said opening.

19. A method for manufacturing non-volatile memory according to claim 2, wherein said forming of said spacer film includes the steps of:
forming a silicon film, and
forming a protective film for covering the exposed face of said silicon film on the inside of said opening following said step for forming said opening.

20. A method for manufacturing non-volatile memory according to claim 3, wherein said forming of said spacer film includes the steps of:
forming a silicon film, and
forming a protective film for covering the exposed face of said silicon film on the inside of said opening following said step for forming said opening.

21. A method for manufacturing non-volatile memory according to claim 18, wherein said forming of said spacer film includes a step for forming a silicon nitride film on said silicon film.

22. A method for manufacturing non-volatile memory according to claim 19, wherein said forming of said spacer film includes a step for forming a silicon nitride film on said silicon film.

23. A method for manufacturing non-volatile memory according to claim 20, wherein said forming of said spacer film includes a step for forming a silicon nitride film on said silicon film.

24. A method for manufacturing non-volatile memory according to claim 18, further comprising the steps of:
making the concentration of impurity in said plug higher than the concentration of impurity in said silicon film; and
oxidizing said plug before said step for forming and removing said spacer film.

25. A method for manufacturing non-volatile memory according to claim 19, further comprising the steps of:
making the concentration of impurity in said plug higher than the concentration of impurity in said silicon film; and
oxidizing said plug before said step for forming and removing said spacer film.

26. A method for manufacturing non-volatile memory according to claim 20, further comprising the steps of:
making the concentration of impurity in said plug higher than the concentration of impurity in said silicon film; and
oxidizing said plug before said step for forming and removing said spacer film.

27. A method for manufacturing non-volatile memory according to claim 1, wherein said forming of said side wall insulating film includes a step for forming a silicon oxide film.

28. A method for manufacturing non-volatile memory according to claim 2, wherein said forming of said side wall insulating film includes a step for forming a silicon oxide film.

29. A method for manufacturing non-volatile memory according to claim 3, wherein said forming of said side wall insulating film includes a step for forming a silicon oxide film.

30. A method for manufacturing non-volatile memory according to claim 1, wherein said forming of said side wall insulating film includes a step for forming a silicon nitride film.

31. A method for manufacturing non-volatile memory according to claim 2, wherein said forming of said side wall insulating film includes a step for forming a silicon nitride film.

32. A method for manufacturing non-volatile memory according to claim 3, wherein said forming of said side wall insulating film includes a step for forming a silicon nitride film.

33. A method for manufacturing non-volatile memory according to claim 1, wherein
said forming of said side wall insulating film includes the steps of:
forming a silicon oxide film,
forming a silicon nitride film on said silicon oxide film, and
etching back to selectively remove said silicon oxide film and said silicon nitride film, with a two-layer film formed of said silicon oxide film and silicon nitride film remaining along the inner face of said opening;
said method further comprising a step of removing a part of said silicon oxide film following said step for forming said floating gate, so as to cause a part of said floating gate to protrude from said side wall insulating film.

34. A method for manufacturing non-volatile memory according to claim 2, wherein
said forming of said side wall insulating film includes the steps of:
forming a silicon oxide film,
forming a silicon nitride film on said silicon oxide film, and
etching back to selectively remove said silicon oxide film and said silicon nitride film, with a two-layer film formed of said silicon oxide film and silicon nitride film remaining along the inner face of said opening;
said method further comprising a step of removing a part of said silicon oxide film following said step for forming said floating gate, so as to cause a part of said floating gate to protrude from said side wall insulating film.

35. A method for manufacturing non-volatile memory according to claim 3, wherein
said forming of said side wall insulating film includes the steps of:
forming a silicon oxide film,
forming a silicon nitride film on said silicon oxide film, and
etching back to selectively remove said silicon oxide film and said silicon nitride film, with a two-layer film formed of said silicon oxide film and silicon nitride film remaining along the inner face of said opening;
said method further comprising a step of removing a part of said silicon oxide film following said step for forming said floating gate, so as to cause a part of said floating gate to protrude from said side wall insulating film.

36. A method for manufacturing non-volatile memory according to claim 1, wherein
said forming of said side wall insulating film includes the steps of:
forming a silicon nitride film,
forming a silicon oxide film on said silicon nitride film, and
etching back to selectively remove said silicon nitride film and said silicon oxide film, with a two-layer film formed of said silicon oxide film and silicon nitride film remaining along the inner face of said opening;
said method further comprising a step of removing a part of said silicon nitride film following said step for forming said floating gate, so as to cause a part of said floating gate to protrude from said side wall insulating film.

37. A method for manufacturing non-volatile memory according to claim 2, wherein
said forming of said side wall insulating film includes the steps of:
forming a silicon nitride film,
forming a silicon oxide film on said silicon nitride film, and
etching back to selectively remove said silicon nitride film and said silicon oxide film, with a two-layer film formed of said silicon oxide film and silicon nitride film remaining along the inner face of said opening;
said method further comprising a step of removing a part of said silicon nitride film following said step for forming said floating gate, so as to cause a part of said floating gate to protrude from said side wall insulating film.

38. A method for manufacturing non-volatile memory according to claim 3, wherein
said forming of said side wall insulating film includes the steps of:
forming a silicon nitride film,
forming a silicon oxide film on said silicon nitride film, and
etching back to selectively remove said silicon nitride film and said silicon oxide film, with a two-layer film formed of said silicon oxide film and silicon nitride film remaining along the inner face of said opening;
said method further comprising a step of removing a part of said silicon nitride film following said step for forming said floating gate, so as to cause a part of said floating gate to protrude from said side wall insulating film.

39. A method for manufacturing non-volatile memory, comprising the steps of:
forming a first insulating layer on a first electroconductive semiconductor substrate;
forming a first electroconductive film on said first insulating film;
forming a spacer film on said first electroconductive film;
selectively removing said spacer film by etching, so as to form an opening;
implanting impurities in said first electroconductive film within said opening;
partially oxidizing the surface of said first electroconductive film within said opening so as to form an oxide film;
removing the oxidized film and forming a bowl-shaped recess in said first electroconductive film;
forming a side wall insulating film on the side face of said opening;
removing said first electroconductive film and said first insulating film within said opening;
implanting impurities of a second electroconductivity type on the surface of said semiconductor substrate within said opening, thereby forming one of a source and drain;

forming a second insulating film so as to cover the exposed face of said first electroconductive film within said opening;

forming a plug by filling the inside of said opening with an electroconductive film;

removing said spacer film;

forming a floating gate of said first electroconductive film at the region directly below said side wall insulating film, by selectively etching away said first electroconductive film with said side wall insulating film as a mask;

forming a third insulating film so as to cover the exposed face of said floating gate;

forming a control gate on the side of said plug by forming an electroconductive film on said side wall insulating film; and forming the other of the source and drain by selectively implanting impurities of a second electroconductivity type on the surface of said semiconductor substrate, with said plug, said side wall insulating film, said floating gate, and said control gate, as masks.

40. A method for manufacturing non-volatile memory, comprising the steps of:

forming a first insulating film on a first electroconductive semiconductor substrate;

forming a first electroconductive film on said first insulating film;

forming a spacer film on said first electroconductive film;

selectively removing said spacer film by etching, so as to form an opening;

forming a side wall insulating film on the side face of said opening;

removing said first electroconductive film and said first insulating film within said opening;

implanting impurities of a second electroconductivity type on the surface of said semiconductor substrate within said opening, thereby forming one of a source and drain;

forming a second insulating film so as to cover the exposed face of said first electroconductive film within said opening;

forming a plug by filling the inside of said opening with an electroconductive film;

removing said spacer film;

forming a floating gate of said first electroconductive film at the region directly below said side wall insulating film, by selectively etching away said first electroconductive film with said side wall insulating film as a mask;

partially removing said side wall insulating film, and causing the end of said floating gate to protrude from said side wall insulating film by a length of 100 nm or less;

forming a third insulating film so as to cover the exposed face of said floating gate;

forming a control gate on the side of said plug by forming an electroconductive film on said side wall insulating film; and forming the other of the source and drain by selectively implanting impurities of a second electroconductivity type on the surface of said semiconductor substrate, with said plug, said side wall insulating film, and said floating gate, as masks.

41. A method for manufacturing non-volatile memory according to claim 40, wherein the length of protrusion by which protruding portion protrudes from said side wall insulating film of said floating gate is equal to or less than the thickness of said third insulting film.

42. A method for manufacturing non-volatile memory according to claim 1, wherein said forming of said third insulating film includes a step of forming a thermally-oxidized film on the exposed surface of said floating gate.

43. A method for manufacturing non-volatile memory according to claim 2, wherein said forming of said third insulating film includes a step of forming a thermally-oxidized film on the exposed surface of said floating gate.

44. A method for manufacturing non-volatile memory according to claim 3, wherein said forming of said third insulating film includes a step of forming a thermally-oxidized film on the exposed surface of said floating gate.

45. A method for manufacturing non-volatile memory according to claim 1, wherein said first electroconductive film is formed of amorphous silicon.

46. A method for manufacturing non-volatile memory according to claim 2, wherein said first electroconductive film is formed of amorphous silicon.

47. A method for manufacturing non-volatile memory according to claim 3, wherein said first electroconductive film is formed of amorphous silicon.

48. Non-volatile memory comprising:

a first electroconductivity type semiconductor substrate with a mutually-distanced source and drain formed on the surface;

a plug provided in a region directly above one of said source and drain on said semiconductor substrate;

a second insulating film provided to the side face of said plug;

a first insulating film provided in a region adjacent to one of said source and drain on the surface of said semiconductor substrate;

a floating gate formed of a first electroconductive film provided on said first insulating film;

a side wall insulating film provided on said second insulating film so as to cover part of said floating gate and allow the remainder thereof to protrude;

a third insulating film for covering the protruding portion from said side wall insulating film of said floating gate; and a control gate formed of an electroconductive film and provided on said side wall insulating film;

wherein said plug, said side wall insulating film, and said control gate, are provided in a region other than directly above the other of the source and drain;

and wherein the length of protrusion by which protruding portion protrudes from said side wall insulating film of said floating gate is 100 nm or less.

49. Non-volatile memory according to claim 48, wherein the length of protrusion by which protruding portion protrudes is equal to or more than the thickness of said third insulating film.

* * * * *